(12) United States Patent
Brogan et al.

(10) Patent No.: US 11,569,818 B2
(45) Date of Patent: Jan. 31, 2023

(54) LOAD CONTROL DEVICE HAVING A CAPACITIVE TOUCH SURFACE

(71) Applicant: Lutron Technology Company LLC, Coopersburg, PA (US)

(72) Inventors: Quinn Brogan, Hellertown, PA (US); Graham L. Christensen, Blue Bell, PA (US); Chris Dimberg, Easton, PA (US); Jonathan H. Ference, Fleetwood, PA (US); Matthew V. Harte, Stewartsville, NJ (US); Matthew Philip McDonald, Phoenixville, PA (US); Dinesh Sundara Moorthy, Allentown, PA (US); Matthew W. Nuhfer, Bethlehem, PA (US); Michael W. Pessina, Allentown, PA (US); James P. Steiner, Royersford, PA (US); Daniel L. Twaddell, Bethlehem, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 341 days.

(21) Appl. No.: 16/888,510

(22) Filed: May 29, 2020

(65) Prior Publication Data

US 2020/0382120 A1 Dec. 3, 2020

Related U.S. Application Data

(60) Provisional application No. 62/968,421, filed on Jan. 31, 2020, provisional application No. 62/929,742, (Continued)

(51) Int. Cl.
*H03K 17/96* (2006.01)
*G06F 3/044* (2006.01)
(Continued)

(52) U.S. Cl.
CPC .......... *H03K 17/962* (2013.01); *G06F 3/044* (2013.01); *H03K 17/951* (2013.01); *H05B 39/085* (2013.01)

(58) Field of Classification Search
CPC .... H03K 17/962; H03K 17/951; G06F 3/044; H05B 39/085
See application file for complete search history.

(56) References Cited

U.S. PATENT DOCUMENTS

| 6,169,377 B1 | 1/2001 | Bryde et al. |
| 6,380,696 B1 | 4/2002 | Sembhi et al. |
(Continued)

FOREIGN PATENT DOCUMENTS

WO 2017210532 A1 12/2017

OTHER PUBLICATIONS

Silicon Laboratories , "Rev. 0.3 Jun. 2014 Copyright 2014 by Silicon Laboratories AN447 AN447 Printed Circuit Design Notes for Capacitive Sensing With the CS0 Module", URL:https://www.silabs.com/documents/public/application-notes/AN447.pdf, Jan. 1, 2014.

*Primary Examiner* — Kyung S Lee
(74) *Attorney, Agent, or Firm* — Flaster Greenberg, P.C.

(57) ABSTRACT

A control device configured for use in a load control system to control an electrical load external to the control device may comprise an actuation member having a front surface defining a capacitive touch surface configured to detect a touch actuation along at least a portion of the front surface. The control device includes a main printed circuit board (PCB) comprising a control circuit, a tactile switch, a controllably conductive device, and a drive circuit operatively coupled to a control input of the controllably conductive device for rendering the controllably conductive device conductive or non-conductive to control the amount of power delivered to the electrical load. The control device (Continued)

also includes a capacitive touch PCB that comprises a touch sensitive circuit comprising one or more receiving capacitive touch pads located on the capacitive touch PCB and arranged in a linear array adjacent to the capacitive touch surface.

23 Claims, 20 Drawing Sheets

Related U.S. Application Data filed on Nov. 1, 2019, provisional application No. 62/910,932, filed on Oct. 4, 2019, provisional application No. 62/885,062, filed on Aug. 9, 2019, provisional application No. 62/855,463, filed on May 31, 2019.

(51) Int. Cl.
*H03K 17/95* (2006.01)
*H05B 39/08* (2006.01)

(56) References Cited

U.S. PATENT DOCUMENTS

| | | |
|---|---|---|
| 7,190,125 B2 | 3/2007 | McDonough et al. |
| 7,242,150 B2 | 7/2007 | DeJonge et al. |
| 7,546,473 B2 | 6/2009 | Newman |
| 7,566,995 B2 | 7/2009 | Altonen et al. |
| 7,573,208 B2 | 8/2009 | Newman, Jr. |
| 7,608,948 B2 | 10/2009 | Nearhoof et al. |
| 7,791,595 B2 | 9/2010 | Altonen et al. |
| 7,834,856 B2 | 11/2010 | Grinshpoon et al. |
| 7,855,543 B2 | 12/2010 | Newman et al. |
| 8,330,638 B2 | 12/2012 | Altonen et al. |
| 8,664,881 B2 | 3/2014 | Newman, Jr. et al. |
| 8,803,432 B2 | 8/2014 | Hausman |
| 9,524,633 B2 | 12/2016 | McDonald et al. |
| 10,109,181 B2 | 10/2018 | Dimberg et al. |
| 11,237,665 B2 * | 2/2022 | Steiner .................. G08C 17/00 |
| 2017/0280533 A1 | 9/2017 | Dimberg et al. |
| 2019/0157027 A1 * | 5/2019 | Dimberg .................. H01H 3/02 |

* cited by examiner

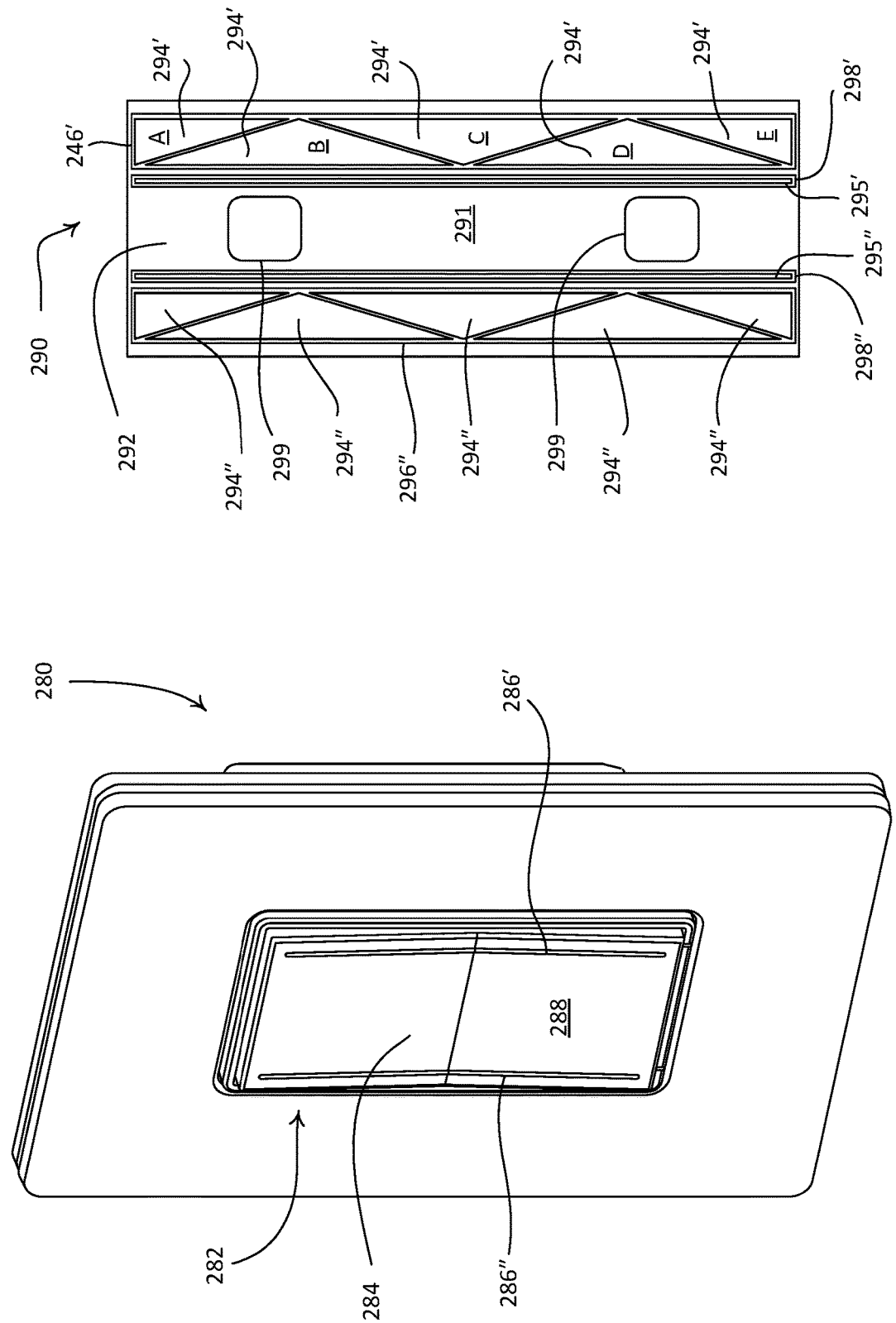

LOAD CONTROL DEVICE HAVING A CAPACITIVE TOUCH SURFACE

CROSS-REFERENCE TO RELATED APPLICATIONS

This application claims the benefit of Provisional U.S. Patent Application No. 62/855,463, filed May 31, 2019, Provisional U.S. Patent Application No. 62/885,062, filed Aug. 9, 2019, Provisional U.S. Patent Application No. 62/910,932, filed Oct. 4, 2019, Provisional U.S. Patent Application No. 62/929,742, filed Nov. 1, 2019, and Provisional U.S. Patent Application No. 62/968,421, filed Jan. 31, 2020, the disclosures of which are incorporated herein by reference in their entirety.

BACKGROUND

A load control system may include one or more electrical loads that a user may wish to control via a single load control device. These electrical loads may include, for example, lighting loads, HVAC units, motorized window treatment or projection screens, humidity control units, audio systems or amplifiers, Internet of Things (IoT) devices, and/or the like. The electrical loads may have advanced features. For example, a lighting load may be controlled to emit light of varying intensities and/or colors in response to a user command. The amount of power delivered to the electrical loads may be adjusted to an absolute level or by a relative amount. Multiple electrical loads may be manipulated such that one or more presets or scenes (e.g., combinations of particular lighting conditions, temperature settings, speaker volume, and/or the like) may be created, and a user may desire the ability to browse through the presets or scenes, and activate one that fits a particular occasion. With a traditional load control device such as a mechanical toggle switch, a user will not able to perform any of the aforementioned functions, let alone performing multiple of them through one device.

The insufficiencies of traditional load control devices arise at least in part from the actuation mechanism utilized in those devices. More specifically, traditional load control devices are typically only capable of responding to simple user actions such as moving a lever or pushing a button. As such, the number and/or types of control that may be applied through a load control device is limited. To meet the demand of advanced electrical loads, there is a need to employ alternative user interface technologies such as those capable of detecting human gestures and translating the gestures into control data (e.g., control signals) for controlling the electrical loads. These technologies may expand the capacity of a load control device, while at the same time enhancing its usability and aesthetic appeal, for example.

A traditional load control device may also lack the capacity to provide visual feedback to a user about the operation of the load control device and/or the electrical loads controlled by the load control devices. Such capacity is an important aspect of user experience in an advanced load control system where a user may be able to manipulate multiple operating parameters of an electrical load or to control multiple electrical loads via a single control device. Provision of feedback in those environments can keep the user informed about the state and/or mode of the control device and electrical loads, and may help the user navigate through the various functionalities of the control device.

SUMMARY

As described herein, a control device configured for use in a load control system to control one or more electrical loads external to the control device may comprise an actuation member having a front surface defining a touch sensitive surface (e.g., capacitive touch surface) configured to detect a touch actuation (e.g., a point actuation) along at least a portion of the front surface. The control device may include a main printed circuit board (PCB) comprising a control circuit, a tactile switch(es), a controllably conductive device, and a drive circuit operatively coupled to a control input of the controllably conductive device for rendering the controllably conductive device conductive or non-conductive to control the amount of power delivered to the electrical load. The control device may also include a capacitive touch PCB affixed to the actuation member. The capacitive touch PCB may comprise a touch sensitive circuit comprising one or more receiving capacitive touch pads located on the capacitive touch PCB, behind the actuation member, and arranged in a linear array adjacent to the capacitive touch surface. The capacitive touch PCB may include a ground plane on a back side of the capacitive touch PCB. The actuation member may be configured to pivot about a pivot axis to actuate the tactile switch on the main PCB in response to actuations of the actuation member, such that the capacitive touch surface and the capacitive touch PCB are configured to move with the actuation member in response to actuations of the actuation member. The actuation member may additionally be configured to substantially maintain its position (e.g., not pivot about the pivot axis) in response to a user input applied over the pivot axis so that the tactile switch is not actuated by the user input. In response to such a user input, the control device may enter a programming mode to allow a user to configure or adjust the operating characteristics of the control device. The control device may also be configured to perform a specific operation (e.g., switch from an intensity control mode to a color control mode) in response to the user input.

A control device may include an actuation member, a main printed circuit board, and/or a capacitive touch printed circuit board affixed to the actuation member. The actuation member has a front surface that may define a touch sensitive surface (e.g. capacitive touch surface) that is configured to detect a touch actuation along at least a portion of the touch sensitive surface (e.g., a portion above a light bar of the control device). The main printed circuit board may include a first control circuit, a tactile switch, a controllably conductive device, and/or a drive circuit. The drive circuit is operatively coupled to a control input of the controllably conductive device for rendering the controllably conductive device conductive or non-conductive to control the amount of power delivered to the electrical load. The actuation member may be configured to pivot about a pivot axis to actuate the tactile switch on the main printed circuit board in response to tactile actuations of the actuation member.

The capacitive touch printed circuit board may include one or more receiving touch sensitive pads, such as capacitive touch pads, located on the capacitive touch printed circuit board. The touch sensitive pads may be located behind the actuation member and/or may be arranged in a linear array adjacent to the touch sensitive surface. The capacitive touch printed circuit board may also include a second control circuit configured to receive inputs from the capacitive touch pads and provide an output signal to the first control circuit in response to the inputs received from the capacitive touch pads. The capacitive touch printed circuit board may be configured to move with the actuation member in response to tactile actuations of the actuation member. The first control circuit may be configured to control an amount of power delivered to the electrical load in response to a position of a touch actuation along the length of the touch sensitive surface indicated by the output signal from the second control circuit.

The capacitive touch printed circuit board further comprising a proximity pad, which for example, may extend parallel to the linear array of receiving capacitive touch pads and/or be located farther away from the touch sensitive surface than the linear array of receiving capacitive touch pads. The second control circuit is configured to ignore the inputs received from receiving capacitive touch pads in response to receiving an input from the proximity pad.

The second control circuit may be configured to compare a measured voltage provided via a capacitive touch pad to a voltage threshold and generate an output signal that indicates when the measured voltage exceeds the voltage threshold. The second control circuit may be configured to use different voltage thresholds for different capacitive touch pads. For example, the receiving capacitive touch pads may be separated from the capacitive touch surface by varying distances, and the different voltage thresholds may be used based on the distance between the capacitive touch pad and the capacitive touch surface.

The first control circuit may be configured to not respond to (e.g., ignore) output signals received via the capacitive touch surface during times when the controllably conductive device is rendered conductive and/or during time when transmitting or receiving wired or wireless communications via a communication circuit of the control device.

The first control circuit may be configured operate in one of a plurality of touch actuation modes. For example, when the lighting load is off, the first control circuit may be configured to operate in a first touch actuation mode and configured to turn the electrical load on in response to a touch actuation of the touch sensitive surface. Further, and for example, when the lighting load is off, the first control circuit may be configured to operate in a second touch actuation mode and the first configure circuit is not configured to turn the electrical load on in response to a touch actuation of the touch sensitive surface.

The first control circuit configured to detect a touch actuation applied to the area of the front surface of the actuation member that is characterized by limiting pivoting for a predetermined period of time, and enter an advanced programming mode in response to the detection of the user input applied the area of the front surface characterized by limiting pivoting.

In some examples, the first control circuit configured to ignore output signals received from the second control circuit when the electrical load is off. For example, when the electrical load is off, the first control circuit may be configured to ignore inputs from the touch sensitive device in response to touch actuations that are above a position along the touch sensitive actuator that corresponds to the predetermined level, and may be configured to respond to inputs from the touch sensitive device in response to touch actuations that are below the position along the touch sensitive actuator that corresponds to the predetermined level.

The first control circuit may be configured to prioritize inputs received in response to tactile actuation of the actuation member over the output signals received from the second control circuit by ignoring the output signals when a tactile actuation of the tactile switch is received within a blanking period after an initial detection of the touch actuation along the touch sensitive surface.

The first control circuit may be configured to determine that the position of the touch actuation on the touch sensitive surface is maintained for an amount of time that is shorter than the blanking period without detecting a tactile actuation of the actuation member, and the control device may be configured to turn on the electrical load to a power level associated with the position of the touch actuation along the length of the touch sensitive surface.

The first control circuit may be configured to start a blanking period in response to a tactile actuation of the actuation member to turn on or off the electrical load, and ignore output signals received from the second control circuit during the blanking period.

A control device may include an actuation member, a touch sensitive device, and a control circuit. The actuation member may have a front surface defining a touch sensitive surface along at least a portion of the front surface. The actuation member may be configured to move in response to a tactile actuation of the actuation member. The touch sensitive device may be configured to detect a touch actuation along the touch sensitive surface. The control circuit may be configured to determine a position of the touch actuation along the length of the touch sensitive surface in response to the touch actuation along the touch sensitive surface. The control circuit may be configured to determine a position of the touch actuation along the length of the touch sensitive surface in response to the touch actuation along the touch sensitive surface, turn the electrical load on or off in response to an actuation of the tactile switch, and control an amount of power delivered to the electrical load based on inputs received from the touch sensitive device In some examples, the control circuit may be configured to prioritize inputs received in response to tactile actuations of the actuation member over the inputs received from the touch sensitive device in response to touch actuations of the touch sensitive surface. For example, the control circuit may be configured to prioritize inputs received in response to tactile actuation of the actuation member over the inputs received from the touch sensitive device in response to touch actuations of the touch sensitive surface by ignoring inputs received from the touch sensitive device when a tactile actuation is received within a blanking period after an initial detection of the touch actuation along the touch sensitive surface.

In some examples, the control circuit may be configured to start a blanking period in response to a tactile actuation of the actuation member to turn on or off the electrical load, and ignore inputs received from the touch sensitive device in response to touch actuations of the touch sensitive surface during the blanking period.

In some examples, the control circuit may be configured to ignore inputs from the touch sensitive device in response to touch actuations along at least a portion of the touch sensitive surface when the electrical load is off.

In some examples, when the electrical load is off, the control circuit may be configured to ignore inputs from the touch sensitive device in response to touch actuations of the touch sensitive surface that last for less than a predetermined period of time. Further, the control circuit may be configured to determine that a position of a touch actuation along the touch sensitive surface is maintained for the predetermined period of time while the electrical load is off, and may be configured to turn the electrical load on to a power level associated with the position in response to the actuation of the tactile switch.

In some examples, the actuation member may include an upper portion and a lower portion, and may be configured to pivot around a pivot axis in response to a tactile actuation of the upper portion or the lower portion. In such examples, the actuation member may be configured to substantially maintain its position with respect to the base portion in response to a user input applied via an area of the front surface proximate to the pivot axis that is characterized by limited pivoting. The control circuit may be configured to detect a touch actuation applied to the area of the front surface characterized by limiting pivoting for a predetermined period of time, and may be configured to change an operating mode of the control device or control the electrical load in response to the detection of the user input applied the area of the front surface characterized by limiting pivoting. Alternatively or additionally, the control circuit may be configured to change an operating mode of the control device in response to detecting the touch actuation applied over the pivot axis, where the operating mode allows a user of the control device to adjust an operating characteristic of the control device.

In some examples, the actuation member may be supported by a base portion and may be configured to actuate a first tactile switch in response to a tactile actuation of an upper portion and actuate a second tactile switch in response to a tactile actuation of a lower portion. The touch sensitive surface (e.g., and control circuit) may be configured to detect a user input applied to an area of the touch sensitive area located approximately half-way between the first and second tactile switches. The control circuit may be configured to change an operating mode in response to detecting the user input in the area of the touch sensitive surface, where the operating mode allows a user of the control device to adjust an operating characteristic of the control device.

In some examples, the touch sensitive device may include a plurality of touch elements (e.g., such as capacitive touch elements). The distance between the front surface of the actuation member and the plurality of touch elements may not be not uniform. For example, the distance may be shorter in the middle of the actuation member and longer towards the top and/or bottom of the actuation member. Or, the distance may be shortest at the top and longest at the bottom, or vice versa. The touch sensitive device may be configured to use different sensitivities, such as different thresholds (e.g., voltage thresholds) when detecting touch actuations along the different touch elements (e.g., to detect the position of a touch actuation along the touch surface).

In some examples, the control circuit may be configured to not respond to the output signal during times when the controllably conductive device is rendered conductive and/or during times when transmitting or receiving wired or wireless communications via a communication circuit of the control device.

In some examples, the control circuit may be configured to prioritize inputs received in response to tactile actuation of the actuation member over the inputs received from the touch sensitive device in response to touch actuations of the touch sensitive surface by ignoring inputs received from the touch sensitive device when a tactile actuation is received within a blanking period after an initial detection of the touch actuation along the touch sensitive surface.

BRIEF DESCRIPTION OF THE DRAWINGS

FIG. 8 is a perspective view of another example control device (e.g., a dual dimmer switch).

FIG. 9 is a front view of a front side of a capacitive touch printed circuit board of the control device of FIG. 8.

DETAILED DESCRIPTION

Figure 1:
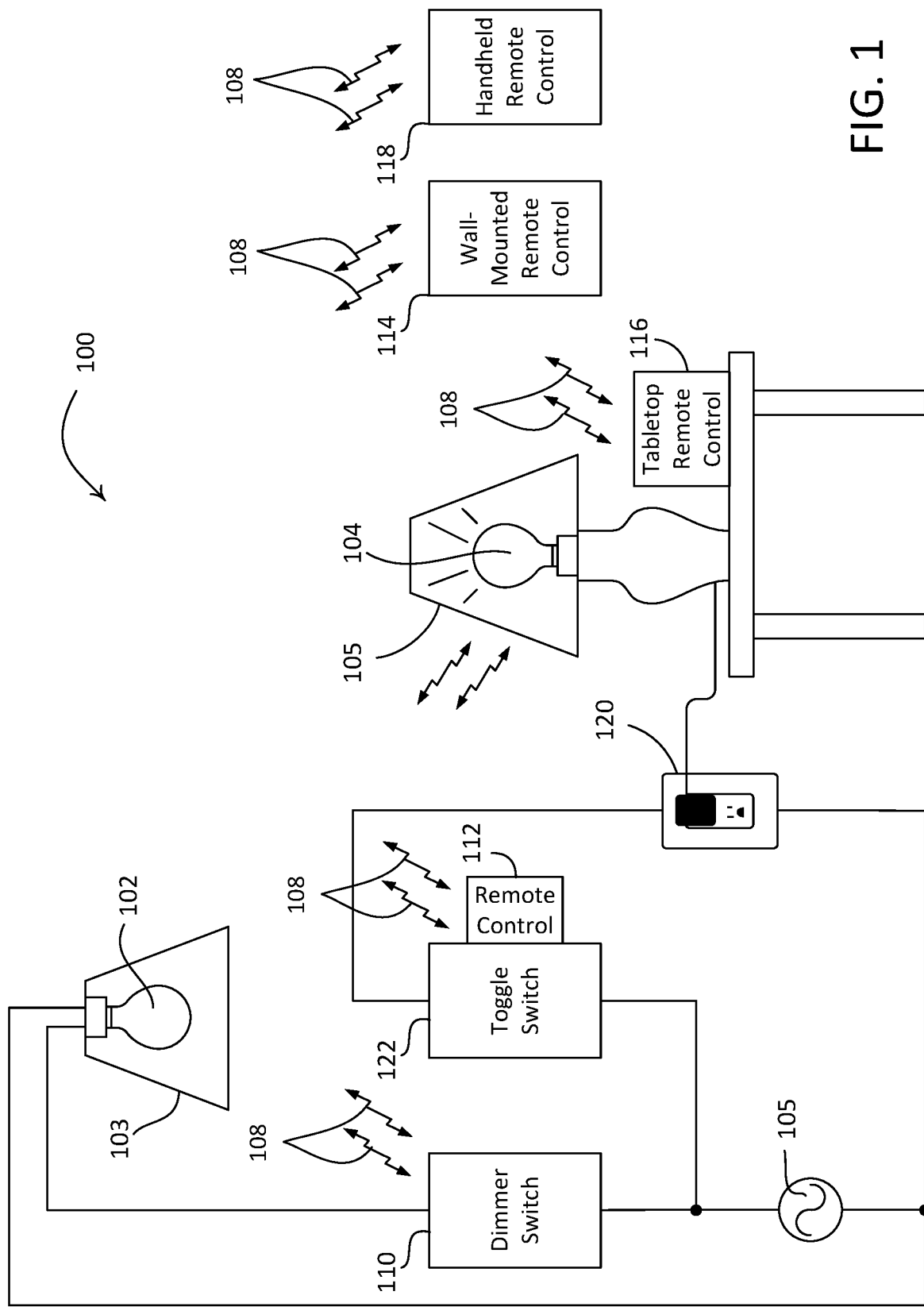
FIG. 1 depicts an example load control system that includes one or more example control devices.

FIG. 1 is a simplified block diagram of an example load control system. As shown, the load control system is configured as a lighting control system 100 for control of one or more lighting loads, such as a lighting load 102 that is installed in a ceiling-mounted downlight fixture 103 and a controllable lighting load 104 that is installed in a table lamp 105. The lighting loads 102, 104 shown in FIG. 1 may include light sources of different types (e.g., incandescent lamps, fluorescent lamps, and/or LED light sources). The lighting loads may have advanced features. For example, the lighting loads may be controlled to emit light of varying intensities and/or colors in response to a user command. The amount of power delivered to the lighting loads may be adjusted to an absolute level or by a relative amount. The lighting control system 100 may be configured to control one or more of the lighting loads (e.g., and/or other electrical loads) according to one or more configurable presets or scenes. These presets or scenes may correspond to, for example, predefined light intensities and/or colors, predefined entertainment settings such as music selection and/or volume settings, predefined window treatment settings such as positions of shades, predefined environmental settings such as HVAC settings, or any combination thereof. The presets or scenes may correspond to one or more specific electrical loads (e.g., bedside lamps, ceiling lights, etc.) and/or one or more specific locations (e.g., a room, an entire house, etc.).

The lighting load 102 may be an example of a lighting load that is wired into a power control and/or delivery path of the lighting control system 100. As such, the lighting load 102 may be controllable by a wall-mounted control device such as a dimmer switch. The lighting load 104 may be an example of a lighting load that is equipped with integral load control circuitry and/or wireless communication capabilities such that the lighting load may be controlled via a wireless control mechanism (e.g., by a remote control device).

The lighting control system 100 may include one or more control devices for controlling the lighting loads 102, 104 (e.g., controlling an amount of power delivered to the lighting loads). The lighting loads 102, 104 may be controlled substantially in unison, or be controlled individually. For example, the lighting loads may be zoned so that the lighting load 102 may be controlled by a first control device, while the lighting load 104 may be controlled by a second control device. The control devices may be configured to turn the lighting loads 102, 104 on and off. The control devices may be configured to control the magnitude of a load current conducted through the lighting loads (e.g., so as to control an intensity level of the lighting loads 102, 104 between a low-end intensity level $L_{LE}$ and a high-end intensity level $L_{HE}$). The control devices may be configured to control an amount of power delivered to the lighting loads to an absolute level (e.g., to a maximum allowable amount), or by a relative amount (e.g., an increase of 10% from a current level). The control devices may be configured to control a color of the lighting load 102, 104 (e.g., by controlling a color temperature of the lighting loads or by applying full color control over the lighting loads).

The control devices may be configured to activate a preset associated with the lighting load 102, 104. A preset may be associated with one or more predetermined settings of the lighting loads, such as an intensity level of the lighting loads and/or a color of the lighting loads. The presets may be configured via the control device and/or via an external device (e.g., a mobile device) by way of a wireless communication circuit of the control device. The control devices may be configured to activate control of a zone. A zone may correspond to one or more electrical loads that are configured to be controlled by the control devices. A zone may be associated with a specific location (e.g., a living room) or multiple locations (e.g., an entire house with multiple rooms and hallways). The control devices may be configured to switch between different operational modes. An operational mode may be associated with controlling different types of electrical loads or different operational aspects of one or more electrical loads. Examples of operational modes may include a lighting control mode for controlling one or more lighting loads (e.g., which in turn may include a color control mode and an intensity control mode), an entertainment system control mode (e.g., for controlling music selection and/or the volume of an audio system), an HVAC system control mode, a winter treatment device control mode (e.g., for controlling one or more shades), and/or the like.

One or more characteristics of the control device and/or the lighting load 102, 104 described herein may be customized via an advanced programming mode (APM). Such characteristics may include, for example, an intensity level associated with a preset, a fade-on/fade-off time, enablement/disablement of visual indicators, a low-end trim (e.g., a minimum intensity level to which the lighting load 102, 104 may be set by the control device), a high-end trim (e.g., a maximum intensity level to which the lighting load 102, 104 may be set by the control device), and/or the like.

Examples of an advanced programming mode for a wall-mounted load control device can be found in U.S. Pat. No. 7,190,125, issued Mar. 13, 2007, entitled PROGRAMMABLE WALLBOX DIMMER, the entire disclosure of which is hereby incorporated by reference. The control device may be manipulated to enter the advanced programming mode in various ways. For instance, the control device may be moved into the advanced programming mode via a press-and-hold or a double-tap applied to a front area of the control device. Ways to activate the advanced programming mode for a control device will be described in greater detail below.

The control device described herein may be, for example, a dimmer switch 110, a retrofit remote control device 112, a wall-mounted remote control device 114, a tabletop remote control device 116, and/or a handheld remote control device 118, as shown in FIG. 1. The dimmer switch 110 may be configured to be mounted to a standard electrical wallbox (e.g., via a yoke) and be coupled in series electrical connection between an alternating-current (AC) power source 105 and a lighting load that is wired into the control path of the dimmer switch 110 (e.g., such as the lighting load 102). The dimmer switch 110 may receive an AC mains line voltage $V_{AC}$ from the AC power source 105, and may generate a control signal for controlling the lighting load 102. The control signal may be generated via various phase-control techniques (e.g., a forward phase-control dimming technique or a reverse phase-control dimming technique). The dimmer switch 110 may be configured to receive wireless signals (e.g., from a remote control device) representative of commands to control the lighting load 102, and generate respective control signals for executing the commands. Examples of wall-mounted dimmer switches are described in greater detail in commonly-assigned U.S. Pat. No. 7,242,150, issued Jul. 10, 2007, entitled DIMMER HAVING A POWER SUPPLY MONITORING CIRCUIT; U.S. Pat. No. 7,546,473, issued Jun. 9, 2009, entitled DIMMER HAVING A MICROPROCESSOR CONTROLLED POWER SUPPLY; and U.S. Pat. No. 8,664,881, issued Mar. 4, 2014, entitled TWO-WIRE DIMMER SWITCH FOR LOW-POWER LOADS, the entire disclosures of which are hereby incorporated by reference.

The retrofit remote control device 112 may be configured to be mounted to a mechanical switch (e.g., a toggle switch 122) that may be pre-existing in the lighting control system 100. Such a retrofit solution may provide energy savings and/or advanced control features, for example without requiring significant electrical re-wiring and/or without requiring the replacement of existing mechanical switches. As an example, a consumer may replace an existing lamp with the controllable lighting load 104, switch a toggle switch 122 that is coupled to the lighting load 104 to the on position, install (e.g., mount) the remote control device 112 onto the toggle switch 122, and associate the remote control device 112 with the lighting source 104. The retrofit remoted control 112 may then be used to perform advanced functions that the toggle switch 122 may be incapable of performing (e.g., such as dimming the intensity level of the light output, changing the color of the light output, providing feedback to a user, etc.). As shown, the toggle switch 122 is coupled (e.g., via a series electrical connection) between the AC power source 105 and an electrical receptacle 120 into which the lighting load 104 may be plugged (e.g., as shown in FIG. 1). Alternative, the toggle switch 122 may be coupled between the AC power source 105 and one or more of the lighting loads 102, 104, without the electrical receptacle 120.

The wall-mounted remote control device 114 may be configured to be mounted to a standard electrical wallbox and be electrically connected to the AC power source 105 for receiving power. The wall-mounted remote control device 114 may be configured to receive a user input and may generate and transmit a control signal (e.g., control data such as a digital message) for controlling the lighting loads 102, 104 in response to the user input. The tabletop remote control device 116 may be configured to be placed on a surface (e.g., an end table or night stand), and may be powered by a direct-current (DC) power source (e.g., a battery or an external DC power supply plugged into an electrical outlet). The tabletop remote control device 116 may be configured to receive a user input, and may generate and transmit a signal (e.g., a digital message) for controlling the lighting loads 102, 104 in response to the user input. The handheld remote control device 118 may be sized to fit into a user's hand, and may be powered by a direct-current (DC) power source (e.g., a battery or an external DC power supply plugged into an electrical outlet). The handheld remote control device 118 may be configured to receive a user input, and may generate and transmit a signal (e.g., a digital message) for controlling the lighting loads 102, 104 in response to the user input. Examples of battery-powered remote controls are described in greater detail in commonly assigned U.S. Pat. No. 8,330,638, issued Dec. 11, 2012, entitled "Wireless Battery Powered Remote Control Having Multiple Mounting Means," and U.S. Pat. No. 7,573,208, issued Aug. 11, 2009, entitled "Method Of Programming A Lighting Preset From A Radio-Frequency Remote Control," the entire disclosures of which are hereby incorporated by reference.

It should be appreciated that, although a lighting control system with two lighting loads is provided as an example above, a load control system as described herein may include more or fewer lighting loads, other types of lighting loads, and/or other types of electrical loads that may be configured to be controlled by the one or more control devices. For example, the load control system may include one or more of: a dimming ballast for driving a gas-discharge lamp; an LED driver for driving an LED light source; a dimming circuit for controlling the intensity level of a lighting load; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; one or more motorized interior and/or exterior shutters; a thermostat for a heating and/or cooling system; a temperature control device for controlling a set-point temperature of a heating, ventilation, and air-conditioning (HVAC) system; an air conditioner; a compressor; an electric baseboard heater controller; a controllable damper; a variable air volume controller; a fresh air intake controller; a ventilation controller; one or more hydraulic valves for use in radiators and radiant heating system; a humidity control unit; a humidifier; a dehumidifier; a water heater; a boiler controller; a pool pump; a refrigerator; a freezer; a television and/or computer monitor; a video camera; an audio system or amplifier; an elevator; a power supply; a generator; an electric charger, such as an electric vehicle charger; an alternative energy controller; and/or the like.

Figure 2:
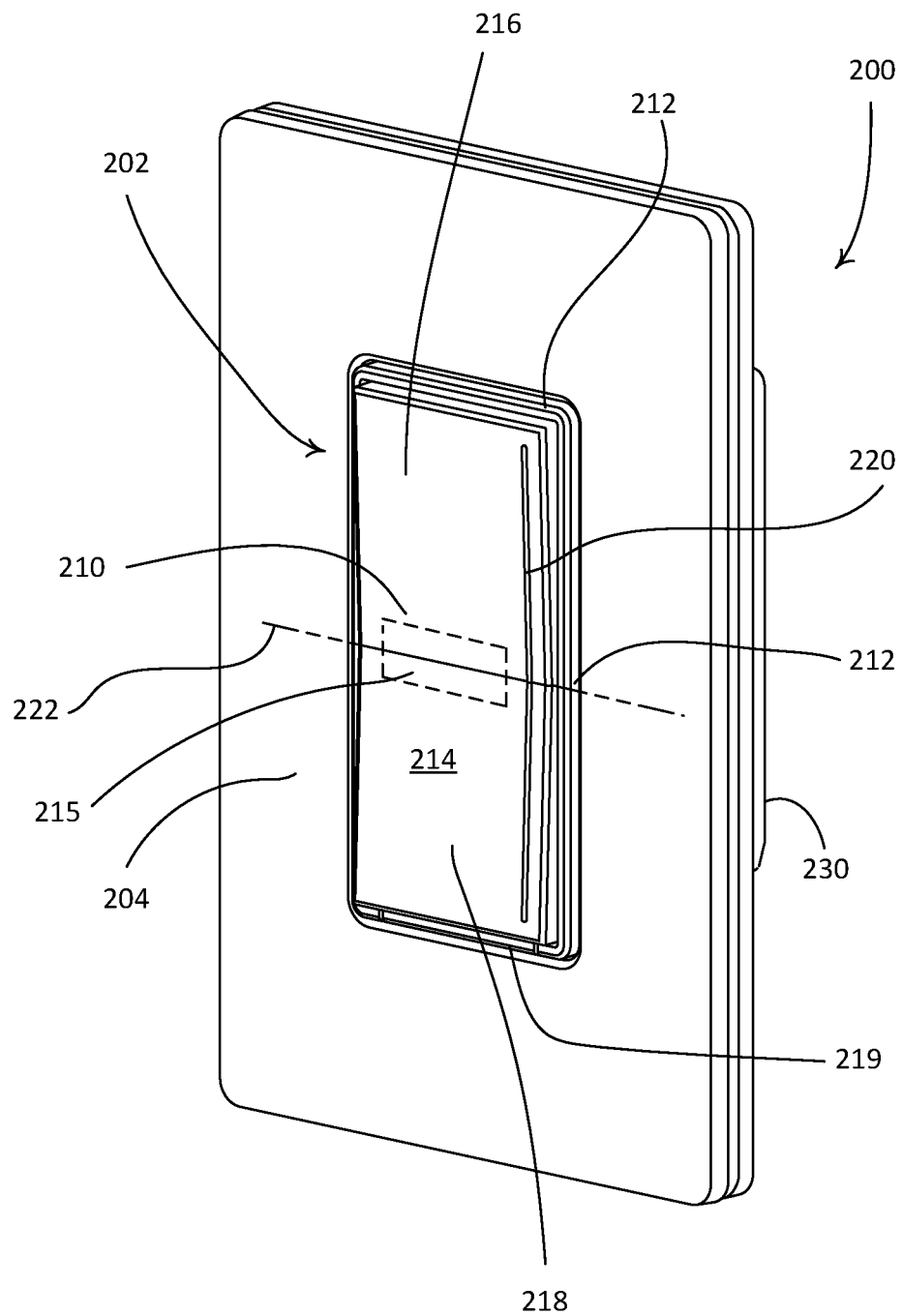
FIG. 2 is a perspective view of an example control device that may be deployed as a dimmer switch and/or a remote control device of the load control system illustrated in FIG. 1.
Figure 3:
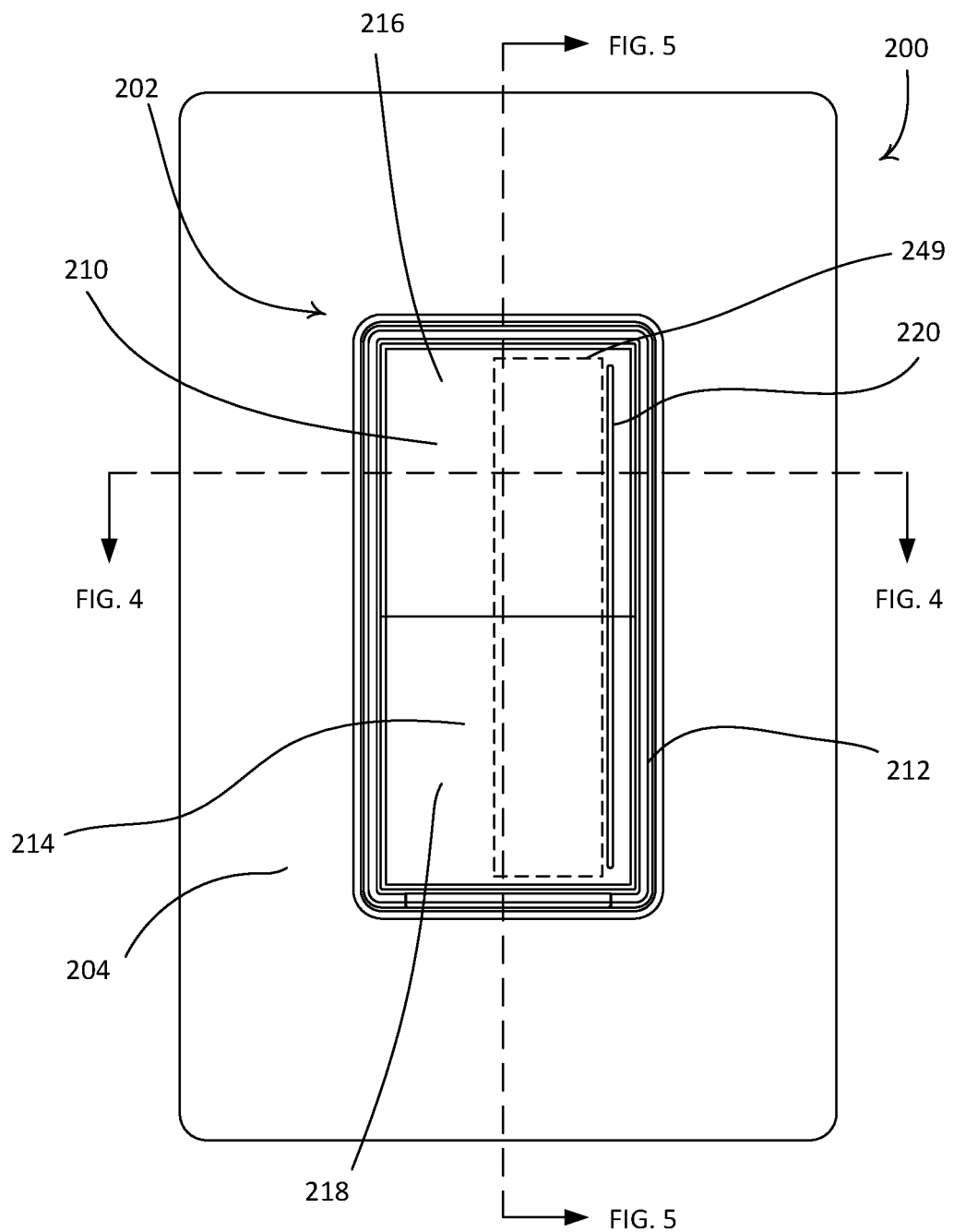
FIG. 3 is a front view of the control device of FIG. 2.

FIG. 2 is a perspective view and FIG. 3 is a front view of an example control device 200 that may be deployed as the dimmer switch 110 and/or the retrofit remote control device 112 in the lighting control system 100. The control device 200 may comprise a user interface 202 and a faceplate 204. The control device 200 may be configured to control the amount of power delivered to a lighting load (e.g., turn the lighting load on or off, or adjust the intensity level of the lighting load by transmitting a message for controlling the lighting load via a communication circuit (e.g., a wireless signal via a wireless communication circuit), and/or by controlling the lighting load via an internal load control circuit (e.g., a controllably conductive device of the control device 200)). The user interface 202 may include a light bar 220 extending along the length of the actuation member. The light bar 220 may be configured to be illuminated by one or more light sources (e.g., one or more LEDs) to visibly display information. When the control device 200 is a wall-mounted dimmer switch, the control device 200 may comprise an enclosure 230 for housing load control circuitry of the dimmer switch.

The user interface 202 of the control device 200 may include an actuation member 210 that is configured to be mounted to a base portion 212 (e.g., a bezel). The actuation member 210 may comprise a front surface 214 including an upper portion 216 and a lower portion 218. The actuation member 210 may be configured to pivot about a pivot axis 222 (e.g., a central axis) in response to a tactile actuation (e.g., a tactile input) of the upper portion 216 and the lower portion 218. The control device 200 may be configured to control a lighting load of the lighting control system 100 to turn the lighting load on in response to a tactile actuation of the upper portion 216, and to turn the lighting load off in response to a tactile actuation (e.g., a tactile input) of the lower portion 218 (or vice versa). For example, the control device 200 may be configured to turn the lighting load on to a previous intensity level (e.g., before the lighting load was previously turned off) or to a preset intensity level (e.g., a predetermined or locked preset intensity level) in response to a tactile actuation of the upper portion 216 of the actuation member 210. The control device 200 may include one or more tactile switches that are actuated in response to the tactile actuations of the upper and/or lower portions 216, 218 of the actuation member 210.

The actuation member 210 may also receive user inputs that do not cause the actuation member to pivot (e.g., about the pivot axis 222). For example, at least a portion of the front surface 214 of the actuation member 210 may be configured as a touch sensitive surface (e.g., a capacitive touch surface) that is configured to receive (e.g., detect) inputs (e.g., touch actuations/inputs), such as point actuations or gestures, from a user of the control device 200. The touch sensitive surface of the actuation member 210 may be located adjacent to and/or overlap with the light bar 220. The actuation member 210 may substantially maintain its position (e.g., with respect to the base portion 212) in response to these inputs and, depending on the positions of the inputs, the control device may enter different operating modes and/or carry out different control functions in response. For example, during a normal operating mode of the control device 200, the front surface 214 of the actuation member 210 may be actuated along the light bar 220 (e.g., along the touch sensitive surface) to adjust the amount of power delivered to, and thus the intensity level of, the lighting load according to the position of the actuation. For instance, the control device 200 may control the magnitude of a load current conducted through the lighting load based on the position of a touch actuation (e.g., a touch input) along the touch sensitive surface of the actuation member 210 to control an intensity level of the lighting load between a low-end intensity level $L_{LE}$ and a high-end intensity level $L_{HE}$. The control device 200 may control an amount of power delivered to the lighting load to an absolute level (e.g., to a maximum allowable amount) or by a relative amount (e.g., an increase of 10% from a current level) based on the position of a touch actuation along the touch sensitive surface of the actuation member 210. Examples of control devices having capacitive touch surfaces are described in greater detail in commonly-assigned U.S. Pat. No. 10,109, 181, issued Oct. 23, 2018, entitled GESTURE-BASED CONTROL DEVICE FOR CONTROLLING AN ELECTRICAL LOAD, the entire disclosure of which is hereby incorporated by reference. Although described primarily in context of a capacitive touch surface, it should be appreciated that the control device 200 is not so limited, and in some examples, at least a portion of the front surface 214 of the actuation member 210 may be configured as a different type of touch sensitive surface, such as a resistive touch surface, an inductive touch surface, a surface acoustic wave (SAW) touch surface, an infrared touch surface, acoustic pulse touch surface, or the like.

The control device 200 may control the magnitude of a load current conducted through the lighting load based on a single discrete input along the touch sensitive surface and/or based on a plurality of consecutive inputs along the touch sensitive surface. For example, the user may tap their finger at a position along the touch sensitive surface, and in response, the control device 200 may turn the lighting load on to an intensity level based on the position. As an example, if the lighting load is off, the control device 200 may turn the lighting load on to an intensity level based on the position of a touch actuation along the touch sensitive surface of the actuation member 210. While the lighting load is on, the user may move (e.g., slide) their finger along the touch sensitive surface, and in response, the control device 200 may adjust (e.g., continuously control) the magnitude of the load current conducted through the lighting load based on the positions of a plurality of inputs along the touch sensitive surface.

Further, in a color control mode, the control device 200 may control a color of the lighting load based on the position of a touch actuation along the touch sensitive surface of the actuation member 210 (e.g., by controlling a color temperature of the lighting load or by applying full color control over the lighting load). For example, the light bar 220 may be configured to illuminate a spectrum of colors through the length of the light bar 220 (e.g., across the full visible color spectrum, a subset of the visual color spectrum, and/or the light spectrum associated with the color temperatures of a black body radiator). Accordingly, the control device 200 may control the color of the lighting load based on the position of a touch actuation along the touch sensitive surface, and in turn, the corresponding color of that position on the light bar 220.

The control device 200 may be configured to prioritize user inputs that cause the actuation member 210 to pivot over user inputs that do not cause the actuation member 210 to pivot, or vice versa. For example, when the lighting load is off and a user moves a finger close to the upper portion 216 of the actuation member 210 causing the control device 200 to detect a touch actuation via the touch sensitive surface (e.g., along the light bar 220), the control device 200 may temporarily delay responding to the touch actuations received via the touch sensitive surface to see if a user is attempting to actuation the upper portion 216 of the actuation member 210 to turn on the lighting load. Accordingly, the control device 200 may avoid turning on the lighting load to an intensity level based on the position of the actuation on the light bar 220 (e.g., in response to the touch sensitive surface) if the user's finger happens to sweep past the light bar 220 while actuating the upper portion 216 of the actuation member 210 or if the user's finger actuates the upper portion 216 of the actuation member 210 too close to the light bar 220. In addition, when the lighting load is on and a user moves a finger close to the lower portion 218 of the actuation member 210 causing the control device 200 to detect a touch actuation via the touch sensitive surface, the control device 200 may temporarily ignore the touch actuations received via the touch sensitive surface after the actuation of the lower portion 218. Accordingly, the control device 200 may avoid turning on the lighting load again if the user's finger happens to sweep past the light bar 220 while moving away from the lower portion 218 of the actuation member 210.

The control device 200 may, for example, be configured to prioritize inputs received in response to actuation of the actuation member 210 over the inputs received via the capacitive touch surface by ignoring inputs received via the capacitive touch surface when a tactile actuation of the actuation member 210 is received within a blanking period (e.g., a first blanking period or an after-touch blanking period) after an initial detection of a touch actuation received via the capacitive touch surface. For example, the blanking period may be approximately 200 milliseconds. The blanking period may occur after (e.g., in response to) a touch actuation (e.g., the initial detection of a touch actuation). That is, the control device 200 may ignore touch actuations received via the capacitive touch surface when a touch actuation of the actuation member 210 is received within the blanking period (e.g., a touch actuation that begins during the blanking period). For instance, in some examples, the control device 200 may start the blanking period (e.g., a timer) in response to receiving a touch actuation via the capacitive touch surface, and ignore touch actuations received via the capacitive touch surface during the blanking period if the control device 200 receives a touch actuation of the actuation member 210 during the blanking period (e.g., a touch actuation begins during the blanking period). As such, the control device 200 may prioritize user inputs that cause the actuation member 210 to pivot over user inputs that do not cause the actuation member 210 to pivot during the blanking period.

Further, even if a blanking period is implemented, the control device 200 may be configured to respond to a quick "tap" along the touch sensitive surface. For instance, the control device 200 may be configured to determine that a touch actuation is at a position on the touch sensitive surface for an amount of time that is shorter than the blanking period without the actuation member 210 being actuated (e.g., a touch actuation starts and finishes before the end of the blanking period) and, in response, turn the lighting load on to an intensity level associated with the position in response to the touch actuation. Accordingly, the control device 200 may both implement the blanking period to avoid unintentional touch actuations along the touch sensitive surface and still respond quickly to intentional touch actuations along the touch sensitive surface.

The control device 200 may be configured to turn the lighting load on in response to a touch actuation received via the touch sensitive surface even when implementing the blanking period. For example, the control device 200 may be configured to receive a touch actuation via the touch sensitive surface at a position for an amount of time that is greater than the blanking period without the tactile switch being actuated (e.g., a touch actuation begins during the blanking period and ends after the blanking period) and, in response, turn the lighting load on to an intensity level associated with the position in response to the touch actuation. Further, the control device 200 may adjust the length of a blanking period, for example, through a user input (e.g., a touch actuation and/or a tactile actuation) received while in the advanced programming mode. For instance, in some examples, the blanking period may be configured to be greater than one second (e.g., multiple seconds). In such examples, the control device 200 may respond to a press-and-hold touch actuation along the light bar 220 by turning the lighting load on to an intensity level associated with the position of the press-and-hold actuation.

The control device 200 may be configured to temporarily ignore inputs received via the capacitive touch surface after a tactile actuation of the actuation member 210 that causes the lighting load to turn on or off. The control device 200 may be configured in this manner to, for example, avoid mistakenly turning the lighting load back on and/or adjusting the power delivered to (e.g., the intensity level of) the lighting load after a tactile actuation of the actuation member 210. For example, the control device 200 may be configured to ignore inputs received via the capacitive touch surface during a blanking period (e.g., a second blanking period or after-tactile period) after detecting a tactile actuation of the actuation member to turn the lighting load on or off. For instance, in some example, the control device 200 may start the blanking period in response to turning on or off the lighting load and, during the blanking period, ignore inputs received via the capacitive touch surface during the blanking period. As such, through the use of the blanking period, the control device 200 may be able avoid unintentional touch actuations along the capacitive touch surface after a tactile actuation of the actuation member 210. In sum, the control device 200 may be configured with one or more blanking periods, such as a first blanking period that is used to avoid unintentional touch actuations after an initial detection of a touch actuation received via the capacitive touch surface and prior to tactile actuations of the actuation member 210 (e.g., a blanking period that occurs after (e.g., in response to) a touch actuation), and/or a second blanking period that is used to avoid unintentional touch actuations after tactile actuations of the actuation member 210 (e.g., a blanking period that occurs after (e.g., in response to) a tactile actuation).

The control device 200 may be configured to detect that a touch actuation is received at a position of the touch sensitive surface that is defined by limited pivoting (e.g., a tactile actuation that causes the actuation member 210 to substantially maintain its position with respect to the base portion 212) and, in response, change an operating mode of the control device 200 and/or control a lighting load. One example of a position that is defined by limited pivoting is an area 215 of the front surface 214 over the pivot axis 222. The touch actuation (e.g., a touch input) being detected by the control device 200 may comprise a press-and-hold actuation (e.g., pressing and holding a finger in the area 215 for a non-transitory time period, such as a few seconds), a double-tap actuation (e.g., two transitory actuations of the area 215 executed in quick succession), a swipe gesture (e.g., consecutive contacts with multiple positions of the area 215 within a brief time period), and/or the like. Since the touch actuation is applied to the area 215 over the pivot axis 222 of the actuation member 210, the touch actuation may not cause the actuation member 210 to pivot (e.g., about the pivot axis 222) or otherwise change its position with respect to the base portion. As such, the touch actuation applied over the pivot axis 222 may be clearly distinguished from a tactile actuation of the upper portion 216 or the lower portion 218 so as to prevent accidental triggering of a control function that is associated with the tactile actuation of the upper portion 216 or the lower portion 218. It should be noted that although the description is provided herein in the context of a control device having a central pivot axis, the proposed techniques can also be used with other types of control devices including those configured to pivot about an axis located at a top or bottom end of the control device. That is, although illustrated at approximately the midpoint of the actuation member 210, the area 215 and/or the pivot axis 222 may be located elsewhere on the actuation member 210, such as closer to the upper portion 216 or the lower portion 218 of the actuation member 210.

The control device 200 may turn the lighting load on or off in response to receiving a touch actuation at a position of the touch sensitive surface that is defined by limiting pivoting. Further, the control device 200 may change an operating mode of the control device 200 in response to receiving a touch actuation at a position of the touch sensitive surface that is defined by limiting pivoting. One example of a change in operating mode is a change between an intensity control mode and a color control mode (e.g., a color temperature control mode and/or a full color spectrum control mode). Another example of a change in operating mode is a change between a normal operating mode and a commissioning mode that is used to associate the control device 200 with an electrical load. Yet another example of a change in operating mode is a change between a normal operating mode to an advanced programming mode. As described herein, an advanced programming mode may allow configuration and/or adjustment of one or more operating characteristics of the control device and/or a lighting load of the lighting control system 100, such as a low-end trim (e.g., a minimum intensity level) and/or a high-end trim (e.g., a maximum intensity level) of the lighting load.

During an advanced programming mode as described herein, the front surface 214 of the actuation member 210 may be actuated along the light bar 220 (e.g., a touch actuation on the touch sensitive surface) to adjust an operating characteristic (e.g., such as a low-end trim) of the control device. The light bar 220 may be affixed to the actuation member 210, and as such, the light bar 220 may be configured to move when the actuation member 210 pivots. An example of a control device having an advanced programming mode is described in greater detail in commonly-assigned U.S. Pat. No. 7,190,125, issued Mar. 13, 2007, entitled PROGRAMMABLE WALLBOX DIMMER, the entire disclosure of which is hereby incorporated by reference.

The user may set (e.g., store) a locked preset intensity level when in the advanced programming mode. A locked preset intensity level may be a programmable intensity level setting to which the control device will turn on a lighting load on in response to a tactile actuation of the actuation member 210 that turns on the lighting load (e.g., a tactile actuation of the upper portion 214 of the actuation member 210), regardless of the intensity level the lighting load was set to when it was last turned off. Once the control device 200 has entered the advanced programming mode (e.g., by pulling out a service switch, such as an air-gap actuator as shown in FIG. 2, possibly in combination with other actuations), the control device 200 may allow the user to select between different characteristics to adjust, such as the locked preset intensity level. Once the user selects the locked preset intensity level for configuration, the control device 200 may indicate that the locked present intensity level configuration has been initiated (e.g., by flashing the internal light sources). Next, the control device 200 may receive a touch actuation from the user via the touch sensitive surface (e.g., a point actuation along the light bar 220) that corresponds with an intensity level, and in response, the control device 200 will set the locked preset intensity level based on that touch actuation. Finally, the user may exit the advanced programming mode. Thereafter, whenever the control device 200 receives a tactile actuation to turn the lighting load on, the control device 200 will turn the lighting load on to the locked preset intensity level.

Further, through the advanced programming mode, the control device 200 may be configured to use an unlocked preset intensity level. When using the unlocked preset intensity level, the control device 200 may be configured to turn the lighting load on to the intensity level that was set when the lighting load was last turned off (e.g., a previous intensity level). When using the unlocked preset light level and when the lighting load is off, the control device 200 may illuminate one internal light source (e.g., and/or a portion of the light bar 220) to a greater intensity than the rest to indicate the unlocked preset intensity level to the user.

The control device 200 may be configured to ignore touch actuations via the touch sensitive surface when the lighting load is off (e.g., disable the capacitive touch circuit when the lighting load is off). For example, the control device 200 may ignore touch actuations received via the touch sensitive surface for as long as the lighting load is off, and may turn on the lighting load in response to tactile actuations of the upper portion 216 of the actuation member 210. However, in some instances, the control device 200 may turn on the lighting load in response to special touch inputs, such as long press-and-hold actuations (e.g., touch actuations that exceed a predetermined period of time) or a double-tap touch actuations. Further, the control device 200 may ignore touch actuations received via the touch sensitive surface during a blanking period after detecting a tactile actuation of the tactile switch to turn the lighting load on, and respond to touch actuations received via the touch sensitive surface after the blanking period.

Further, in some examples, and prior to turning on the lighting load, the control device 200 may be configured to allow a user to adjust an intensity level for turning on the lighting load through a touch actuation received via the capacitive touch surface. For instance, the control device 200 may be configured to receive a touch actuation via the capacitive touch surface while the lighting load is in an off state, and in response, adjust the turn-on intensity level of the lighting load but not actually turn on the lighting load. Then, upon a subsequent actuation of the actuation member 210, the control device 200 may turn the lighting load on to the turn-on intensity level that was set while the lighting load was in the off state.

The control device 200 may be configured to set a locked preset power level (e.g., intensity level) for the lighting load, such that the control device 200 is configured to automatically turn the lighting load on to the locked intensity level during a subsequent turn on event. For example, if the control device 200 is configured with a locked intensity level of 20% and the lighting load is in an off state, the control device 200 may be configured to turn the lighting load on to a 20% intensity level in response to a tactile actuation of the actuation member 210, for example, regardless of whether the user contacts the touch sensitive surface while actuating the actuation member 210. This locked preset intensity level may be configured by the user, for example, through an advanced programming mode of the control device 200.

The control device 200 may be configured to determine whether to ignore a touch actuation received via the touch sensitive surface based on the position of the touch actuation along the touch sensitive surface. That is, the control device 200 may be configured to respond to touch actuations received on some positions and ignore touch actuations received on other positions of the touch sensitive surface. For example, the control device 200 may be configured to only respond to touch actuations that are received via the touch sensitive surface when those touch actuations are received at a position that is associated with an intensity level that is less than the default intensity level (e.g., the default intensity level being the intensity level to which the control device 200 would turn on the lighting load in response to a tactile actuation of the actuation member 210, such as a locked present intensity level, a previous intensity level, and/or a turn-on intensity level). Such a feature may be helpful if the control device 200 controls a lighting load used in a hallway or bathroom to ensure that the lighting load does not turn on to an intensity level that would disrupt the user (e.g., be too bright for the user in the middle of the night). Further, in some examples, the control device 200 may also take into consideration the time when the touch actuation is received. As such, the control device 200 may determine whether to ignore a touch actuation received via the touch sensitive surface based on the position of the touch actuation along the touch sensitive surface and the time of day and/or day of the week (e.g., the control device 200 may ignore touch actuation at positions that correspond to certain intensity levels at nighttime).

The control device 200 may be configured to operate in one or more touch actuation modes (e.g., capacitive touch modes). The control device 200 may be configured to operate in a similar manner as different dimmer switches, for example, smart dimmer switches (e.g., processor-controlled dimmer switches) when in a first touch actuation mode (e.g., a smart-dimmer mode) and traditional dimmer switches (e.g., analog dimmers and/or non-smart dimmers) when operating in a second touch actuation mode (e.g., a traditional-dimmer mode). In the first touch actuation mode, the control device 200 may be configured to turn on the lighting load in response to (e.g., respond to) touch actuations via the capacitive touch surface when the lighting load is off (e.g., enable the capacitive touch circuit when the lighting load is off). In the second touch actuation mode, the control device 200 may not be configured to turn on the lighting load in response to (e.g., ignore) touch actuations via the capacitive touch surface when the lighting load is off (e.g., disable the capacitive touch circuit when the lighting load is off). In addition, the control device 200 may be configured to adjust the turn-on intensity level of the lighting load (e.g., to which the lighting load will be turn on in response to a subsequent tactile actuation of the actuation member 210) when operating in the second touch actuation mode. Further, the control device 200 may be configured with different operating characteristics (e.g., the number and/or the length of blanking periods, the types and/or characteristics of filtering modes, etc.) when operating in the first touch actuation mode as compared to the second actuation mode.

The control device 200 may be configured to change between the first and second touch actuation modes. For example, the control device 200 may select one of the touch actuation modes based on a user input (e.g., a touch actuation and/or a tactile actuation) received while in an advanced programming mode. In addition, the control device 200 may select (e.g., automatically select) one of the touch actuation modes in response the selection of another operating characteristic in the advance programming mode. For example, the control device 200 may be configured to operate in the first touch actuation mode when a locked preset intensity level is not set and in the second touch actuation mode when a locked preset intensity level is set (e.g., via the advanced programming mode).

In addition, the control device 200 may be configured to operate in additional touch actuation modes. For example, in another touch actuation mode, the control device 200 may be configured to turn on the lighting load in response to (e.g., respond to) touch actuations when the lighting load is off and the position of the touch actuation is below a position along the capacitive touch surface associated with the locked present intensity level. In addition, the control device 200 may not be configured to turn on the lighting load in response to (e.g., ignore) touch actuation when the lighting load is off and the position of the touch actuation is above the position along the capacitive touch surface associated with the locked present intensity level.

The control device 200 may be configured to change operating characteristics (e.g., the number and/or the length of blanking periods, the types and/or characteristics of filtering modes, etc.) and/or the operating mode of the control device 200 (e.g., intensity control mode, color control mode, advanced programming mode, commissioning mode, etc.) in a variety of manners. For example, the control device 200 may change operating characteristics and/or operating mode through the use of the advance programming mode, in response to receiving a touch actuation at a position of the touch sensitive surface that is defined by limiting pivoting (e.g., the area 215), based on the time of day and/or day of the week (e.g., time clock information), and/or based on a learning algorithm. For instance, once in the advanced programming mode, the control device 200 may be configured to change between operating modes (e.g., intensity control mode and color control mode) and/or change an operating characteristics (e.g., the number and/or the length of blanking periods, the types and/or characteristics of filtering modes, etc.). Alternatively or additionally, the control device 200 may change between operating modes and/or change an operating characteristics in response to receiving an input at a position of the touch sensitive surface that is defined by limiting pivoting. Further, the control device 200 may change between operating modes and/or change an operating characteristics based on the time of day and/or the day of the week. For example, the control device 200 may be configured to operate in the first touch actuation mode during the day, and in the second touch actuation mode during the night Further, the control device 200 may change operating characteristics and/or operating mode based on a learning algorithm. As another example, the control device 200 may be configured to learn that when the control device 200 receives an input (e.g., a tactile actuation) to turn a lighting load on at certain times of day, the user subsequently reduces the intensity level to a particular level (e.g., down from the turn-on intensity level to 25% intensity), and as a result, the control device 200 may be configured to initially turn the lighting load on to 25% intensity when the control device 200 receives an input to turn on the lighting load at that time of day.

As another example, the control device 200 may be configured to adjust the length of a blanking period based on a learning algorithm (e.g., the blanking period that occurs after (e.g., in response to) a touch actuation and/or the blanking period that occurs after (e.g., in response to) a tactile actuation). For instance, the control device 200 may determine that the blanking period is too short, and in response, lengthen the blanking period to avoid unintentional operations that are caused by accidental touch actuations received via the touch sensitive surface. One way that the control device 200 may determine that the blanking period is too short is by recognizing a series of events that indicate that an accidental touch actuation was received via the touch sensitive surface. For example, after turning the lighting load on in response to a first actuation (e.g., a touch actuation) of the actuation member 210 (e.g., the touch sensitive surface), the control device may receive (e.g., consistently receive) a second actuation (e.g., a touch actuation) that undoes or adjusts the control initiated by the first actuation (e.g., adjusts the intensity level). The control device may determine that the user had intended to apply a tactile actuation to the actuation member 210 and lengthen the blanking period after receiving touch actuations (e.g., the blanking period that occurs after (e.g., in response to) a touch actuation). In addition, after turning the lighting load off in response to a tactile actuation of the actuation member 210, the control device then determine that it receives two subsequent inputs via the touch sensitive surface (e.g., touch actuations)—a first input that controls the lighting load in some manner (e.g., turns the lighting load on) and a second input that undoes the control initiated by the first input (e.g., turns the lighting load off). Accordingly, the control device 200 may determine that such a series of events occurs often, and in response, lengthen the blanking period after receiving tactile actuations (e.g., the blanking period that occurs after (e.g., in response to) a tactile actuation).

Figure 4:
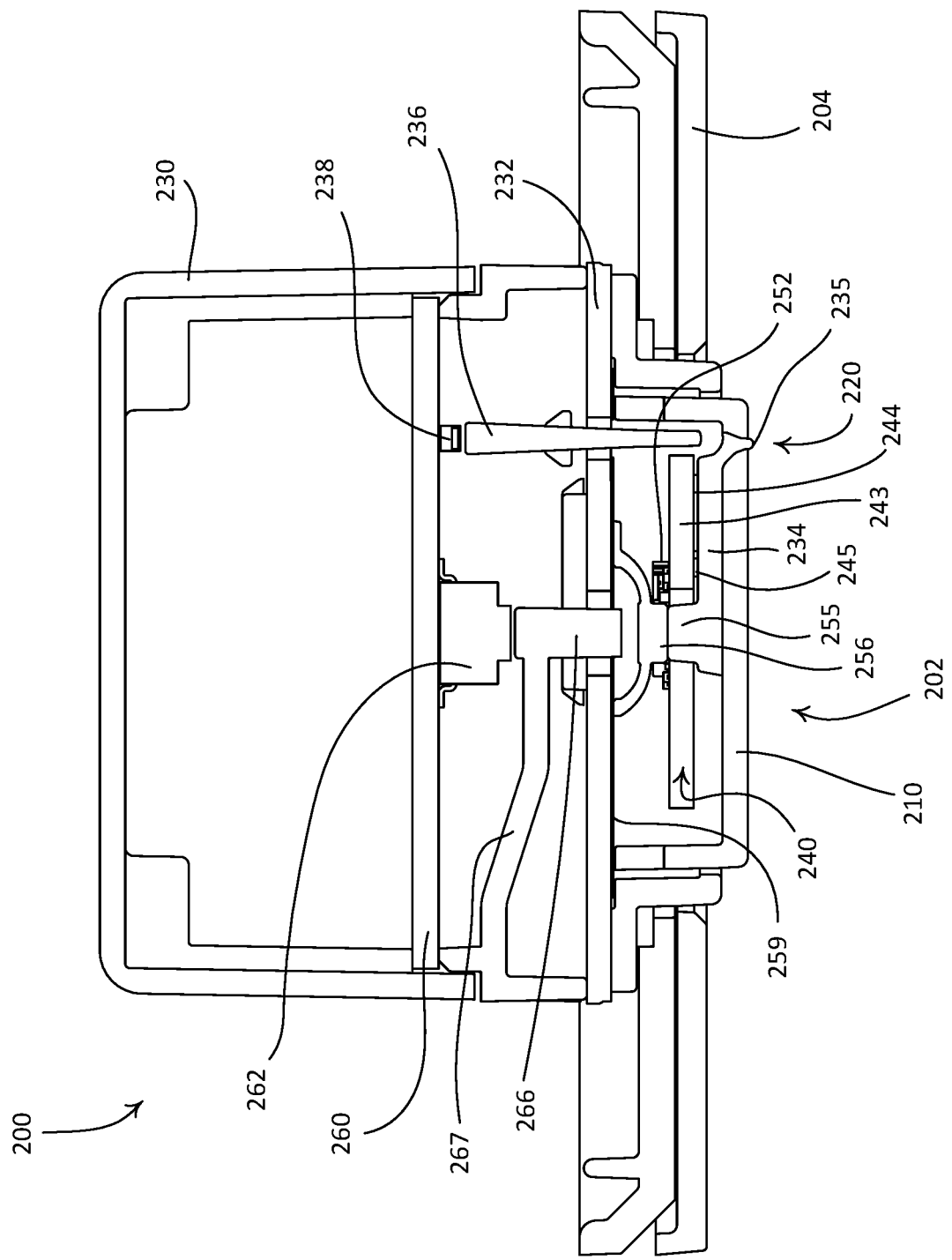
FIG. 4 is a top cross-sectional view of the control device of FIG. 2 taken through the line shown in FIG. 3.
Figure 5:
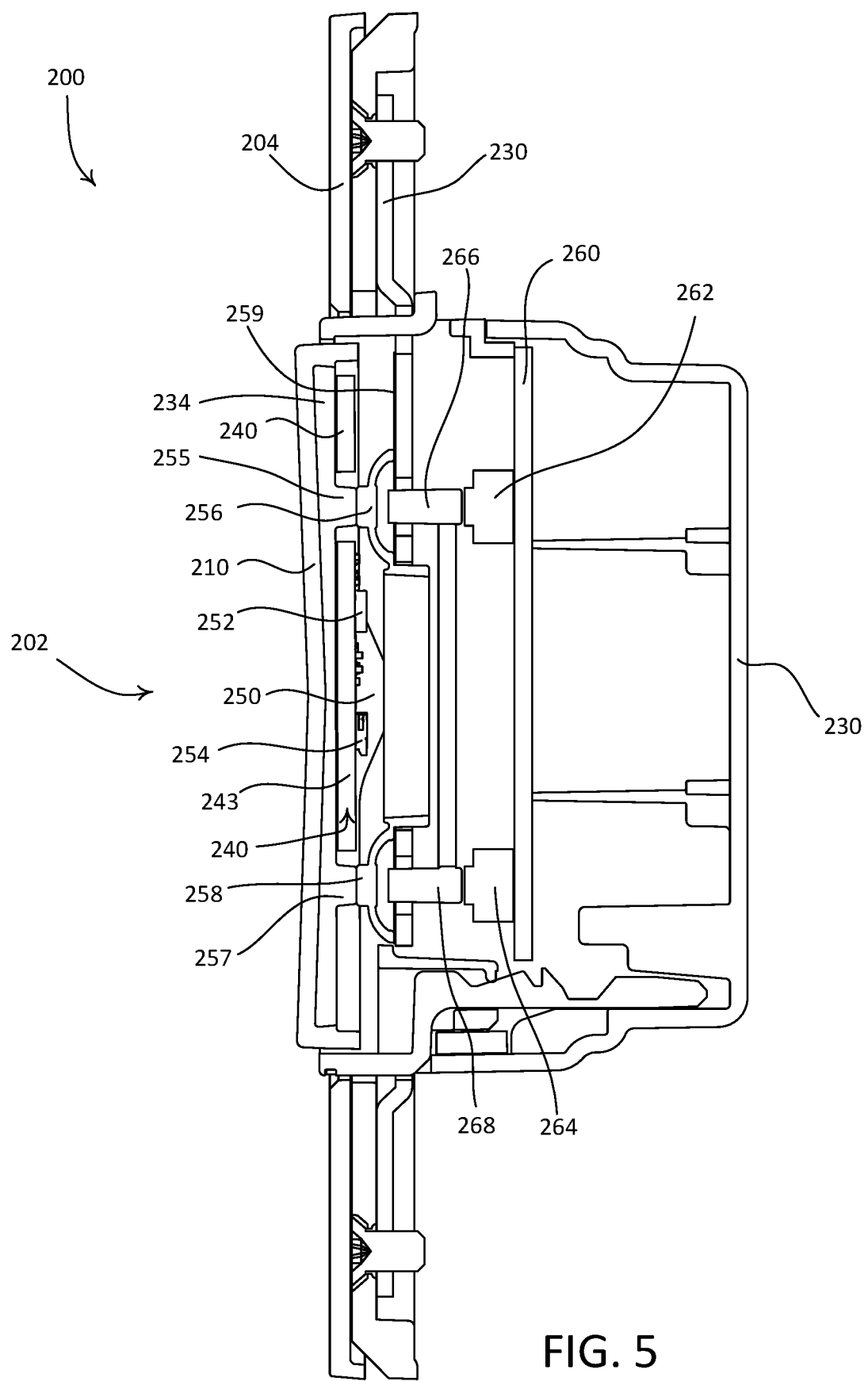
FIG. 5 is a right side cross-sectional view of the control device of FIG. 2 taken through the center of the control device (e.g., through the line shown in FIG. 3).

FIG. 4 is a top cross-sectional view of the control device 200 taken through the line shown in FIG. 3. FIG. 5 is a right side cross-sectional view of the control device 200 taken through the center of the control device (e.g., through the line shown in FIG. 3). As noted herein, the rear enclosure 230 may house the load control circuitry of the control device 200. Although illustrated with the rear enclosure 230, in some examples, such as when the control device 200 is a wireless, remote control device, the enclosure 230 may be omitted. In such examples, the control device 200 may connect to a base that is affixed to the toggle or paddle actuator of a standard light switch.

When the control device 200 is a wall-mounted dimmer switch, the control device 200 may comprise a yoke 232 that may be connected to the enclosure 230 and may be configured to mount the control device 200 to an electrical wallbox. As shown in FIG. 4, the control device 200 may comprise a diffuser 234 including a protruding portion 235 that extends through an elongated opening in the actuation member 210 to form the light bar 220. The control device 200 may also comprise a light pipe 236 that may be configured to conduct light from one or more light sources 238 located inside of the enclosure 230 to the light bar 220. For example, the light sources 238 may comprise one or more light-emitting diodes (LEDs) mounted to a main printed circuit board (PCB) 260 housed in the enclosure 230.

Figure 6:
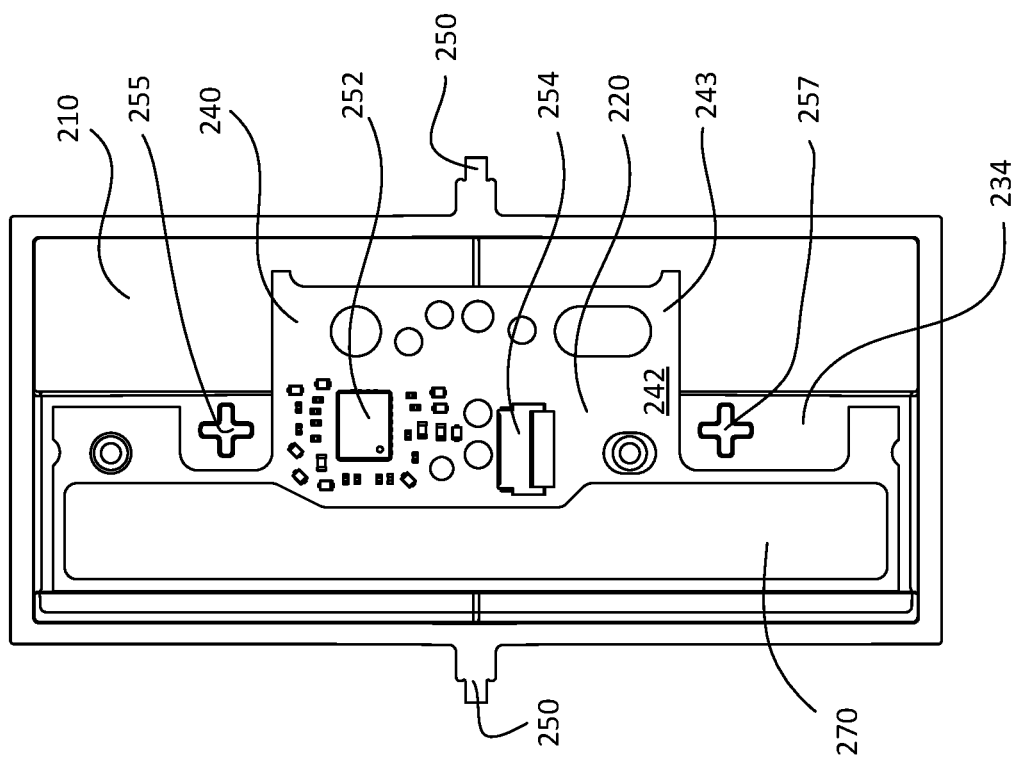
FIG. 6 is a rear view of an actuator and a capacitive touch printed circuit board of the control device of FIG. 2.

The control device 200 may include the main PCB 260 that includes the load control circuitry used to control power delivered to an electrical load. For example, the main PCB 260 may include any combination of a control circuit (e.g., a primary control circuit), memory, a drive circuit, one or more controllably conductive devices, a zero-crossing detector, a low-voltage power supply, etc. (e.g., as shown in FIG. 6). The control circuit of the main PCB 260 may be operatively coupled to a control input of the controllably conductive device, for example, via the drive circuit. The control circuit may be used for rendering the controllably conductive device conductive or non-conductive, for example, to control the amount of power delivered to the electrical load. The control device 200 (e.g., the main PCB 260) may also include mechanical switches, such as first and second tactile switches 262, 264, that are configured to be actuated in response to actuations (e.g., tactile actuations) of the upper portion 216 and the lower portion 218 of the actuation member 210, respectively (e.g., to control turning the load on and off). In some examples, the control device 200 may be configured to control a lighting load of the lighting control system 100 to turn the load on in response to an actuation of the first tactile switch 262 and to turn the load off in response to an actuation of the second tactile switch 264 (or vice versa).

When a user input (e.g., a touch actuation) is applied to an area of the front surface 214 located away from the first and second tactile switches 262, 264 (e.g., the area 215 over the pivot axis 222), the first and second tactile switches 262, 264 may not be actuated and the control device 200 may be configured to enter an advanced programming mode (e.g., as described herein) or to change operating modes (e.g., switch from an intensity control mode to a color control mode) in response to the touch actuation. For example, the area 215 may be located on the front surface 214 furthest away from the first and second tactile switch 262, 264. It should be noted that although the touch actuation is described as being applied to the area 215 over the pivot axis 222, such touch actuation may also be applied in other positions of the front surface 214 so long as those positions are sufficiently spaced away (e.g., furthest away) from the tactile switches to prevent accidental triggering of an unintended control function. For example, the touch actuation (e.g., a press-and-hold actuation) may be applied to an area of the front surface 214 that is located approximately half-way between (e.g., equidistant from) the first and second tactile switches 262, 264 to prevent accidental actuation of the tactile switches.

Figure 7:
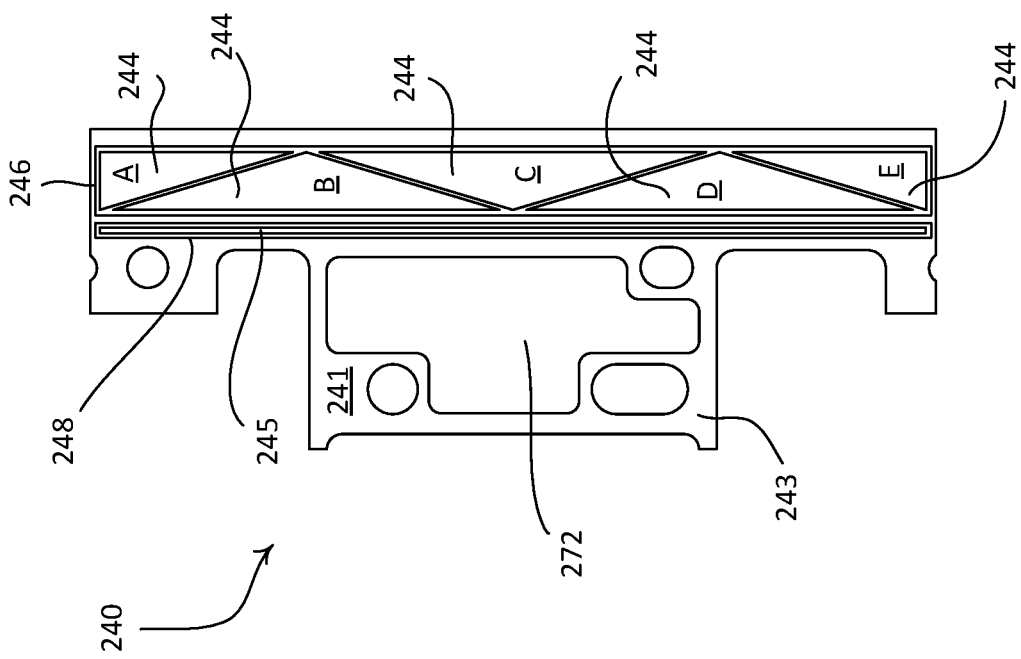
FIG. 7 is a front view of the capacitive touch printed circuit board of the control device of FIG. 2

The control device 200 may also comprise a capacitive touch printed circuit board (PCB) 240. FIG. 6 is a rear view of the actuation member 210 showing a rear side 242 of the capacitive touch PCB 240. FIG. 7 is a front view of a front side 241 of the capacitive touch PCB 240 (i.e., the opposing view of the PCB 240 shown in FIG. 6). The capacitive touch PCB 240 may be located behind (e.g., along the rear surface of) the actuation member 210 for detecting actuations of the front surface 214 of the actuation member 210. The capacitive touch PCB 240 may be planar. The capacitive touch pads 244 of the capacitive touch PCB 240 may be located adjacent to (e.g., but not immediately behind) the light bar 220 for detecting touch actuations of the light bar 220 (e.g., and/or touch actuations of the front surface 214 of the actuation member 210 adjacent to the light bar 220) as shown by an area 249 (e.g., the touch sensitive surface) indicated by the dashed line in FIG. 3. In some examples, the capacitive touch PCB 240 is not located immediately behind the light bar 220 since the light pipe 236 may extend from the light sources 238 in the enclosure 230 to the light bar 220. Further, the capacitive touch PCB 240 may be mounted or affixed to the actuation member 210, for example, such that movement or the actuation member 210 causes movement of the capacitive touch PCB 240. That is, the capacitive touch PCB 240 creates the touch sensitive surface on the front side of actuation member 210, and as such, the touch surface also moves with tactile actuations of the actuation member 210.

The capacitive touch PCB 240 may include a capacitive touch controller 252 and one or more receiving capacitive touch pads 244 for detecting the touch actuations on or adjacent to the light bar 220. The receiving capacitive touch pads 244 may be arranged in a linear array that extends from the top to the bottom of the capacitive touch PCB 240 (e.g., below the area 249). The capacitive touch controller 252 may be configured to detect the position of the touch actuation along the length of the light bar 220 in response to touch actuations received from the one or more receiving capacitive touch pads 244 and to control the electrical loads according to the determined position. For example, the capacitive touch controller 252 may provide an output signal (e.g., an output signal $V_{OUT}$) to the main PCB 260, and the main PCB 260 may control the electrical load(s) based on the determined position (e.g., by controlling a drive circuit of the control device 200, by sending a message, such as a digital message, to the electrical load (s) and/or to a system controller, etc.). The capacitive touch pads 244 may include one or more electrodes. For example, as shown in FIGS. 4 and 5, the diffuser 234 may be located between actuation member 210 and the capacitive touch pads 244 on the capacitive touch PCB 240, such there may not be any air between the actuation member 210 and the capacitive touch pads 244 to improve the sensitivity of the capacitive touch controller 252. The capacitive touch PCB 240 may comprise a proximity capacitive touch pad 245 for detecting when a touch actuation of the front surface 214 of the actuation member 210 is at a distance from the light bar 220 (e.g., on the opposite side of the linear array of receiving capacitive touch pads 244 as the light bar 220). The proximity capacitive touch pad 245 may include one or more electrodes. The capacitive touch controller 252 may not be responsive to touch actuations of the front surface 214 of the actuation member 210 too far from the light bar 220 (e.g., when the capacitive touch controller 252 detects that the touch actuation is at a distance from the light bar 220 in response to the proximity capacitive touch pad 245). In some examples, the proximity capacitive touch pad 245 may be omitted. The capacitive touch PCB 240 may include a connector 254 that is configured to receive power from a power supply of the main PCB 260 to power the components of the capacitive touch PCB 240.

The actuation member 210 may include pivot arms 250 that enable the actuation member 210 to pivot about the pivot axis 222 in response to a tactile actuation of the upper portion 216 and the lower portion 218. As described herein, the capacitive touch PCB 240 may be mounted to the actuation member 210. Accordingly, the capacitive touch PCB 240 may move (e.g. pivot) when the actuation member 210 pivots in response to a tactile actuation of the upper or lower portion 216, 218. The pivot arms 250 may define the pivot axis 222 of the actuation member 210. The PCB 240 may create the touch sensitive surface on the front surface 214 of the actuation member 210, and as such, the touch sensitive surface may also move with tactile actuations of the actuation member 210. In some examples, the capacitive touch PCB 240 may be a flexible PCB to enable further movement or bend of the capacitive touch PCB 240 in response to tactile actuations of the actuation member 210.

The tactile actuation of the actuation member 210 may cause one of the first and second tactile switches 262, 264 of the main PCB 260 to be actuated (e.g., as shown in FIG. 5B). For example, when the upper portion 216 of the actuation member 210 is actuated, the diffuser 234 may be moved toward the main PCB 260. The diffuser 234 may comprise a first post 255 that may contact a first rubber membrane 256, which may deflect inward and contact a first spacer rod 266. As shown in FIG. 4, the first spacer rod 266 may be connected to the enclosure 230 via a first arm 267. The deflection of first rubber membrane 256 may cause the first spacer rod 266 to move toward and actuate the first tactile switch 262 of the main PCB 260. Similarly, when the lower portion 218 of the actuation member 210 is actuated, the diffuser 234 may be moved toward the main PCB 260. The diffuser 234 may comprise a second post 257 that may contact a second rubber membrane 258, which may deflect inward and contact a second spacer rod 268. The second spacer rod 268 may be connected to the enclosure 230 via a second arm (not shown), which may be similar to the first arm 267. The deflection of second rubber membrane 258 may cause the second spacer rod 268 to move toward and actuate the second tactile switch 264 of the main PCB 260. Accordingly, the capacitive touch PCB 240, which has capacitive touch pads 244 that creates a touch sensitive surface on the actuation member 210, may be affixed to the actuation member 210, and the actuation member 210, when actuated, may pivot to actuate a tactile switch on a separate main PCB 260 of the control device 200. As such, tactile actuations of the actuation member 210 may cause movement of the capacitive touch PCB 240 (e.g., and the diffuser 234).

Further, it should also be appreciated that the diffuser 234 may be configured to perform multiple functions. For example, the diffuser 234 may be configured to diffuse light emitted from light sources 238 located inside the enclosure 230 to the light bar 220 located on the front surface 214 of the actuation member 210, and may also be configured to cause the actuation of one or more tactile switches 262, 264 located on the main PCB 260.

In alternate examples, the capacitive touch PCB 240 may include tactile switches on the back of the capacitive touch PCB 240. In such embodiments, the spacer rods 266, 268 would be stationary, and the tactile switches of the capacitive touch PCB 240 would be actuated by the stationary spacer rods 266, 268 in response to tactile actuations of the upper portion 216 and the lower portion 218 of the actuation member 210. That is, tactile actuations of the actuation member 210 would cause the capacitive touch PCB 240, and in turn the tactile switches of the capacitive touch PCB 240, to move into and be actuated by the stationary spacer rods 266, 268.

Although described as a capacitive touch PCB 240, in some examples, the control device 200 may include any PCB, such as the main PCB 260, at the position where the capacitive touch PCB 240 is illustrated in FIG. 4-7. In such examples, the PCB may be located behind (along the rear surface of) the actuation member 210. This PCB may include any combination of circuitry, such as any combination of the circuitry described with reference to the capacitive touch PCB 240, the main PCB 260, a communication circuit (e.g., a wireless communication circuit), and/or a sensing circuit (e.g., a proximity sensing circuit, an ambient light sensing circuit, etc.). As such, the PCB may both move in response to actuations of the actuation member 210 and perform the functions enabled by the relevant circuitry (e.g., control internal or external light sources based on feedback from an ambient light sensor and/or a proximity sensor, wirelessly transmit control signals to external electrical loads, etc.).

In examples, a user input (e.g., a touch actuation) applied to the front surface 214 of the actuation member 210 may not cause the first tactile switch 262 or the second tactile switch 264 of the main PCB 260 to be actuated. For instance, when a touch actuation is applied to the area 215 of the front surface 214 located away (e.g., furthest away) from the first and second tactile switches 262, 264 (e.g., an area over the central pivot axis 222 or an area located approximately half-way between the first and second tactile switches), the user input may not cause the actuation member 210 to move (e.g., pivot). As a result, the spacer rods 266, 268 may not move toward and actuate the tactile switches 262, 264 of the main PCB 260. As described herein, such a touch actuation may be treated by the control device 200 as an indication to enter an advanced programming mode, to change an operating mode of the control device 200, and/or to perform a specific operation.

The capacitive touch PCB 240 may comprise a substrate 243, the receiving capacitive touch pads 244, and/or one or more ground planes. For example, as shown in FIG. 6, the rear side 242 of the capacitive touch PCB 240 may include a ground plane 270 (e.g., which may be located on the opposite side of the capacitive touch PCB 240 as the receiving capacitive touch pads 244). That is, the capacitive touch PCB 240 (e.g., the substrate 243 of the capacitive touch PCB 240) may reside between the capacitive touch pads 244 and the ground plane 270. As such, the receiving capacitive touch pads 244 may be separated from the ground plane 270 by the capacitive touch PCB 240. In addition, as shown in FIG. 7, the front side 241 of the capacitive touch PCB 240 may comprise a ground plane 272, which may be electrically coupled to the ground plane 270 on the rear side 242 of the capacitive touch PCB 240. Since the capacitive touch PCB 240 may be mounted to a rear side of the actuation member 210, and since the actuation member 210 is configured to pivot in response to tactile actuations of the upper portion 216 and the lower portion 218, the distance between the receiving capacitive touch pads 244 and the yoke 232 may change when the actuation member 210 is actuated. Without the inclusion of the ground plane, the change in distance between the receiving capacitive touch pads 244 and the yoke 232 could cause the receiving capacitive touch pads 244 to provide noisy feedback, which in turn could cause mis-operation of the control device 200. The ground plane may shield the receiving capacitive touch pads 244 from any noise that may be created by the yoke 232 when the receiving capacitive touch pads 244 are moving in response to a tactile actuation of the actuation member 210. For example, the ground plane may shield the non-functional portions (e.g., back side) of the receiving capacitive touch pads 244 from noise. Finally, in some examples, one or more of the ground planes may be internal to the capacitive touch PCB 240 (i.e., located between two or more layers of the substrate 243 of the capacitive touch PCB 240).

Further, in some scenarios, the yoke 232 may be grounded. In such instances, the ground plane 270 on the rear side 242 of the capacitive touch PCB 240 and/or the ground plane 272 on the front side 241 of the capacitive touch PCB 240 may prevent the yoke 232 (e.g., the grounded yoke) from generating a touch actuation as the capacitive touch pads 244 move closer to and further away from the yoke 232. Additionally or alternatively, a metal faceplate may be installed over the control device 200 and may be in contact with (e.g., connected to) the yoke 232. In such instances, the ground plane 270 on the rear side 242 of the capacitive touch PCB 240 and/or the ground plane 272 on the front side 241 of the capacitive touch PCB 240 may prevent the yoke 232 when not grounded from generating a touch actuation via the capacitive touch pads 244 when a metal faceplate is contacted.

The load control device 200 may include an insulator 259. The insulator 259 may prevent optical reflections off the yoke from the light bar 220.

The capacitive touch PCB 240 may comprise five receiving capacitive touch pads 244 (e.g., capacitive touch regions A-E) as shown in FIG. 7. The receiving capacitive touch pads 244 may each be triangular in shape and may be arranged in a linear array that extends from the top to the bottom of the capacitive touch PCB 240 (e.g., on the right side of the capacitive touch PCB 240). For example, regions A and E of the receiving capacitive touch pads 244 may be electrically coupled together. The proximity capacitive touch pad 245 may extend from the top to the bottom of the capacitive touch PCB 240 and located farther away from the light bar 220 (which may be to the right of touch pads 244) than the linear array of receiving capacitive touch pads 244 (e.g., to the left of the receiving capacitive touch pads 244). The linear array of the receiving capacitive touch pads 244 and the proximity capacitive touch pad 245 may extend along a longitudinal axis of the control device 200 and may be oriented parallel to each other.

The receiving capacitive touch pads 244 and the proximity capacitive touch pad 245 may be configured according to a mutual capacitance sensing technique. The receiving capacitive touch pads 244 may be surrounded by a first transmission trace 246 and the proximity capacitive touch pad 245 may be surrounded by a second transmission trace 248. The control device 200 may be configured to and the proximity capacitive touch pad 245, respectively, which may reduce the influence of other objects in the environment of the control device 200 from affecting the capacitive touch sensing. The first and second transmission traces 246, 248 may be electrically coupled together.

The actuation member 210 and the diffuser 234 may be located between the touch sensitive surface (e.g., the front surface 214 of the actuation member 210) and the receiving capacitive touch pads 244 on the capacitive touch PCB 240. As shown in FIG. 5, the distance between the touch sensitive surface (e.g., the front surface 214 of the actuation member 210) and the receiving capacitive touch pads 244 on the capacitive touch PCB 240 may not be uniform over the length of the actuation member 210 (e.g., the combined assembly formed by the actuation member 210 and the diffuser 234 may not have a uniform thickness). For instance, the thickness of the actuation member 210 and the diffuser 234 may be thinnest in the middle (e.g., near the pivot axis 222) and may get gradually thicker towards the top and bottom of the actuation member 210. In examples where the distance between the touch sensitive surface and the receiving capacitive touch pads 244 on the capacitive touch PCB 240 is not uniform, the capacitive touch controller 252 may apply different sensitives to the receiving capacitive touch pads 244 based on, for example, the distance between the touch sensitive surface and each respective receiving capacitive touch pad 244. For example, the capacitive touch controller 252 on the capacitive touch PCB 240 may use different voltage thresholds $V_{TH}$ for one or more of the capacitive touch pads 244, for example, to ensure that the capacitive touch PCB 240 reacts in a similar or identical manner to comparable touches at different positions along the length of touch sensitive surface of the actuation member 210. As described in more detail below, the capacitive touch controller 252 on the capacitive touch PCB 240 may set the respective voltage thresholds $V_{TH}$ of the capacitive touch pads 244.

For example, as described in more detail below, the capacitive touch controller 252 may compare a measured voltage to a voltage threshold $V_{TH}$ and generate an output signal $V_{OUT}$ that may indicate when the measured voltage exceeds the voltage threshold $V_{TH}$. The capacitive touch controller 252 may use smaller voltage thresholds $V_{TH}$ for the capacitive touch pads 244 that are separated from the touch sensitive surface by thicker portions of the actuation member 210 and the diffuser 234 as compared to the voltage thresholds $V_{TH}$ that are used for the capacitive touch pads 244 that are separated from the touch sensitive surface by thinner portions of the actuation member 210 and the diffuser 234. Accordingly, the capacitive touch controller 252 may offset the impact of the varying thickness of the actuation member 210 and the diffuser 234 by applying different sensitivities (e.g., using varying voltage thresholds $V_{TH}$) for the capacitive touch pads 244 that are separated from the touch sensitive surface by varying thicknesses of the actuation member 210 and the diffuser 234. For example, the capacitive touch controller 252 may use a first voltage threshold $V_{TH}$ for the capacitive touch pads 244 labeled "A" and "E", a second voltage threshold $V_{TH}$ for the capacitive touch pads 244 labeled "B" and "D", and a third voltage threshold $V_{TH}$ for the capacitive touch pad 244 labeled "C". In such an example, the first voltage threshold $V_{TH}$ may be less than the second voltage threshold $V_{TH}$, and the second voltage threshold $V_{TH}$ may be less than the third voltage threshold $V_{TH}$.

Electrical noise may affect the accuracy of the touch sensitive surface of the control device 200. To avoid inaccurate readings, the control device 200 may be configured to sample (e.g., respond to) the output signal $V_{OUT}$ from the capacitive touch controller 252 during certain times but not others. For example, the control device 200 may be configured to stop sampling (e.g., not respond to) the output signal $V_{OUT}$ from the capacitive touch controller 252 during situations and circumstances that are more likely to be impacted by electrical noise (e.g., noisy events), such as, for example, when the controllably conductive device of the control device 200 is rendered conductive and/or when transmitting and/or receiving wired or wireless communications via the communication circuit of the control device 200. For example, the control device 200 may sample the output signal $V_{OUT}$ from the capacitive touch controller 252 during a time window before or after a zero-crossing of the AC mains line voltage to, for example, avoid sampling the output signal $V_{OUT}$ during times when the controllably conductive device of the control device 200 is rendered conductive. Further, the control device 200 may also, or alternatively, be configured to sample the output signal $V_{OUT}$ based on the actual times when the controllably conductive device is rendered. For example, the control device 200 may be configured to sample the output signal $V_{OUT}$ during a time window right before or after the events when the controllably conductive device of the control device 200 is rendered conductive. Similarly, in some instances, the control device 200 may detect an event that is characterized by an increase in electrical noise within the control device 200 (e.g., a noisy event), and in response, may not sample the output signal $V_{OUT}$ for a time period based on the noisy event (e.g., where the time period may encompass the noisy event). Accordingly, the control device 200 may ignore less accurate (e.g., inaccurate) outputs from the capacitive touch controller 252 that occur due to noisy events.

FIG. 8 is a perspective view of another example control device 280 that may be a dual dimmer switch. The control device 280 may comprise a user interface 282 including an actuation member 284 having first and second light bars 286', 286" on opposing sides of the actuation member 284. The actuation member 284 may have a touch sensitive surface defined by two distinct touch sensitive areas, such as a first area adjacent to and/or overlapping the first light bar 286' and a second area adjacent to and/or overlapping the second light bar 286" (e.g., the second area may be located on the opposite side of a front surface 288 of the actuation member 284 as the first area).

FIG. 9 is a front view of a front side 291 of a capacitive touch PCB 290 of the control device 280. The capacitive touch PCB 290 may be located behind (e.g., along a rear surface of) the actuation member 284 for detecting actuations of the front surface 288 of the actuation member 284. The capacitive touch PCB 290 may comprise a substrate 292 and a first array of receiving capacitive touch pads 294' that may be located adjacent to (e.g., but not immediately behind) the first light bar 286' for detecting touch actuations of the first light bar 286' (e.g., and/or touch actuations of in the first area on the front surface 288 of the actuation member 284 adjacent to the first light bar 286'). The capacitive touch PCB 290 may also comprise a second array of receiving capacitive touch pads 294" that may be located adjacent to (e.g., but not immediately behind) the second light bar 286" for detecting touch actuations of the second light bar 286" (e.g., and/or touch actuations of in the second area on the front surface 288 of the actuation member 284 adjacent to the second light bar 286"). The first and second arrays of receiving capacitive touch pads 294', 294" may be surrounded by respective transmission traces 296', 296", which may be energized to charge the respective receiving capacitive touch pads.

In addition, the capacitive touch PCB 290 may comprise first and second proximity capacitive touch pads 295', 295" adjacent to the first and second arrays of receiving capacitive touch pads 294', 294", respectively. The first and second proximity capacitive touch pads 295', 295" may be surrounded by respective transmission traces 298', 298", which may be energized to charge the respective receiving capacitive touch pads. The substrate 292 may comprise openings 299 through which posts (e.g., posts 255) may extend to actuate mechanical switches (e.g., tactile switches 262, 264) when the actuation member 284 is actuated with a tactile actuation (e.g., as described above for the actuation member 210). The proximity capacitive touch pads 295', 295" may be used to detect when an touch actuation of the front surface 288 of the actuation member 210 is between the first and second areas on the touch sensitive surface, for example, to ensure accurate control based on the inputs received via the first or second area (e.g., on the first or second light bars 286', 286", respectively). In other examples, the control device 280 may include a single proximity capacitive touch pad that is located between the first and second arrays of receiving capacitive touch pads 294', 294".

The control device 280 may control two different loads in response to touch actuations on the two respective areas of the touch sensitive surface (e.g., the front surface 288). For example, the control device 280 may be configured to control a lighting load based on touch actuations received via the first area of the touch sensitive surface and a motor load (e.g., an exhaust fan and/or a ceiling fan) based on touch actuations received via the second area of the touch sensitive surface. As another example, the control device 280 may be configured to control two different characteristics of the same load based on touch actuations received via the first and second areas of the touch sensitive surface. For instance, the control device 280 may be configured to control the intensity level of a lighting load based on touch actuations received via the first area of the touch sensitive surface and control the color (e.g., color temperature and/or full color control) of the lighting load based on touch actuations received via the second area of the touch sensitive surface. The control device 280 may operate similar to and include similar functionality as the control device 200, but with the inclusion of the user interface 282 and the capacitive touch PCB 290. Further, in some examples, the control device 200 may include the user interface 282 and the capacitive touch PCB 290, and be configured to control two different loads in response to touch actuations on the two respective areas of the touch sensitive surface.

FIGS. 10-15 depict another example of a remote control device 1200 that may be installed in a load control system, such as a lighting control system. For example, the remote control device 1200 may be installed in the lighting control system 100 of FIG. 1. The load control system may include a mechanical switch 1290 that may be in place prior to installation of the remote control device 1200, for example pre-existing in the load control system. As shown, the mechanical switch 1290 may be a standard decorator paddle switch. The load control system may further include one or more electrical loads, such as lighting loads. The mechanical switch 1290 may be coupled in series electrical connection between an alternating current (AC) power source and the one or more electrical loads.

The mechanical switch 1290 may include a paddle actuator 1292 that may be actuated to turn on and/or turn off, the one or more electrical loads. The mechanical switch 1290 may include a bezel 1293 that surrounds the paddle actuator 1292. An upper portion of the paddle actuator 1292 may protrude from the bezel 1293 (e.g., in a first orientation) when the electrical load is off, and a lower portion of the paddle actuator 1292 may protrude from the bezel 1293 (e.g., in a second orientation, as shown in FIG. 4) when the electrical load is on, or vice versa. The mechanical switch 1290 may include a yoke (not shown) that enables mounting of the mechanical switch 1290 to a structure. For example, the yoke may be fastened to a single-gang wallbox that is installed in an opening of a structure (e.g., such as a wall, ceiling, etc.). As shown, a faceplate 1296 may be secured to the mechanical switch 1290, for instance to the yoke. The faceplate 1296 may define a front surface 1261 and an opposed rear surface 1263. The front surface 1261 may alternatively be referred to as an outer surface of the faceplate 1296, and the rear surface 1263 may alternatively be referred to as an inner surface of the faceplate 1296. The faceplate 1296 may be made of any suitable material, such as plastic. The remote control device 1200 may be configured to be installed over the paddle actuator 1292 of the mechanical switch 1290 (e.g., mounted to the paddle actuator 1292, the bezel 1293, and/or the faceplate 1296).

The remote control device 1200 may include a base 1220 and a control unit 1230 (e.g., a control module). The control unit 1230 may be mounted to the base 1220. For example, the base 1220 may be configured to attach the remote control device 1200 to the mechanical switch 1290. The remote control device 1200 may also include a spacer 1210, which may be a shim and may be configured to compensate for mechanical switches having paddle actuators 1292 that protrude at greater lengths from the bezel 1293. The control unit 1230 may be mounted to the base 1220 with or without the spacer 1210. When the spacer 1210 is used, the spacer 1210 may be attached to the base 1220 and the control unit 1230 may be attached to the spacer 1210.

The base 1220 may alternatively be referred to as a base portion, a mounting frame, or a mounting assembly. The control unit 1230 and the base 1220 may be configured such that the control unit 1230 may be removably attached to the base 1220. The base 1220 may be mounted over (e.g., attached to) the paddle actuator 1292 of the mechanical switch 1290 without removing the faceplate 1296. In this regard, the remote control device 1200 may be mounted over an installed mechanical switch, such as the mechanical switch 1290, without the need to remove the faceplate 1296 and/or perform any electrical re-wiring of the mechanical switch 1290. For example, the base 1220 may be attached to the bezel 1293 of the mechanical switch 1290 using an adhesive 1205. The adhesive 1205 may be configured to secure the base 1220 to the bezel 1293.

As shown, the base 1220 may define a frame 1221. The frame 1221 may define primary attachment tabs 1222. The primary attachment tabs 1222 may be configured to releasably secure the control unit 1230 to the base 1220. The primary attachment tabs 1222 may be configured to engage the control unit 1230 (e.g., a complementary structure of the control unit 1230). The frame 1221 may further define apertures 1224. The apertures 1224 may be configured to engage the spacer 1210 (e.g., a complementary structure of the spacer 1210).

The spacer 1210 may define auxiliary attachment tabs 1212. The auxiliary attachment tabs 1212 may be configured to engage the control unit 1230 (e.g., complementary structure of the control unit 1230). The spacer 1210 may define primary snaps 1214. The primary snaps 1214 may be configured to engage the primary attachment tabs 1222 of the base 1220. For example, the primary snaps 1214 may releasably secure with the primary attachment tabs 1222 of the base 1220 such that the spacer 1210 is releasably attached to the base 1220. The spacer 1210 may define clips 1216. The clips 1216 may be configured to engage the base 1220 when the spacer 1210 is attached to the base 1220. For example, the clips 1216 may be configured to secure the spacer 1210 to the base 1220. The spacer 1210 may define pins 1218. The pins 1218 may be configured to align and/or maintain alignment between the spacer 1210 and the base 1220. The pins 1218 may extend from a perimeter of the spacer 1210. The pins 1218 may be configured to be received by the base 1220 (e.g., complementary structure of the base 1220). For example, the pins 1218 may be received by the apertures 1224 when the spacer 1210 is attached to the base 1220.

The control unit 1230 may include a user interface comprising an actuation member 1232, a housing 1234, and a battery holder 1270. For example, the actuation member 1232 may be attached to the housing 1234. The housing 1234 may define an upper wall 1241, a lower wall 1242, and opposed side walls 1243. The upper wall 1241, the lower wall 1242, and the side walls 1243 of the housing 1234 may extend from respective edges of the actuation member 1232 (e.g., from a perimeter defined by the actuation member 1232). The housing 1234 may define primary snaps 1252 and/or auxiliary snaps 1254. For example, the upper wall 1241 and the lower wall 1242 may define primary snaps 1252 and/or auxiliary snaps 1254. The control unit 1230 may be attached to the base 1220 using the primary snaps 1252 and/or to the spacer 1210 using the auxiliary snaps 1254. The primary snaps 1252 may be configured to engage the primary attachment tabs 1222 of the base 1220. For example, the primary snaps 1252 may engage the primary attachment tabs 1222 of the base 1220 when the spacer 1210 is not used. The auxiliary snaps 1254 may be configured to engage the auxiliary attachment tabs 1212 of the spacer 1210. For example, the auxiliary snaps 1254 may engage the auxiliary attachment tabs 1212 of the spacer 1210 when the spacer 1210 is used.

The housing 1234 of the control unit 230 may include a pivot bar 1250. The pivot bar 1250 may extend between the opposed side walls 1243 of the housing 1234. The pivot bar 1250 may be configured to receive the battery holder 1270. For example, the battery holder 1270 may pivotally mount to the pivot bar 1250. The battery holder 1270 may pivot about the pivot bar 1250 between a first position and a second position. The first position may correspond to the battery holder being proximate to the lower wall 1242 of the housing 1234, while the second position may correspond to the battery holder 1270 being proximate to the upper wall 1241 of the housing 1234.

The control unit 1230 may include a printed circuit board (PCB) 1244 (e.g., a flexible or rigid printed circuit board). The PCB 1244 may include a processor or controller and a touch sensitive device (e.g., which itself may include a separate processor). As such, in some examples, the PCB 1244 may act as both a main PCB and a capacitive touch PCB (e.g., may operate similarly as the main PCB 240 and the capacitive touch PCB 260 of the control device 200). The control unit 1230 may also include a light bar 1239 configured to be illuminated by one or more light sources 1237 (e.g., one or more LEDs). The light bar 1239 may be illuminated via a light guide film 1246 on the printed circuit board 1244. For example, the light sources 1237 on the printed circuit board 1244 may illuminate the light bar 1239 through the light guide film 1246. The light bar 1239 may be illuminated to visibly display information to a user of the control unit 1230. The front surface 1235 of the actuation member 1232 may be actuated along the light bar 1239 to adjust the amount of power delivered to the lighting load according to the position of the actuation.

Figure 15:
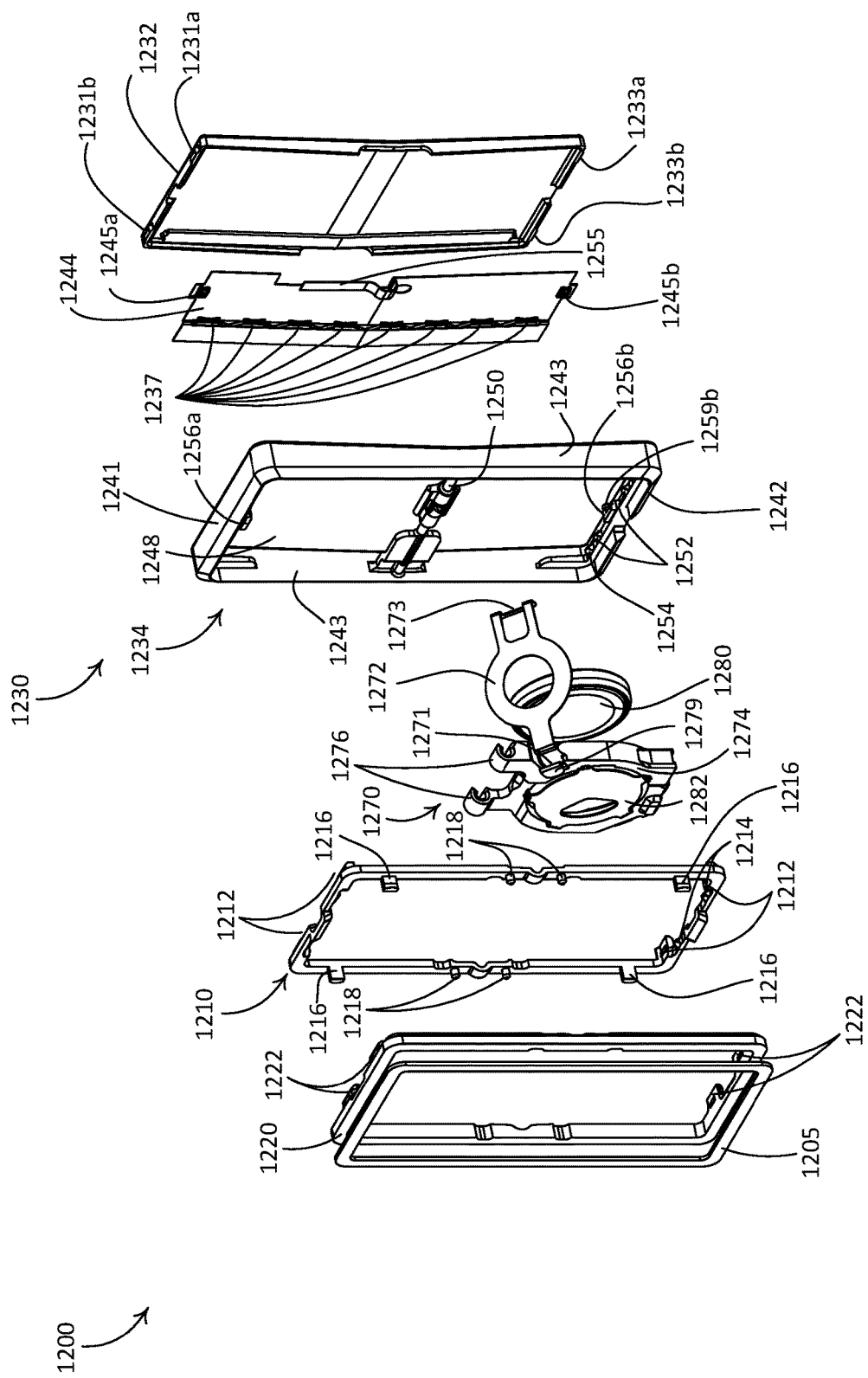
FIG. 15 is a partially exploded rear perspective view of the example control unit of the example remote control device illustrated in FIG. 10.

As shown in FIGS. 10-15, the control unit 1230 may be rectangular in shape and elongate between the upper wall 1241 and the lower wall 1242. It should be appreciated that the control unit 1230 is not limited to the illustrated rectangular geometry, and that control unit may alternatively be configured with other suitable geometries. In accordance with the illustrated orientation of the control unit 1230, the upper wall 1241 may be referred to as an upper end of the control unit 1230 and the lower wall 1242 may be referred to as a lower end of the control unit 1230. The upper and lower walls 1241, 1242 of the control unit 1230 may also be referred to as first and second ends of the housing 1234, respectively. The control unit 1230 (e.g., the housing 1234) may define a void 1248 (FIG. 15). The void 1248 may be configured to receive the printed circuit board 1244 in an attached position. The void 1248 may be defined by the upper wall 1241, the lower wall 1242, and the opposing side walls 1243. The void 248 may include an upper portion that is defined between the pivot bar 1250 and the upper wall 1241, and a lower portion that is defined between the pivot bar 1250 and the lower wall 1242. The housing 1234 may be made of any suitable material, such as plastic or metal.

The control unit 1230 may operate in a similar manner as the control device 200. For example, the actuation member 1232 may include a front surface 1235 having an upper portion 1236 and a lower portion 1238, and the control unit

1230 may be configured to control an electrical load in response to actuation of the upper or lower portions 1236, 1238 of the actuation member 1232. The actuation member 1232 may also receive user inputs that do not cause the actuation member 1232 to pivot. For example, the control unit 1230 may be configured to control an electrical load in response to touch actuations along the front surface 1235 of the actuation member 1232.

The control unit 1230 (e.g., the PCB 1244) may include mechanical switches, such as first and second tactile switches 1245*a*, 1245*b*, that are configured to be actuated in response to actuations (e.g., tactile actuations) of the upper portion 1236 and the lower portion 1238 of the actuation member 1232, respectively (e.g., to control turning the load on and off). For example, the control unit 1230 may be configured to control a lighting load of the lighting control system 100 to turn the load on in response to an actuation of the first tactile switch 1245*a* and to turn the load off in response to an actuation of the second tactile switch 1245*b* (or vice versa). For example, the control device 1200 may be configured to turn the lighting load on to a previous intensity level (e.g., before the lighting load was previously turned off) or to a preset intensity level (e.g., a predetermined or locked preset intensity level) in response to a tactile actuation of the upper portion 1236 of the actuation member 1232. The tactile actuation of the actuation member 1232 may cause one of the first and second tactile switches 1245*a*, 1245*b* of the PCB 1244 to be actuated. For example, the control unit 1230 (e.g., the housing 1234) may define a first nub 1259*a* and a second nub 1259*b*. When the upper portion 1236 of the actuation member 1232 is actuated, the first tactile switch 1244*a* may be moved toward the first nub 1259*a*. As such, the actuation of the upper portion 1236 the actuation member 1232 may cause the first tactile switch 12441 to move toward and contact the first nub 1259*a*. Similarly, when the lower portion 1238 of the actuation member 1232 is actuated, the second tactile switch 1244*b* may be moved toward the second nub 1259*b*. As such, the actuation of the lower portion 1238 the actuation member 1232 may cause the second tactile switch 1244*b* to move toward and contact the second nub 1259*b*.

The actuation member 1232 may be configured to pivot in response to a tactile actuation of the upper portion 1236 and the lower portion 1238. The actuation member 1232 may pivot about a lower axis in response to a tactile actuation of the upper portion 1236 of the actuation member and pivot about an upper axis in response to a tactile actuation of the lower portion 1238 of the actuation member 1232 (e.g., as opposed to pivoting about a midpoint of the actuation member). For example, the upper wall 1241 of the housing 1234 may include first and second recesses (not shown), and the lower wall 1242 of the housing 1234 may include first and second recesses 1253*a*, 1253*b*, respectively. Further, the actuation portion 1232 may include first and second top notches 1231*a*, 1231*b*, respectively, and first and second bottom notches 1233*a*, 1233*b*, respectively. As such, when the upper portion 1236 of the actuation member 1232 is actuated, the first and second bottom notches 1233*a*, 1233*b* of the actuation member 1232 may pivot about the first and second recesses 1253*a*, 1253*b* of the lower wall 1242, and the first tactile switch 1244*a* may be moved toward and contact the first nub 1259*a*. Similarly, when the lower portion 1238 of the actuation member 1232 is actuated, the first and second top notches 1231*a*, 1231*b* of the actuation member 1232 may pivot about the first and second recesses (not shown) of the upper wall 1241, and the second tactile switch 1244*b* may be moved toward and contact the second nub 1259*b*.

The actuation member 1232 may also receive user inputs that do not cause the actuation member 1232 to pivot. The control unit 1230 may be configured to control an electrical load in response to touch actuations along the front surface 1235 of the actuation member 1232. For example, at least a portion of the front surface 1235 of the actuation member 1232 may be configured as a touch sensitive surface (e.g., a capacitive touch surface) that is configured to receive (e.g., detect) inputs (e.g., touch actuations/inputs), such as point actuations or gestures, from a user of the control device 1200. The touch sensitive surface of the actuation member 1232 may be located adjacent to and/or overlap with the light bar 1239. For example, during a normal operating mode of the control device 1200, the front surface 1232 of the actuation member 1232 may be actuated along the light bar 1239 (e.g., along the touch sensitive surface) to adjust the amount of power delivered to, and thus the intensity level of, the lighting load according to the position of the touch actuation, for example, between a low-end intensity level $L_{LE}$ and a high-end intensity level $L_{HE}$. Although described primarily in context of a capacitive touch surface, it should be appreciated that the control device 1200 is not so limited, and in some examples, at least a portion of the front surface 1235 of the actuation member 1232 may be configured as a different type of touch sensitive surface, such as a resistive touch surface, an inductive touch surface, a surface acoustic wave (SAW) touch surface, an infrared touch surface, acoustic pulse touch surface, or the like.

The control device 1200 may control the magnitude of a load current conducted through the lighting load based on a single discrete input along the touch sensitive surface and/or based on a plurality of consecutive inputs along the touch sensitive surface. For example, the user may tap their finger at a position along the touch sensitive surface, and in response, the control device 1200 may turn the lighting load on to an intensity level based on the position. As an example, if the lighting load is off, the control device 1200 may turn the lighting load on to an intensity level based on the position of a touch actuation along the touch sensitive surface of the actuation member 1232. While the lighting load is on, the user may move (e.g., slide) their finger along the touch sensitive surface, and in response, the control device 1200 may adjust (e.g., continuously control) the magnitude of the load current conducted through the lighting load based on the positions of a plurality of inputs along the touch sensitive surface.

Further, in a color control mode, the control device 1200 may control a color of the lighting load based on the position of a touch actuation along the touch sensitive surface of the actuation member 1232 (e.g., by controlling a color temperature of the lighting load or by applying full color control over the lighting load). For example, the light bar 1239 may be configured to illuminate a spectrum of colors through the length of the light bar 1239 (e.g., across the full visible color spectrum, a subset of the visual color spectrum, and/or the light spectrum associated with the color temperatures of a black body radiator). Accordingly, the control device 1200 may control the color of the lighting load based on the position of a touch actuation along the touch sensitive surface, and in turn, the corresponding color of that position on the light bar 1239.

The PCB 1244, which may include capacitive touch pads that creates a touch sensitive surface on the actuation member 1232, may be affixed to the actuation member 1232 and may be responsive to touch actuations. The front surface 1235 of the actuation member 1232 of the control unit 1230 may define a user interface that is configured to receive inputs, such as gestures, from a user of the remote control device 1200. The user interface may be configured as a touch sensitive surface (e.g., a capacitive touch surface) that is configured to receive (e.g., detect) inputs, such as gestures, from a user of the control unit 1230. For example, the printed circuit board 1244 may include one or more capacitive touch regions, or surfaces (e.g., similar to the receiving capacitive touch pads 244 and/or the proximity capacitive touch pad 245 mounted to the capacitive touch PCB 240 of the control device 200). The printed circuit board 1244 may include one or more linear capacitive touch regions that faces an inner surface of the actuation member 1232 when the printed circuit board 1244 is disposed in the void 1248. The front surface 1235 of the actuation member 1232 may be configured to detect touches along an x-axis, a y-axis, or both an x-axis and a y-axis. Accordingly, the actuation member 1232, when actuated, may pivot to actuate one of the first or second tactile switches 1244a, 1244b, such that tactile actuations of the actuation member 1232 may cause movement of the PCB 1244.

The control unit 1230 may further include a control circuit (e.g., a processor, not shown) and a wireless communication circuit (e.g., an RF transceiver, not shown). The control unit 1230 may be configured to translate one or more inputs (e.g., user inputs) from the user interface into respective control signals that may be used to control a load control device of a load control system. The one or more inputs may be applied via touches or presses of the upper portion 1236 and/or lower portion 1238 of the actuation member 1232. For example, the control circuit may be configured to receive input signals (e.g., that correspond to the user inputs) in response to actuations of the upper portion 1236 and/or lower portion 1238 by a user of the remote control device 1200. For example, the input signals received by the control circuit may be the respective control signals translated from the control interface inputs. The control circuit may be configured to generate commands that the user desires the control unit 1230 to execute in response to the input signals produced in response to actuations of the upper portion 1236 and/or lower portion 1238. The control unit 1230 may be configured to cause the wireless communication circuit to transmit one or more control signals including the commands generated by the control circuit.

The control circuit may be configured to cause the wireless communication circuit to transmit respective commands that correspond to inputs and/or gestures received by the upper portion 1236 and/or lower portion 1238. For example, the remote control device 1200 may be operable to transmit wireless signals, for example radio frequency (RF) signals, to a load control device, one or more electrical loads, and/or a central processor of a load control system. The remote control device 1200 may be associated with the load control device and the one or more electrical loads during a configuration procedure of the load control system.

The control circuit may be configured to cause the wireless communication circuit to transmit respective commands that correspond to interpreted gestures received at the touch sensitive surface. For example, the remote control device 1200 may be operable to transmit wireless signals, for example radio frequency (RF) signals, to a load control device, one or more electrical loads, and/or a central processor of a load control system. The remote control device 1200 may be associated with the load control device and the one or more electrical loads during a configuration procedure of the load control system.

Figure 10:
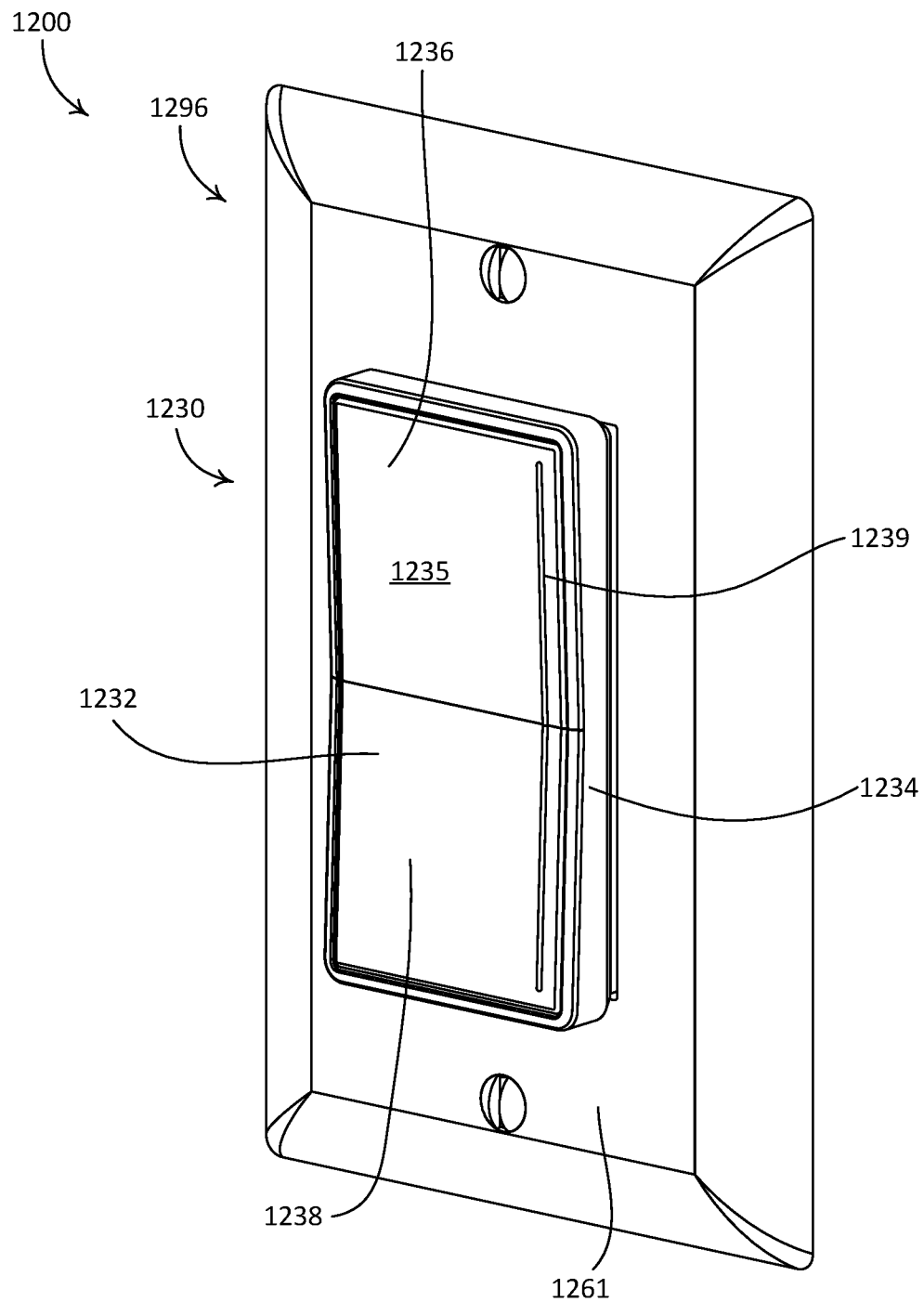
FIG. 10 is a perspective view of an example remote control device mounted over a mechanical switch.
Figure 12:
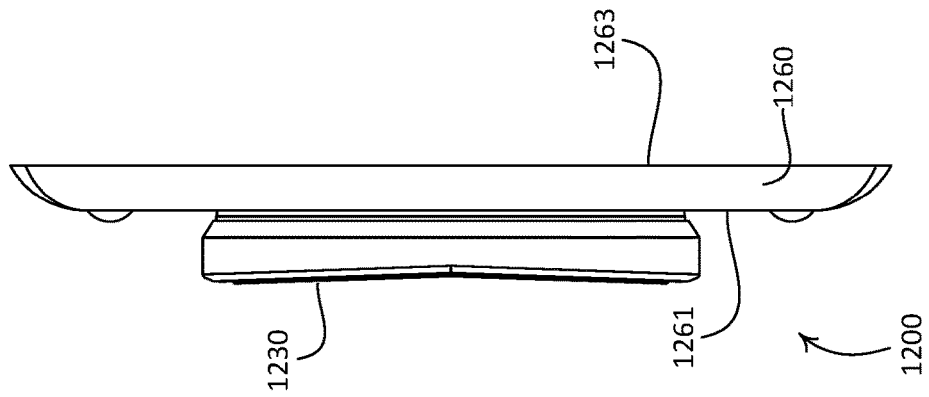
FIG. 12 is a side view of the example remote control device illustrated in FIG. 10.
Figure 11:
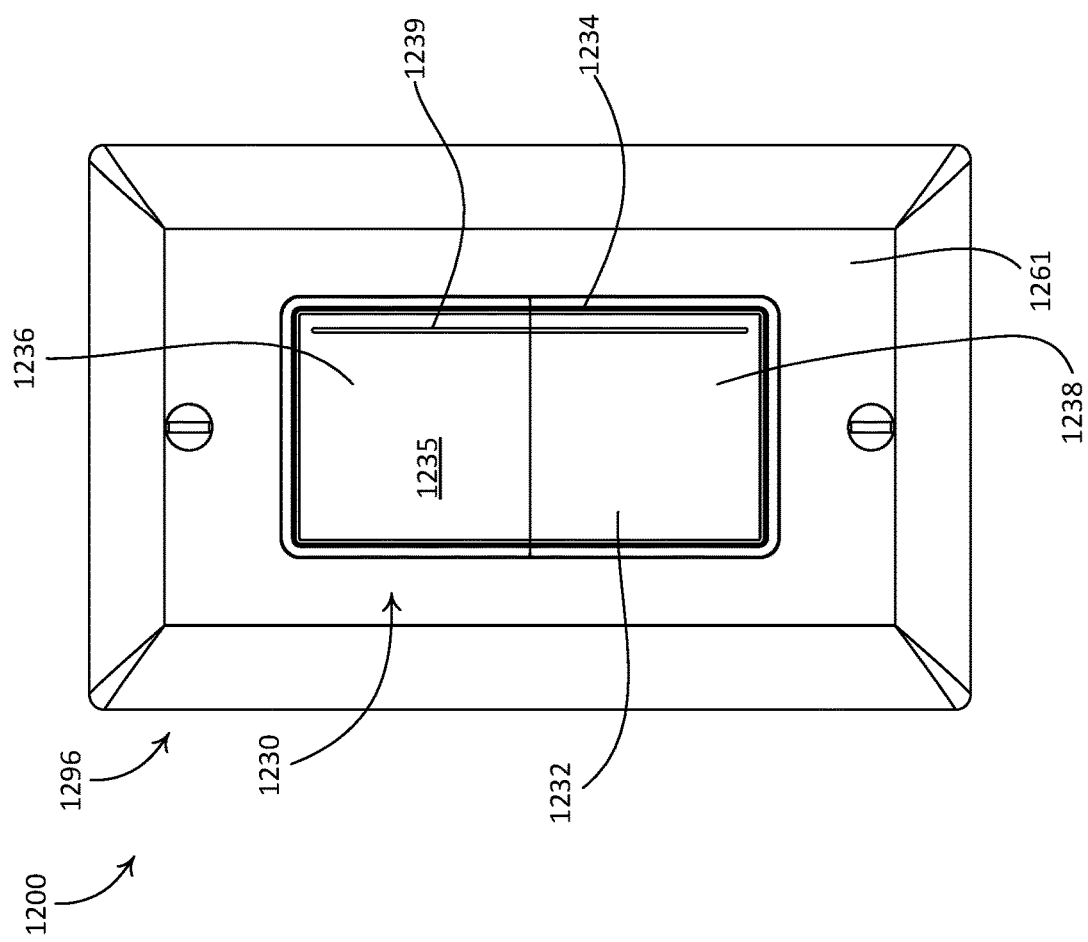
FIG. 11 is a front view of the example remote control device illustrated in FIG. 10.
Figure 13:
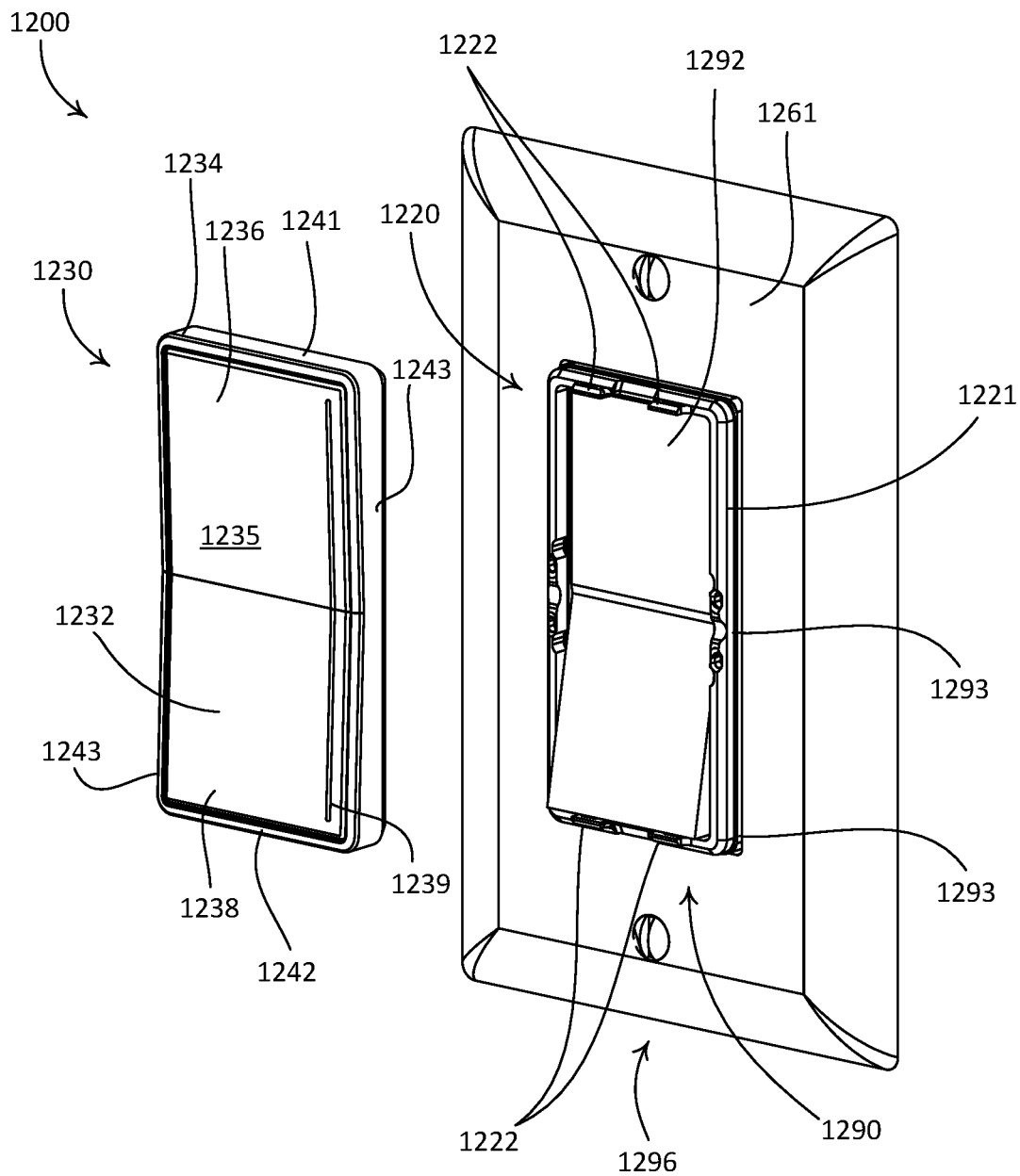
FIG. 13 is a partially exploded front perspective view of the example remote control device illustrated in FIG. 10.
Figure 14:
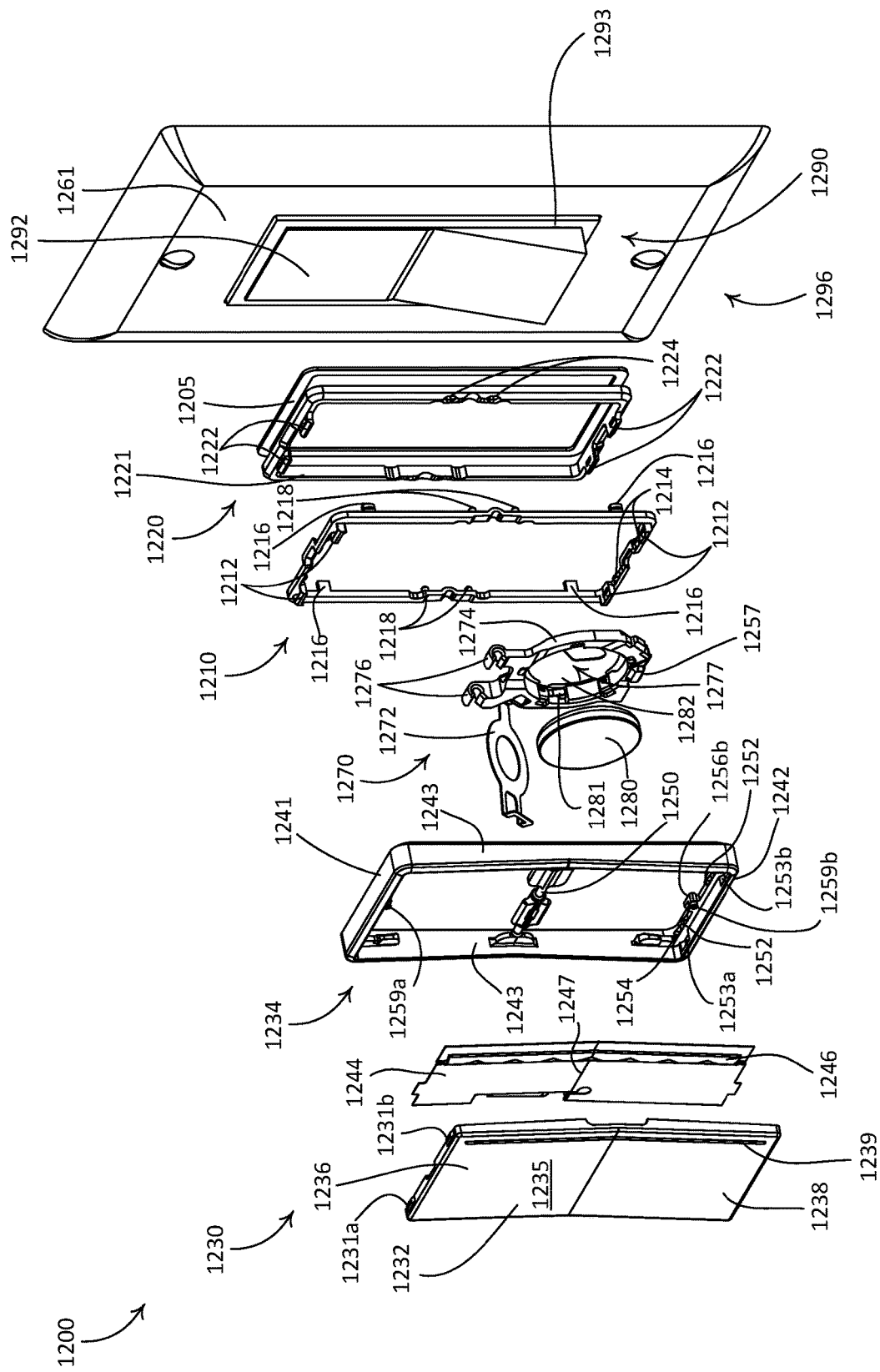
FIG. 14 is another partially exploded front perspective view of the example remote control device illustrated in FIG. 10.

The light bar 1239 of the control unit 1230 may be configured to provide a visual indication of a command issued by the remote control device 1200. For example, the control circuit may be configured to, upon receiving a gesture indicative of a command to change an amount of power delivered to an electrical load, such as a command to dim a lighting load, indicate the amount of power delivered to the electrical load by temporarily illuminating a number of the LEDs that corresponds with the desired amount of power (e.g., the desired dimming level of the lighting load). In such an example, the control circuit may be configured to cause the LEDs to be illuminated simultaneously, to illuminate sequentially with some or little overlap before fading, or to otherwise illuminate as desired. The control unit 1230 may be configured to be attached to the base 1220 with the light bar 1239 located on a predetermined side of the control unit 1230 (e.g., the right side of the control unit as shown in FIG. 10), for example, such that the light bar 1239 may be illuminated to indicate the amount of power presently being delivered to the electrical load. The printed circuit board 1244 may define a fold 1247 such that the light sources 1237 mounted thereto illuminate through the printed circuit board 1244 and light guide film 1246 to the light bar 1239.

The control unit 1230 may be configured to prioritize user inputs that cause the actuation member 1232 to pivot over user inputs that do not cause the actuation member 1232 to pivot, or vice versa. For example, when the lighting load is off and a user moves a finger close to the upper portion 1236 of the actuation member 1232 causing the control unit 1230 to detect a touch actuation via the touch sensitive surface (e.g., along the light bar 1239), the control unit 1230 may temporarily delay responding to the touch actuations received via the touch sensitive surface to see if a user is attempting to actuation the upper portion 1236 of the actuation member 1232 to turn on the lighting load. Accordingly, the control unit 1230 may avoid turning on the lighting load to an intensity level based on the position of the actuation on the light bar 1239 (e.g., in response to the touch sensitive surface) if the user's finger happens to sweep past the light bar 1239 while actuating the upper portion 1236 of the actuation member 1232 or if the user's finger actuates the upper portion 1236 of the actuation member 1232 too close to the light bar 1239. In addition, when the lighting load is on and a user moves a finger close to the lower portion 1238 of the actuation member 1232 causing the control unit 1230 to detect a touch actuation via the touch sensitive surface, the control unit 1230 may temporarily ignore the touch actuations received via the touch sensitive surface after the actuation of the lower portion 1238. Accordingly, the control unit 1230 may avoid turning on the lighting load again if the user's finger happens to sweep past the light bar 1239 while moving away from the lower portion 1238 of the actuation member 1232.

The control unit 1230 may, for example, be configured to prioritize inputs received in response to actuation of the actuation member 1232 over the inputs received via the touch sensitive surface by ignoring inputs received via the touch sensitive surface when a tactile actuation of the actuation member 1232 is received within a blanking period (e.g., 200 ms) after an initial detection of a touch actuation received via the touch sensitive surface. The blanking period may occur after (e.g., in response to) a touch actuation. That is, the control unit 1230 may ignore touch actuations received via the touch sensitive surface when a touch actuation of the actuation member 1232 is received within the blanking period (e.g., a touch actuation that begins during the blanking period). For instance, in some examples, the control unit 1230 may start the blanking period (e.g., a timer) in response to receiving a touch actuation via the touch sensitive surface, and ignore touch actuations received via the touch sensitive surface during the blanking period if the control unit 1230 receives a touch actuation of the actuation member 1232 during the blanking period (e.g., a touch actuation begins during the blanking period). As such, the control unit 1230 may prioritize user inputs that cause the actuation member 1232 to pivot over user inputs that do not cause the actuation member 1232 to pivot during the blanking period.

Further, even if a blanking period is implemented, the control unit 1230 may be configured to respond to a quick "tap" along the touch sensitive surface. For instance, the control unit 1230 may be configured to determine that a touch actuation is at a position on the touch sensitive surface for an amount of time that is shorter than the blanking period without the actuation member 1232 being actuated (e.g., a touch actuation starts and finishes before the end of the blanking period) and, in response, turn the lighting load on to an intensity level associated with the position in response to the touch actuation. Accordingly, the control unit 1230 may both implement the blanking period to avoid unintentional touch actuations along the touch sensitive surface and still respond quickly to intentional touch actuations along the touch sensitive surface.

The control unit 1230 may be configured to turn the lighting load on in response to a touch actuation received via the touch sensitive surface even when implementing the blanking period. For example, the control unit 1230 may be configured to receive a touch actuation via the touch sensitive surface at a position for an amount of time that is greater than the blanking period without the tactile switch being actuated (e.g., a touch actuation begins during the blanking period and ends after the blanking period) and, in response, turn the lighting load on to an intensity level associated with the position in response to the touch actuation. Further, the control unit 1230 may adjust the length of a blanking period, for example, through a user input received (e.g., a touch actuation and/or a tactile actuation) while in an advanced programming mode. For instance, in some examples, the blanking period may be configured to be greater than one second (e.g., multiple seconds). In such examples, the control unit 1230 may respond to a press-and-hold touch actuation along the light bar 1239 by turning the lighting load on to an intensity level associated with the position of the press-and-hold actuation.

The control unit 1230 may be configured to temporarily ignore inputs received via the touch sensitive surface after a tactile actuation of the actuation member 1232 that causes the lighting load to turn on or off. The control unit 1230 may be configured in this manner to, for example, avoid mistakenly turning the lighting load back on and/or adjusting the power delivered to (e.g., the intensity level of) the lighting load after a tactile actuation of the actuation member 1232. For example, the control unit 1230 may be configured to ignore inputs received via the touch sensitive surface during a blanking period after detecting a tactile actuation of the actuation member to turn the lighting load on or off. For instance, in some example, the control unit 1230 may start the blanking period in response to turning on or off the lighting load and, during the blanking period, ignore inputs received via the touch sensitive surface during the blanking period. As such, through the use of a blanking period (e.g., a second blanking period), the control unit 1230 may be able to avoid unintentional touch actuations along the touch sensitive surface after a tactile actuation of the actuation member 1232. In sum, the control unit 1230 may be configured with one or more blanking periods, such as a first blanking period that is used to avoid unintentional touch actuations after an initial detection of a touch actuation received via the touch sensitive surface and prior to tactile actuations of the actuation member 1232 (e.g., a blanking period that occurs after (e.g., in response to) a touch actuation), and/or a second blanking period that is used to avoid unintentional touch actuations after tactile actuations of the actuation member 1232 (e.g., a blanking period that occurs after (e.g., in response to) a tactile actuation).

The control unit 1230 may be configured to detect that a touch actuation is received at a position of the touch sensitive surface that is defined by limited pivoting (e.g., a tactile actuation that causes the actuation member 1232 to substantially maintain its position with respect to the base 1220) and, in response, change an operating mode of the control unit 1230 and/or control a lighting load. One example of a position that is defined by limited pivoting is an area of the front surface 214 over the central axis or midpoint of the actuation member 1232. The touch actuation (e.g., a touch input) being detected by the control unit 1230 may comprise a press-and-hold actuation (e.g., pressing and holding a finger in the area over the central axis for a non-transitory time period, such as a few seconds), a double-tap actuation (e.g., two transitory actuations of the area over the central axis executed in quick succession), a swipe gesture (e.g., consecutive contacts with multiple positions of the area over the central axis within a brief time period), and/or the like. Since the touch actuation is applied to the area over the central axis over the pivot axis of the actuation member 1232, the touch actuation may not cause the actuation member 1232 to pivot or otherwise change its position with respect to the base portion. As such, the touch actuation applied over the area over the central axis may be clearly distinguished from a tactile actuation of the upper portion 1236 or the lower portion 1238 so as to prevent accidental triggering of a control function that is associated with the tactile actuation of the upper portion 1236 or the lower portion 1238. It should be noted that although the description is provided herein in the context of a control device having a central pivot axis, the proposed techniques can also be used with other types of control devices including those configured to pivot about an axis located at a top or bottom end of the control device. That is, although illustrated at approximately the midpoint of the actuation member 1232, the area may be located elsewhere on the actuation member 1232, such as closer to the upper portion 1236 or the lower portion 1238 of the actuation member 1232 (e.g., directly above one or more of the pivot axis of the actuation member 1232).

The control unit 1230 may turn the lighting load on or off in response to receiving a touch actuation at a position of the touch sensitive surface that is defined by limiting pivoting. Further, the control unit 1230 may change an operating mode of the control unit 1230 in response to receiving a touch actuation at a position of the touch sensitive surface that is defined by limiting pivoting. One example of a change in operating mode is a change between an intensity control mode and a color control mode (e.g., a color temperature control mode and/or a full color spectrum control mode). Another example of a change in operating mode is a change between a normal operating mode and a commissioning mode that is used to associate the control unit 1230 with an electrical load. Yet another example of a change in operating mode is a change between a normal operating mode to an advanced programming mode. As described herein, an advanced programming mode may allow configuration and/or adjustment of one or more operating characteristics of the control device and/or a lighting load of the lighting control system 100, such as a low-end trim (e.g., a minimum intensity level) and/or a high-end trim (e.g., a maximum intensity level) of the lighting load.

During an advanced programming mode as described herein, the front surface 1235 of the actuation member 1232 may be actuated along the light bar 1239 (e.g., a touch actuation on the touch sensitive surface) to adjust an operating characteristic (e.g., such as a low-end trim) of the control device. The light bar 1239 may be affixed to the actuation member 1232, and as such, the light bar 1239 may be configured to move when the actuation member 1232 pivots.

The user may store a locked preset intensity level when in the advanced programming mode. A locked preset intensity level may be a programmable intensity level setting to which the control device will turn on a lighting load on in response to a tactile actuation of the actuation member 1232 that turns on the lighting load (e.g., a tactile actuation of the upper portion 1236 of the actuation member 1232), regardless of the intensity level the lighting load was set to when it was last turned off. Once the control unit 1230 has entered the advanced programming mode (e.g., by pulling out a service switch, such as an air-gap actuator as shown in FIG. 2, possibly in combination with other actuations), the control unit 1230 may allow the user to select between different characteristics to adjust, such as the locked preset intensity level. Once the user selects the locked preset intensity level for configuration, the control unit 1230 may indicate that the locked present intensity level configuration has been initiated (e.g., by flashing the internal light sources). Next, the control unit 1230 may receive a touch actuation from the user via the touch sensitive surface (e.g., a point actuation along the light bar 1239) that corresponds with an intensity level, and in response, the control unit 1230 will set the locked preset intensity level based on that touch actuation. Finally, the user may exit the advanced programming mode. Thereafter, whenever the control unit 1230 receives a tactile actuation to turn the lighting load on, the control unit 1230 will turn the lighting load on to the locked preset intensity level.

Further, through the advanced programming mode, the control unit 1230 may be configured to use an unlocked preset intensity level. When using the unlocked preset intensity level, the control unit 1230 may be configured to turn the lighting load on to the intensity level that was set when the lighting load was last turned off (e.g., a previous intensity level). When using the unlocked preset light level and when the lighting load is off, the control unit 1230 may illuminate one internal light source (e.g., and/or a portion of the light bar 1239) to a greater intensity than the rest to indicate the unlocked preset intensity level to the user.

The control unit 1230 may be configured to ignore touch actuations via the touch sensitive surface when the lighting load is off (e.g., disable the capacitive touch circuit when the lighting load is off). For example, the control unit 1230 may ignore touch actuations received via the touch sensitive surface for as long as the lighting load is off, and may turn on the lighting load in response to tactile actuations of the upper portion 1236 of the actuation member 1232. However, in some instances, the control unit 1230 may turn on the lighting load in response to special touch inputs, such as long press-and-hold actuations (e.g., touch actuations that exceed a predetermined period of time) or a double-tap touch actuations. Further, the control unit 1230 may ignore touch actuations received via the touch sensitive surface during a blanking period after detecting a tactile actuation of the tactile switch to turn the lighting load on, and respond to touch actuations received via the touch sensitive surface after the blanking period.

The control unit 1230 may be configured to set a locked preset power level (e.g., intensity level) for the lighting load, such that the control unit 1230 is configured to automatically turn the lighting load on to the locked intensity level during a subsequent turn on event. For example, if the control unit 1230 is configured with a locked intensity level of 20% and the lighting load is in an off state, the control unit 1230 may be configured to turn the lighting load on to a 20% intensity level in response to a tactile actuation of the actuation member 1232, for example, regardless of whether the user contacts the touch sensitive surface while actuating the actuation member 1232. This locked preset intensity level may be configured by the user, for example, through an advanced programming mode of the control unit 1230.

Further, in some examples, and prior to turning on the lighting load, the control unit 1230 may be configured to allow a user to adjust an intensity level for turning on the lighting load through a touch actuation received via the touch sensitive surface. For instance, the control unit 1230 may be configured to receive a touch actuation via the touch sensitive surface while the lighting load is in an off state, and in response, adjust the turn-on intensity level of the lighting load but not actually turn on the lighting load. Then, upon a subsequent actuation of the actuation member 1232, the control unit 1230 may turn the lighting load on to the turn-on intensity level that was set while the lighting load was in the off state.

The control unit 1230 may be configured to determine whether to ignore a touch actuation received via the touch sensitive surface based on the position of the touch actuation along the touch sensitive surface. That is, the control unit 1230 may be configured to respond to touch actuations received on some positions and ignore touch actuations received on other positions of the touch sensitive surface. For example, the control unit 1230 may be configured to only respond to touch actuations that are received via the touch sensitive surface when those touch actuations are received at a position that is associated with an intensity level that is less than the default intensity level (e.g., the default intensity level being the intensity level to which the control unit 1230 would turn on the lighting load in response to a tactile actuation of the actuation member 1232, such as a locked present intensity level, a previous intensity level, and/or a turn-on intensity level). Such a feature may be helpful if the control unit 1230 controls a lighting load used in a hallway or bathroom to ensure that the lighting load does not turn on to an intensity level that would disrupt the user (e.g., be too bright for the user) in the middle of the night. Further, in some examples, the control unit 1230 may also take into consideration the time when the touch actuation is received. As such, the control unit 1230 may determine whether to ignore a touch actuation received via the touch sensitive surface based on the position of the touch actuation along the touch sensitive surface and the time of day and/or day of the week (e.g., the control unit 1230 may ignore touch actuation at positions that correspond to certain intensity levels at nighttime).

The control unit 1230 may be configured to change operating characteristics (e.g., the number and/or the length of blanking periods, the types and/or characteristics of filtering modes, etc.) and/or the operating mode of the control unit 1230 (e.g., intensity control mode, color control mode, advanced programming mode, commissioning mode, etc.) in a variety of manners. For example, the control unit 1230 may change operating characteristics and/or operating mode through the use of the advance programming mode, in response to receiving a touch actuation at a position of the touch sensitive surface that is defined by limiting pivoting (e.g., the central axis of the actuation member 1232), based on the time of day and/or day of the week (e.g., time clock information), and/or based on a learning algorithm. For instance, once in the advanced programming mode, the control unit 1230 may be configured to change between operating modes (e.g., intensity control mode and color control mode) and/or change an operating characteristics (e.g., the number and/or the length of blanking periods, the types and/or characteristics of filtering modes, etc.). Alternatively or additionally, the control unit 1230 may change between operating modes and/or change an operating characteristics in response to receiving an input at a position of the touch sensitive surface that is defined by limiting pivoting. Further, the control unit 1230 may change between operating modes and/or change an operating characteristics based on the time of day and/or the day of the week.

Further, the control unit 1230 may change operating characteristics and/or operating mode based on a learning algorithm. As another example, the control unit 1230 may be configured to learn that when the control unit 1230 receives an input (e.g., a tactile actuation) to turn a lighting load on at certain times of day, the user subsequently reduces the intensity level to a particular level (e.g., down from the turn-on intensity level to 25% intensity), and as a result, the control unit 1230 may be configured to initially turn the lighting load on to 25% intensity when the control unit 1230 receives an input to turn on the lighting load at that time of day.

As another example, the control unit 1230 may be configured to adjust the length of a blanking period based on a learning algorithm (e.g., the blanking period that occurs after (e.g., in response to) a touch actuation and/or the blanking period that occurs after (e.g., in response to) a tactile actuation). For instance, the control unit 1230 may determine that the blanking period is too short, and in response, lengthen the blanking period to avoid unintentional operations that are caused by accidental touch actuations received via the touch sensitive surface. One way that the control unit 1230 may determine that the blanking period is too short is by recognizing a series of events that indicate that an accidental touch actuation was received via the touch sensitive surface. For example, after turning the lighting load on in response to a first actuation (e.g., a touch actuation) of the actuation member 1232 (e.g., the touch sensitive surface), the control device may receive (e.g., consistently receive) a second actuation (e.g., a touch actuation) that undoes or adjusts the control initiated by the first actuation (e.g., adjusts the intensity level). The control device may determine that the user had intended to apply a tactile actuation to the actuation member 1232 and lengthen the blanking period after receiving touch actuations (e.g., the blanking period that occurs after (e.g., in response to) a touch actuation). In addition, after turning the lighting load off in response to a tactile actuation of the actuation member 1232, the control device then determine that it receives two subsequent inputs via the touch sensitive surface (e.g., touch actuations)—a first input that controls the lighting load in some manner (e.g., turns the lighting load on) and a second input that undoes the control initiated by the first input (e.g., turns the lighting load off). Accordingly, the control unit 1230 may determine that such a series of events occurs often, and in response, lengthen the blanking period after receiving tactile actuations (e.g., the blanking period that occurs after (e.g., in response to) a tactile actuation).

When a user input (e.g., a touch actuation) is applied to an area of the front surface 1235 located away from the first and second tactile switches 1245a, 1245b (e.g., the central axis of the actuation member 1232), the first and second tactile switches 1245a, 1245b may not be actuated and the control unit 1230 may be configured to enter an advanced programming mode (e.g., as described herein) or to change operating modes (e.g., switch from an intensity control mode to a color control mode) in response to the touch actuation. For example, the area may be located on the front surface 214 furthest away from the first and second tactile switch 1245a, 1245b. It should be noted that although the touch actuation is described as being applied to the area over the central axis of the actuation member 1232, such touch actuation may also be applied in other positions of the front surface 1235 so long as those positions are sufficiently spaced away (e.g., furthest away) from the tactile switches to prevent accidental triggering of an unintended control function.

The distance between the touch sensitive surface (e.g., the front surface 1235 of the actuation member 1232) and the receiving capacitive touch pads on the printed circuit board 1244 may not be uniform over the length of the actuation member 1232 (e.g., the actuation member 1232 may not have a uniform thickness, and/or the actuation member 1232 and the printed circuit board 1244 may be shaped differently). For example, although illustrated in a bent shape having the fold 1247, printed circuit board 1244 may be straight in some examples. In situations where the distance between the touch sensitive surface (e.g., the front surface 1235 of the actuation member 1232) and the receiving capacitive touch pads on the printed circuit board 1244 is not uniform, the printed circuit board 1244 may use different voltage thresholds $V_{TH}$ for one or more of the capacitive touch pads, for example, to ensure that the printed circuit board 1244 reacts in a similar or identical manner to comparable touches at different positions along the length of touch sensitive surface of the actuation member 1232. As described in more detail below, the printed circuit board 1244 may set the respective voltage thresholds $V_{TH}$ of the capacitive touch pads.

For example, the printed circuit board 1244 may compare a measured voltage to a voltage threshold $V_{TH}$ and generate an output signal $V_{OUT}$ that may indicate when the measured voltage exceeds the voltage threshold $V_{TH}$. The printed circuit board 1244 may use smaller voltage thresholds $V_{TH}$ for the capacitive touch pads that are further separated from the touch sensitive surface as compared to the voltage thresholds $V_{TH}$ that are used for the capacitive touch pads that are separated from the touch sensitive surface by a lesser distance. Accordingly, the printed circuit board 1244 may offset the impact of the varying distances between of the front surface 1235 of the actuation member 1232 and the printed circuit board 1244 by using varying voltage thresholds $V_{TH}$ for the capacitive touch pads.

The illustrated control unit 1230 may be battery-powered. The battery 1280 (e.g., the illustrated coin cell battery) may be placed in electrical communication with the circuitry mounted to the printed circuit board 1244, for instance to power the capacitive touch regions, the control circuit, the wireless communication circuit, and/or other circuitry of the control unit 1230.

The control unit 1230 may be configured to receive the battery holder 1270. The battery holder 1270 may include a housing 1274, a retaining clip 1272, positive battery contact 1281, and a negative battery contact 1282 (e.g., a backplate). The positive battery contact 1281 may be a positive electrical contact and the negative battery contact 1282 may be a negative electrical contact. For example, the positive battery contact 1281 and the negative battery contact 1282 may be connected to the housing 1274. The battery holder 1270 may be configured to retain the battery 1280 therein. The battery holder 1270 may define a cavity 1277. For example, the housing 1274 and the negative battery contact 1282 may define the cavity 1277. The negative battery contact 1282 may be configured to attach to the housing 1274. The negative battery contact 1282 may be configured to define a rear surface of the cavity 1277. The cavity 1277 may be configured to receive the battery 1280. The retaining clip 1272 may be configured to secure the battery 1280 within the cavity 1277. The retaining clip 1272 may define a pivot clip 1271 and a locking clip 1273. The pivot clip 1271 may pivotally mount the retaining clip 1272 to the battery holder 1270. For example, the retaining clip 1272 may pivot using the pivot clip 1271. The locking clip 1273 may be configured to secure the retaining clip 1272 to the housing 1274 such that the battery 1280 is retained therein. The pivot clip 1271 may comprise a retention tab 1279 that may retain the pivot clip 1271 in the battery holder 1270 when the retaining clip 1272 is moved to the open position.

The battery holder 1270 may be configured to be installed within the void 1248 defined by the control unit 1230 (e.g., the housing 1234). For example, the void 1248 may be configured to receive the battery holder 1270. The battery holder 1270 may be configured to retain the battery 1280 therein. The battery holder 1270 may include attachment clips 1276. The attachment clips 1276 may be c-clips (e.g., such as right-angle c-clips). The attachment clips 1276 may be configured to rotatably attach to the pivot bar 1250. For example, the attachment clips 1276 may be configured to pivot about the pivot bar 1250, for example, as the battery holder is moved between the first position and the second position. The pivot bar 1250 may define a pivot axis. The battery holder 1270 may be configured to pivot about the pivot axis. The pivot axis may be located at a midpoint of the control unit 1230. Alternatively, the pivot bar 1250 may be a pin (e.g., a rod) and the battery holder 1270 may comprise fully closed loops rather than the attachment clips 1276. The pin may be slid into the closed loops of the battery holder and then the ends of the pin may be attached to the housing 1234.

The battery holder 1270 may be configured to electrically connect the battery 1280 to the control unit 1230 (e.g., the printed circuit board 1244) for powering the circuitry of the control unit 1230. The battery holder 1270 may be configured to maintain electrical contact between the battery 1280 and the printed circuit board 1244 when the battery holder 1270 is moved between the first position and the second position. For example, the positive battery contact 1281 and the negative battery contact 1282 of the battery holder 1270 may be configured to be electrically connected to a positive terminal and a negative terminal of the battery 1280, respectively, when the battery is received in the cavity 1277. The positive battery contact 1281 may operate as a spring that is biased towards the battery 1280 when the battery is received in the cavity 1277.

The control unit 1230 may include a flexible cable (not shown) that is attached (e.g., mechanically and electrically connected) to the printed circuit board 1244. The flexible cable may be attached (e.g., mechanically and electrically connected) to the battery holder 1270. The flexible cable may comprise at least two electrical conductors (not shown) for electrically connecting the circuitry of the control unit 1230 on the printed circuit board 1244 to the positive and negative terminals of the battery 1280. For example, a first one of the electrical conductors of the flexible cable may be electrically connected to positive battery contact 1281 and a second one of the electrical conductors of the flexible cable may be electrically connected to the negative battery contact 1282. Alternatively, the retaining clip 1272 may operate as a positive battery contact of the battery holder 1270.

It should be appreciated that electrical connection between the battery 1280 and the printed circuit board 1244 may be achieved in other ways. For example, the battery holder 1270 may abut a first post (not shown) on the control unit 1230 in the second position and may abut a second post (not shown) on the control unit 1230 in the first position. The first post and the second post may be configured to provide the electrical connection between the battery 1280 and the printed circuit board 1244. The first post may be proximate to the upper wall 1241 and the second post may be proximate to the lower wall 1242.

The battery holder 1270 may be configured to adjust the location of the battery 1280 within the control unit 1230. For example, the location of the battery 1280 may be adjusted based on the position of the paddle actuator 1292 when power is being delivered to the electrical load(s) associated with the mechanical switch 1290. The battery holder 1270 may be operable between a first position and a second position. For example, the battery holder 1270 may be configured to be pivoted between the first position and the second position. The first position may be defined as the battery holder 1270 proximate to the lower wall 1242 (e.g., a lower portion of the void 1248). For example, the battery holder 1270 may be in the lower portion of the void 1248 when the battery holder 1270 is in the first position. The second position may be defined as the battery holder 1270 proximate to the upper wall 1241 (e.g., an upper portion of the void 1248). For example, the battery holder 1270 may be in the upper portion of the void 1248 when the battery holder 1270 is in the second position.

The control unit 1230 (e.g., the housing 1234) may define stops 1256a, 1256b in the upper portion and the lower portion of the void 1248. The stops 1256a, 1256b may extend into the void 1248 from the upper wall 1241 and the lower wall 1242. The stops 1256a, 1256b may be configured to prevent the battery holder 1270 from pivoting beyond the first position and the second position, respectively. The stops 1256a, 1256b may be configured to prevent the battery holder 1270 from abutting the printed circuit board 1244. The stops 1256a, 1256b may be configured to snap into an outer edge 1257 of the housing 1274 of the battery holder 1270 when the battery holder 1270 is in the first position or the second position. The control unit 1230 may be configured to be attached to the base 1220 with the light bar 1239 located on a predetermined side of the control unit (e.g., the right side of the control unit as shown in FIG. 10), for example, such that the light bar 1239 may be illuminated to indicate the amount of power presently being delivered to the electrical load. The control unit 1230 may be configured to be attached to base 1220 with the light bar 1239 located on a predetermined side of the control unit independent of a position of the paddle actuator 1292 of the mechanical switch 1290 (e.g., whether the upper portion or the lower portion of the paddle actuator 1292 is protruding from the bezel 1293). For example, the control unit 1230 may be configured such that the battery 1280 can be pivoted between the first position and the second position based on whether the upper portion or the lower portion of the paddle actuator 1292 is protruding from the bezel 1293.

The void 1248 of the control unit 1230 may be configured to receive a portion of the paddle actuator 1292 of the mechanical switch 1290 when the control unit 1230 is attached to the base 1220. The control unit 1230 may define separate portions of the void 1248, for example, the upper portion and the lower portion. When the mechanical switch 1290 is in a first orientation (e.g., when the upper portion of the paddle actuator 1292 is protruding from the bezel 1293), the upper portion may receive the upper portion of the paddle actuator 1292 and the lower portion may receive the battery holder 1270. When the mechanical switch 1290 is in a second orientation (e.g., when the lower portion of the paddle actuator 1292 is protruding from the bezel 1293), the lower portion may receive the portion of the lower portion of the paddle actuator 1292 and the upper portion may receive the battery holder 1270.

In some installations, the control unit 1230 may not be offset from the paddle actuator 1292 of the mechanical switch 1290 by enough distance when control unit 1230 is mounted to the base 1220, and the control unit 1230 may even contact the paddle actuator 1292. In this scenario, the control unit 1230 may cause the paddle actuator 1292 of the mechanical switch 1290 to change from the on position to the off position when a user actuates the actuation member 1232. The control unit 1230 (e.g., the housing 1234) may define flanges in the upper portion and the lower portion of the void 1248. The flanges may extend into the void 1248 from the opposed side walls 1243. When the control unit 1230 is being mounted onto the base 1220 during installation of the remote control device 1200, the flanges 1268 may contact the paddle actuator 1292 to indicate to the installer that the control unit 1230 may not be offset from the paddle actuator 1292 by enough distance. The installer may then install the spacer 1210 (or multiple spacers) onto the base 1220 to provide additional distance between the control unit 1230 and the paddle actuator 1292.

Figure 16:
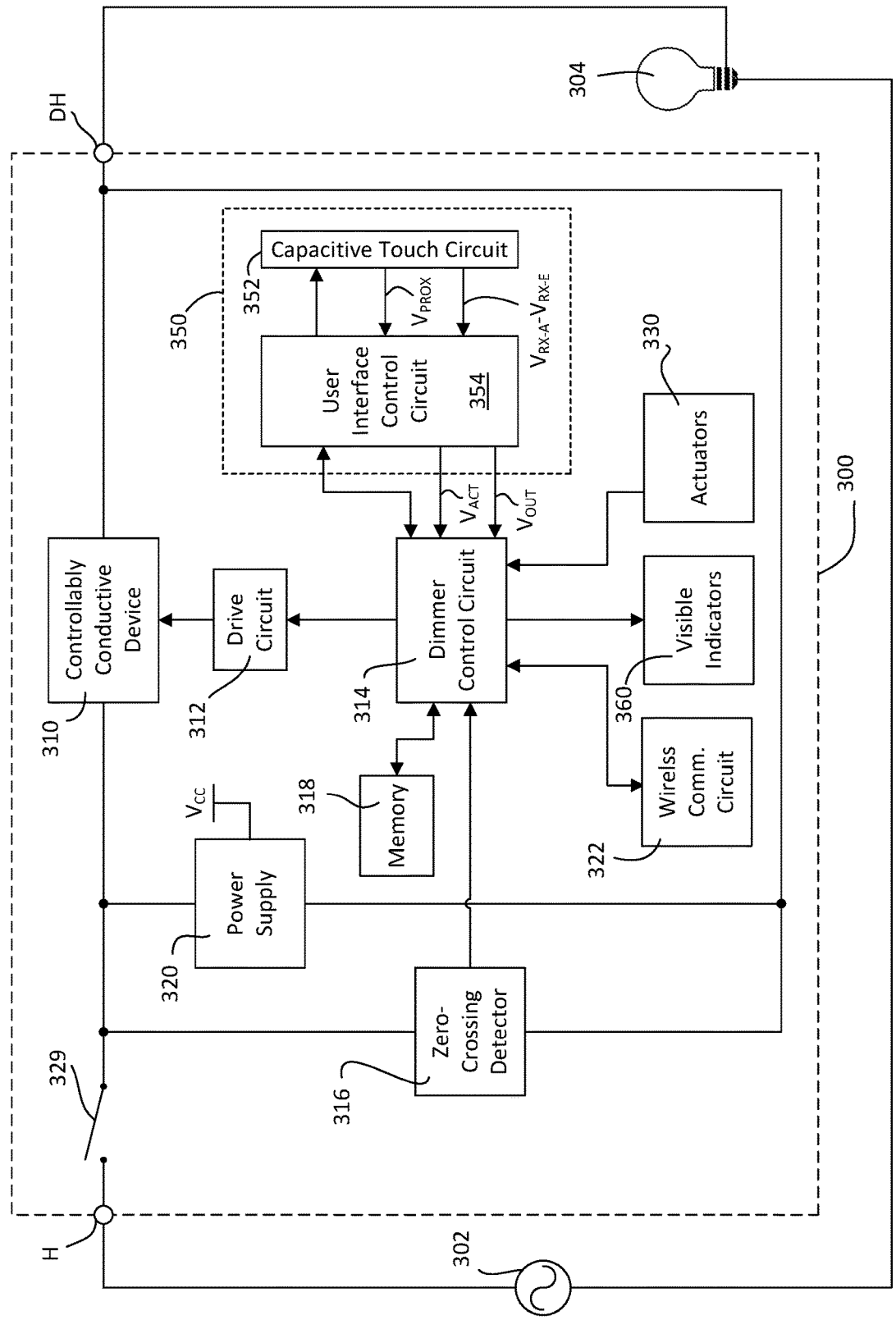
FIG. 16 shows a simplified block diagram of an example control device (e.g., dimmer switch) that may be implemented as the control device illustrated in FIG. 2 and/or the control device illustrated in FIG. 8.

FIG. 16 is a simplified block diagram of an example control device 300 (e.g., a dimmer switch) that may be deployed as, for example, the dimmer switch 110 of the lighting control system 100, the control device 200 of FIGS. 2-7, and/or the control device 280 of FIGS. 8-9. The control device 300 may include a hot terminal H that may be adapted to be coupled to an AC power source 302. The control device 300 may include a dimmed hot terminal DH that may be adapted to be coupled to an electrical load, such as a lighting load 304. The control device 300 may include a controllably conductive device 310 coupled in series electrical connection between the AC power source 302 and the lighting load 304. The controllably conductive device 310 may control the power delivered to the lighting load. The controllably conductive device 310 may include a suitable type of bidirectional semiconductor switch, such as, for example, a triac, a field-effect transistor (FET) in a rectifier bridge, two FETs in anti-series connection, or one or more insulated-gate bipolar junction transistors (IGBTs). An air-gap switch 329 may be coupled in series with the controllably conductive device 310. The air-gap switch 329 may be opened and closed in response to actuations of an air-gap actuator (e.g., not shown). When the air-gap switch 329 is closed, the controllably conductive device 310 is operable to conduct current to the load. When the air-gap switch 329 is open, the lighting load 304 is disconnected from the AC power source 302.

The control device 300 may include a dimmer control circuit 314. The dimmer control circuit 314 may include one or more of a processor (e.g., a microprocessor), a microcontroller, a programmable logic device (PLD), a field programmable gate array (FPGA), an application specific integrated circuit (ASIC), or any suitable controller or processing device. The dimmer control circuit 314 may be operatively coupled to a control input of the controllably conductive device 310, for example, via a gate drive circuit 312. The dimmer control circuit 314 may be used for rendering the controllably conductive device 310 conductive or non-conductive, for example, to control the amount of power delivered to the lighting load 304. The dimmer control circuit 314 may receive a control signal representative of the zero-crossing points of the AC mains line voltage of the AC power source 302 from a zero-crossing detector 316. The dimmer control circuit 314 may be operable to render the controllably conductive device 310 conductive and/or non-conductive at predetermined times relative to the zero-crossing points of the AC waveform using a phase-control dimming technique. The dimmer control circuit 314 may be configured to control the magnitude of a load current conducted through the lighting load(s) so as to control an intensity level of the lighting load 304 across a dimming range between a low-end intensity level $L_{LE}$ and a high-end intensity level $L_{HE}$. For example, the dimmer control circuit 314 may be configured to control the intensity level of the lighting load 304 to a number $N_{INT}$ (e.g., 255) of intensity levels between the low-end intensity level $L_{LE}$ and the high-end intensity level $L_{HE}$.

The control device 300 may include a memory 318. The memory 318 may be communicatively coupled to the dimmer control circuit 314 for the storage and/or retrieval of, for example, operational settings, such as, lighting presets and associated preset light intensities. The memory 318 may be implemented as an external integrated circuit (IC) or as an internal circuit of the dimmer control circuit 314. The control device 300 may include a power supply 320. The power supply 320 may generate a direct-current (DC) supply voltage $V_{CC}$ for powering the dimmer control circuit 314 and the other low-voltage circuitry of the control device 300. The power supply 320 may be coupled in parallel with the controllably conductive device 310. The power supply 320 may be operable to conduct a charging current through the lighting load 304 to generate the DC supply voltage $V_{CC}$.

The dimmer control circuit 314 may be responsive to user inputs received from actuators 330 and/or a touch sensitive device 350. It should be appreciated that in examples where the control device is a dual-dimmer, the control device may include two touch sensitive devices 350 or a single touch sensitive device that is responsive to two sets of capacitive touch elements, such as capacitive touch pads. The dimmer control circuit 314 may control the controllably conductive device 310 to adjust the intensity level of the lighting load 304 in response to the user inputs (e.g., tactile actuations and/or touch actuations) received via the actuators 330 and/or the touch sensitive device 350. The dimmer control circuit 314 may receive respective input signals from the actuators 330 in response to tactile actuations of the actuators 330 (e.g., in response to movements of the actuators 330). For example, the actuators 330 may be actuated in response to tactile actuations of an upper portion and/or a lower portion of the actuation member of the control device.

The touch sensitive device 350 may be configured to detect touch actuations (e.g., point actuations and/or gestures, where, for example, the gestures may be effectuated with or without physical contacts with the touch sensitive device 350), and provide respective output signals $V_{OUT}$ to the dimmer control circuit 314 indicating the touch actuations (e.g., indicating a position of one or more touch actuations). Further, the touch sensitive device 350 may detect a touch actuation (e.g., a press-and-hold actuation) applied to an area of the front surface of the actuation member that resides over the pivot axis and cause the dimmer control circuit 314 to enter an advanced programming mode, as described herein. The touch sensitive device 350 may also detect a touch actuation of the front surface along the light bar and cause the dimmer control circuit 314 to adjust the amount of power delivered to the lighting load 304 accordingly. The dimmer control circuit 314 may be configured to translate the input signals received from the actuators 330 and/or the output signals $V_{OUT}$ received from the touch sensitive device 350 into control data (e.g., one or more control signals). The control circuit 314 may use the control data to drive a drive circuit 312 to control a controllably conductive device 310 to adjust the amount of power delivered to the lighting load 304 and/or cause the control data to be transmitted to the lighting load 304 or a central controller of the load control system.

The touch sensitive device 350 may include a capacitive touch circuit 352 and a user interface control circuit 354 (e.g., which may be an example of the capacitive touch controller 252). The capacitive touch circuit 352 that comprises one more capacitive touch elements. For example, the capacitive touch circuit 352 may comprise one or more capacitive touch pads, such as the receiving capacitive touch pads 244 and/or the proximity capacitive touch pad 245 mounted to the capacitive touch PCB 240 of the control device 200. In addition, the capacitive touch circuit 352 may comprise one or more capacitive transmission traces, such as the first and second transmission traces 246, 248 on the capacitive touch PCB 240 of the control device 200. The capacitive touch circuit 352 may provide one or more capacitive receive signals $V_{RX-A}$-$V_{RX-E}$ from the capacitive touch pads of the capacitive touch circuit 352 (e.g., from regions A-E of the receiving capacitive touch pads 242 mounted to the capacitive touch PCB 240 of the control device 200), where each capacitive receive signal $V_{RX-A}$-$V_{RX-E}$ indicates the capacitance of a capacitive touch pad. Further, the capacitive touch circuit 352 may provide a proximity sense signal $V_{PROX}$ to the user interface control circuit 354 (e.g., based on the proximity capacitive touch pad 245 mounted to the capacitive touch PCB 240 of the control device 200).

The user interface control circuit 354 may include one or more of a processor (e.g., a microprocessor), a microcontroller, a programmable logic device (PLD), a field programmable gate array (FPGA), an application specific integrated circuit (ASIC), or any suitable controller or processing device. The user interface control circuit 354 may include a memory and/or may use the memory 318. The user interface control circuit 354 may be configured to determine or detect a change in the capacitances of the capacitive touch pads of the capacitive touch circuit 352 (e.g., due to a user's finger actuating the front surface 214 of the actuation member 210), and generate the output signal $V_{OUT}$ in accordance with the change in capacitance of the capacitive touch pads. The output signal $V_{OUT}$ may indicate a position of a touch actuation along the front surface of the actuation member (e.g., over the light bar 220). As noted above, the user interface control circuit 354 may receive one or more capacitive receive signals $V_{RX-A}$-$V_{RX-E}$ from the capacitive touch pads of the capacitive touch circuit 352 (e.g., from regions A-E of the receiving capacitive touch pads 242 mounted to the capacitive touch PCB 240 of the control device 200), where each capacitive receive signal $V_{RX-A}$-$V_{RX-E}$ indicates the capacitance of a capacitive touch pad.

The user interface control circuit 354 may be configured to determine the position of the touch actuation along the front surface of the actuation member (e.g., along the light bar 220) in response to the receive signals $V_{RX-A}$-$V_{RX-E}$ generated by the receiving capacitive touch pads. In response, the user interface control circuit 354 may generate and provide the output signal $V_{OUT}$ to the dimmer control circuit 314. For example, the user interface control circuit 354 may be configured to charge capacitances of the capacitive touch pads of the capacitive touch circuit 352. For example, although not illustrated, the capacitive touch pads of the capacitive touch circuit 352 may be coupled to user interface control circuit 354 via a capacitive transmitting circuit (not shown) and/or a capacitive receiving circuit (not shown). The user interface control circuit 354 may be configured to control the capacitive transmitting circuit to charge capacitances of the capacitive touch pads (e.g., the capacitive touch pads 242) of the capacitive touch circuit 352. For example, the capacitive transmitting circuit may be configured to pull the transmission trace (e.g., the transmission trace 244) of the capacitive touch circuit 352 up towards the supply voltage $V_{CC}$ to charge the capacitances of the capacitive touch pads.

The user interface control circuit 354 may step through each of the capacitive touch pads of the capacitive touch circuit 352 and process the capacitive receive signals $V_{RX-A}$-$V_{RX-E}$ to detect a change in the capacitance of the respective capacitive touch pad. For example, the user interface control circuit 354 may periodically charge the capacitance of each of the capacitive touch pads of the capacitive touch circuit 352 and then discharge the capacitance of the respective touch pad into a capacitor (not shown) of the user interface control circuit 354 (e.g., which may have a much larger capacitance than the capacitance of each of the capacitive touch pads of the capacitive touch circuit 352). The user interface control circuit 354 may be configured to compare the voltage across the capacitor of the touch sensitive device 350 to a voltage threshold $V_{TH}$ and generate an output signal $V_{OUT}$, which may indicate when the voltage across the capacitor of the touch sensitive device 350 exceeds the voltage threshold $V_{TH}$. For example, the user interface control circuit 354 may charge and discharge the capacitance of each capacitive touch pad a predetermined number of time (e.g., 500 times) during a sensing interval (e.g., 500 μsec) before moving on the next capacitive touch pad of the capacitive touch circuit 352.

The user interface control circuit 354 may be configured to determine a count $N_{CAP}$ that indicates how many times the capacitance of the respective capacitive touch pad was charged and discharged before the voltage across the capacitor of the touch sensitive device 350 exceeds the voltage threshold $V_{TH}$. The count $N_{CAP}$ may indicate the present capacitance of the respective capacitive touch pad of the capacitive touch circuit 352. The count $N_{CAP}$ for each of the capacitive touch pads of the capacitive touch circuit 352 may represent a sample of the present capacitance of the respective touch pad during the preceding sensing interval. The user interface control circuit 354 may be configured to process the count $N_{CAP}$ to determine the present capacitance of the respective touch pad of the capacitive touch circuit 352 using a respective baseline count $N_{BL}$ for each of the capacitive touch pads of the capacitive touch circuit 352. The baseline count $N_{BL}$ may indicate an idle capacitance of each of the capacitive touch pads when the front surface of the actuation member (e.g., the light bar) is not being actuated. The user interface control circuit 354 may be configured to determine the respective baseline counts $N_{BL}$ for each of the capacitive touch pads of the capacitive touch circuit 352 when the front surface of the actuation member is not being actuated. For example, the baseline count $N_{BL}$ may be a long-term average of the count $N_{CAP}$ determined by the user interface control circuit 354 from the capacitive receive signals $V_{RX-A}$-$V_{RX-E}$.

After stepping through each of the capacitive touch pads of the capacitive touch circuit 352 (e.g., after a round of capacitive sensing of the capacitive touch pads), the user interface control circuit 354 may process the determined counts $N_{CAP}$ for each of the respective capacitive touch pads of the capacitive touch circuit 352 to detect a touch actuation. The user interface control circuit 354 may be configured to determine a change $\Delta_{CAP}$ in the count (e.g., which may indicate the capacitance of each of the capacitive touch pad of the capacitive touch circuit 352) by determining the difference between the respective baseline count $N_{BL}$ from the present count $N_{CAP}$ of the respective capacitive touch pad, e.g., $\Delta_{CAP}=|N_{CAP}-N_{BL}|$. The user interface control circuit 354 may be configured to determine that capacitive sensitive surface (e.g., the light bar) is being actuated when at least one of the changes $\Delta_{CAP}$ in count exceeds a capacitance-change threshold $TH_{CAP}$, which may represent a 0.5% to 1% change in the capacitance, for example.

The user interface control circuit 354 may be configured to determine a number $N_{TOUCH-IN}$ of times (e.g., a number of consecutive rounds of capacitive sensing) that the change $\Delta_{CAP}$ in count for one of the capacitive touch pads exceeds the capacitance-change threshold $TH_{CAP}$. The user interface control circuit 354 may be configured to enter an active touch mode when the number $N_{TOUCH-IN}$ exceeds a touch-in threshold $TH_{TOUCH-IN}$ (e.g., such as two, three, four, five, six, seven, or eight). For example, the user interface control circuit 354 may detect a touch actuation when the number $N_{TOUCH-IN}$ exceeds a touch-in threshold $TH_{TOUCH-IN}$. When in the active touch mode, the user interface control circuit 354 may be configured to determine a number $N_{TOUCH-OUT}$ of times (e.g., a number of consecutive rounds of capacitive sensing) that the change $\Delta_{CAP}$ in count for one of the capacitive touch pads does not exceed the capacitance-change threshold $TH_{CAP}$. The user interface control circuit 354 may be configured to exit the active touch mode when the number $N_{TOUCH-OUT}$ exceeds a touch-out threshold $TH_{TOUCH-OUT}$.

While in the active touch mode, the user interface control circuit 354 may be configured to determine the position of the touch actuation along the touch sensitive surface (e.g., the light bar) in response to ratios of the changes $\Delta_{CAP}$ in the count for each of the capacitive touch pads of the capacitive touch circuit 352 (e.g., in response to the receive signals $V_{RX-A}$-$V_{RX-E}$ generated by the receiving capacitive touch pads). For example, the ratio of the change $\Delta_{CAP}$ in the count for region B to the change $\Delta_{CAP}$ in the count for region C of the receiving capacitive touch pads 244 of the control device 200 may indicate a position of a touch actuation along the light bar 220 between the regions B and C.

Even though the user interface control circuit 354 may detect that the touch sensitive surface is being actuated in response to the changes $\Delta_{CAP}$ in counts for one or more of the receiving capacitive touch pads of the capacitive touch circuit 352 (e.g., in response to the receive signals $V_{RX-A}$-$V_{RX-E}$), the user may not actually be touching the front surface of the actuation member (e.g., the user is not touching a portion of the front surface associated with touch actuations, such as the user not touching the light bar 220 but contacting another portion of the front surface and not intending to control the load). In some examples, the user interface control circuit 354 may be configured to determine if the touch sensitive surface (e.g., the light bar) is not being actuated (e.g., the user's finger has moved too far to the left) in response to a change $\Delta_{CAP-PROX}$ in count for the proximity capacitive touch pad of the capacitive touch circuit 352. If the user interface control circuit 354 determines that the user's finger is closer to the proximity capacitive touch pad of the capacitive touch circuit 352, the user interface control circuit 354 may cease processing the ratios of the changes $\Delta_{CAP}$ in the count for each of the receiving capacitive touch pads of the capacitive touch circuit 352 to determine the position of the actuation along the light bar (e.g., the user interface control circuit 354 may ignore the touch actuation if it is closer to the proximity capacitive touch pad). The user interface control circuit 354 may start determining the position of the touch actuation along the touch sensitive surface again when the change $\Delta_{CAP-PROX}$ in the count for the proximity capacitive touch pad of the capacitive touch circuit 352 indicates that the user's finger is close to the light bar.

The user interface control circuit 354 may provide an output signal $V_{OUT}$ to the dimmer control circuit 314 in response to detecting a touch actuation along the touch sensitive surface of the control device 300 (e.g., in response to detecting a touch actuation along the light bar 220). The output signal $V_{OUT}$ may indicate a position of the touch along the front surface of the actuation member. The dimmer control circuit 314 may be configured to translate the output signal $V_{OUT}$ into control data (e.g., one or more control signals) for controlling one or more electrical loads. For example, the dimmer control circuit 314 may use the control data to drive a drive circuit 312 to control a controllably conductive device 310 to adjust the amount of power delivered to the lighting load 304 and/or may cause the control data to be transmitted to the lighting load 304, another load control device, and/or a system controller of the load control system via a communication circuit 322.

The user interface control circuit 354 may generate a touch actuation signal $V_{ACT}$ that may indicate that a touch is present along the touch sensitive surface of the actuation member of the control device. The user interface control circuit 354 may provide the touch actuation signal $V_{ACT}$ to the dimmer control circuit 314. For example, the user interface control circuit 354 may drive the touch actuation signal $V_{ACT}$ high upon detecting a touch actuation along the touch sensitive surface to indicate that the control device is operating in active touch mode, and otherwise drive the touch activation signal $V_{ACT}$ low.

Although described with reference to the user interface control circuit 354, it should be appreciate that in some examples the control device 300 may include a single control circuit, such as the dimmer control circuit 314, and the processing performed by the user interface control circuit 354 may be performed by the dimmer control circuit 314.

The control device 300 may comprise the wireless communication circuit 322. The wireless communication circuit 322 may include for example, a radio-frequency (RF) transceiver coupled to an antenna for transmitting and/or receiving RF signals. The wireless communication circuit 322 may also include an RF transmitter for transmitting RF signals, an RF receiver for receiving RF signals, or an infrared (IR) transmitter and/or receiver for transmitting and/or receiving IR signals. The wireless communication circuit 322 may be configured to transmit a control signal that includes the control data (e.g., a digital message) generated by the dimmer control circuit 314 to the lighting load 304. As described herein, the control data may be generated in response to a user input (e.g., a point actuation or a gesture) to adjust one or more operational aspects of the lighting load 304. The control data may include a command and/or identification information (e.g., such as a unique identifier) associated with the control device 300. In addition to or in lieu of transmitting the control signal to the lighting load 304, the wireless communication circuit 322 may be controlled to transmit the control signal to a central controller of the lighting control system.

The dimmer control circuit 314 may be configured to illuminate visual indicators 360 (e.g., LEDs) to provide feedback of a status of the lighting load 304, in response to receiving indications of actuations of capacitive touch pads, to indicate a status of the control device 300, and/or to assist with a control operation (e.g., to provide a color gradient for controlling the color of the lighting load 304, to present backlit virtual buttons for preset, zone, or operational mode selection, etc.). The visual indicators 360 may be configured to illuminate a light bar (e.g., the light bar 220) and/or to serve as indicators of various conditions. As one example, touch sensitive device 350 may be used to allow a user to control dimming of a lighting load, with visual indicators 360, through illumination of light bar 220, showing the degree of dimming (e.g., increased illumination of the light bar to show increased intensity of the load).

Figure 17:
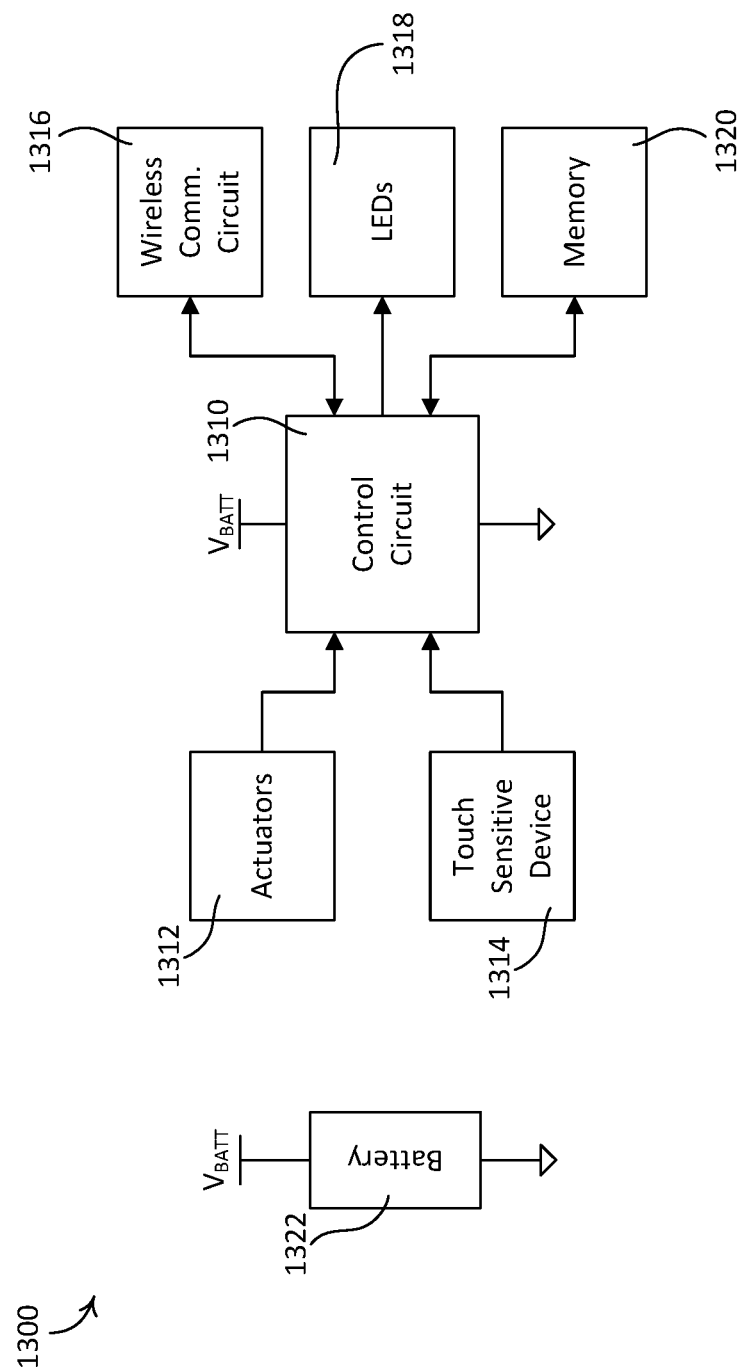
FIG. 17 shows a simplified block diagram of an example control device (e.g., remote control device) that may be implemented as the remote control device illustrated in FIG. 10.

FIG. 17 is a block diagram of an example control device 1300 (e.g., a remote control device), which may be deployed as the remote control device 1200 of FIGS. 10-15. Further, it should be appreciate that the control device 1300 may be deployed as the remote control device 112, the wall-mounted remote control device 114, the tabletop remote control device 116, and/or the handheld remote control device 118 of the lighting control system 100 of FIG. 1. The control device 1300 may include a control circuit 1310, one or more actuators 1312 (e.g., buttons and/or switches), a touch sensitive device 1314, a wireless communication circuit 1316, one or more LEDs 1318, a memory 1320, and/or a battery 1322. The memory 1320 may be configured to store one or more operating parameters (e.g., such as a preconfigured color scene or a preset light intensity level) of the control device 1300. The battery 1322 may provide power to one or more of the components shown in FIG. 17.

The actuators 1312 (e.g., a mechanical tactile switches) that may be actuated in response to a tactile actuation of one or more respective buttons of the control device (e.g., the actuation member 1232 of the remote control device 1200). The actuators 1312 may be configured to send respective input signals to the control circuit 1310 in response to actuations of the buttons. The touch sensitive device 1314 may be an example of the touch sensitive device 350, and as such, the touch sensitive device 1314 may perform one or more of the functions described with references to the touch sensitive device 350. Further, the control circuit 1310 may perform one or more of the functions described with reference to the dimmer control circuit 314 (e.g., with the exclusion of controlling a drive circuit or performing zero-cross detection).

The touch sensitive device 1314 may include a capacitive or resistive touch element arranged behind, for example, the actuation member 1232 of the remote control device 1200. The touch sensitive device 1314 may be responsive to a touch actuation of, for example, the touch sensitive surface the actuation member 1232. The touch sensitive device 1314 may be configured to detect touch actuations, such as point actuations and/or gestures (e.g., the gestures may be effectuated with or without physical contacts with the touch sensitive device 1314) and provide respective output signals (e.g., such as the output signal $V_{OUT}$) to the control circuit 1310 indicating the detection (e.g., indicating a position of the touch actuation along the touch sensitive surface of the actuation member 1232).

The control circuit 1310 may be configured to translate the input signals provided by the actuators 1312 and/or the output signals provided by the touch sensitive device 1314 into control data (e.g., digital control signals) for controlling one or more electrical loads. The control circuit 1310 may cause the control data (e.g., digital control signals) to be transmitted to the electrical loads via the wireless communication circuit 1316. For example, the wireless communication circuit 1316 may transmit a control signal including the control data to the one or more electrical loads or to a central controller of the concerned load control system. The control circuit 1310 may control the LEDs 1318 to illuminate a visual indicator (e.g., the light bar 1239 of the remote control device 1200) to provide feedback about various conditions.

It should be appreciated that the example remote control device 1200 illustrated and described herein may provide a simple retrofit solution for an existing switched control system and may ease the installation of a load control system or enhance an existing load control system installation. A load control system that integrates one or more remote control devices 1200 may provide energy savings and/or advanced control features, for example without requiring any electrical re-wiring and/or without requiring the replacement of any existing mechanical switches.

Figure 18:
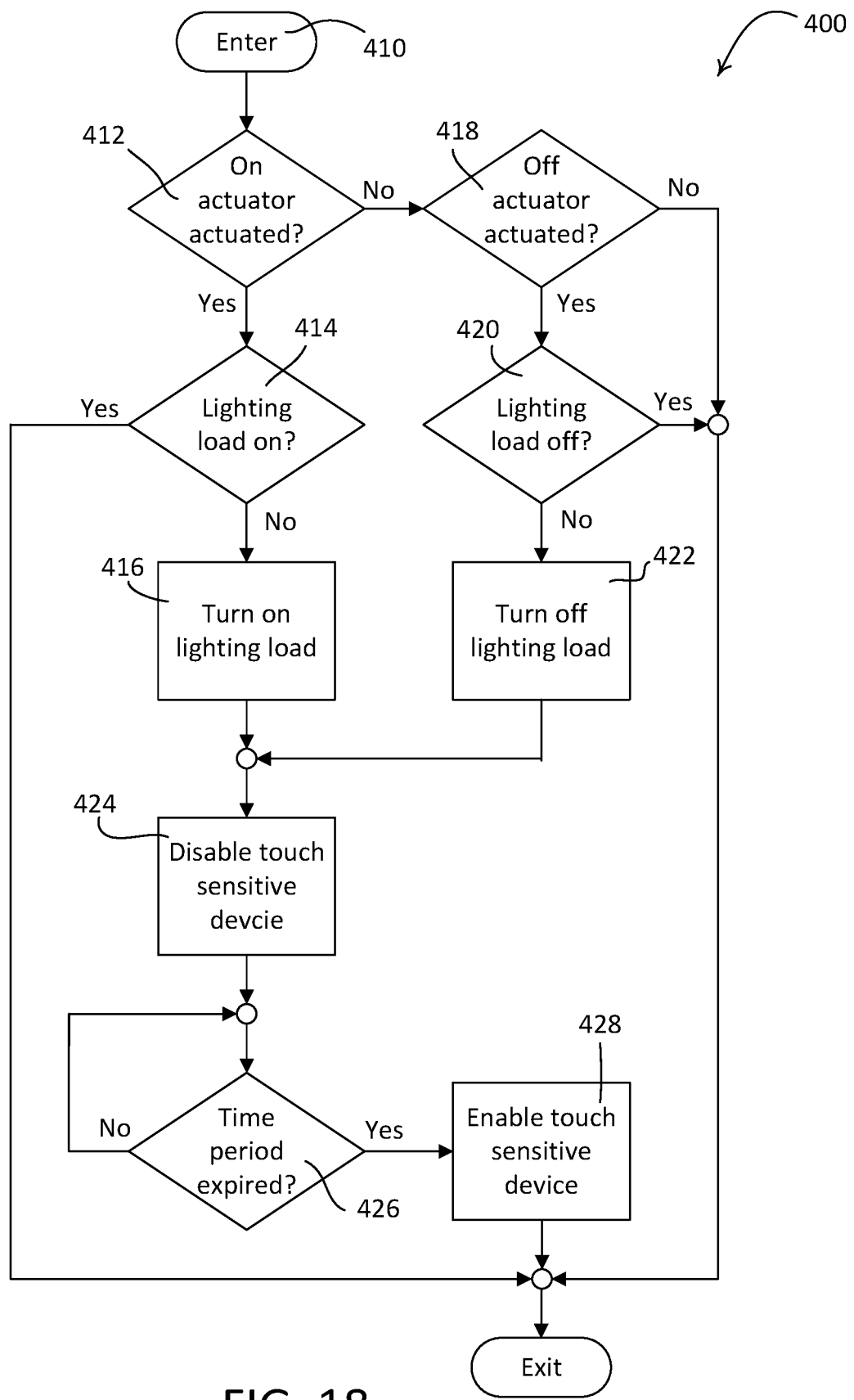
FIGS. 18-23 are flowcharts of example control procedures that may be executed by a control circuit of a control device.

FIG. 18 is a flowchart of an example control procedure 400 that may be executed by a control circuit of a control device (e.g., a control circuit of the control device 200, a control circuit of the control device 280, a control circuit of the control device 1200, any combination of the dimmer control circuit 314 or the user interface control circuit 354 of the control device 300, and/or any combination of the control circuit 1310 or a control circuit of the touch sensitive device 1314 of the control device 1300) in response to a tactile actuation of an actuator member to turn a lighting load (e.g., the lighting load 304) on and/or off. For example, the control circuit may execute the control procedure 400 at 410 in response to a tactile actuation of an upper portion or a lower portion of an actuation member (e.g., the upper portion 216 or the lower portion 218 of the actuation member 210, the upper portion or the lower portion of the actuation member 284, and/or the upper portion 1236 or the lower portion 1238 of the actuation member 1232) that causes the actuation member to pivot to actuate a tactile switch (e.g., one of the tactile switches 262, 264, or one of the tactile switches 1245a, 1245b).

If an on actuator was actuated at 412 (e.g., the upper portion 216 of the actuation member 210 was pressed to actuate the first tactile switch 262), the control circuit may determine if the lighting load is presently on at 414. If so, the control procedure 400 may simply exit. If the lighting load is off at 414, the control circuit may turn on the lighting load at 416 (e.g., by controlling the controllably conductive device 310 and/or by sending a message, such as a digital message, to a load control device to control the lighting load). For example, the dimmer control circuit 314 of the control device 300 may control the controllably conductive device 310 to turn on the lighting load at 416. In addition, the control circuit 1310 of the control device 1300 may transmit a message including control data for turning on the lighting load the lighting load via the wireless communication circuit 1316 at 416. If the on actuator was not actuated at 412, but an off actuator was actuated at 418 (e.g., the lower portion 218 of the actuation member 210 was pressed to actuate the second tactile switch 264), the control circuit may determine if the lighting load is presently off at 420. If so, the control procedure 400 may simply exit. If the lighting load is on at 420, the control circuit may turn off the lighting load at 422 (e.g., by controlling the controllably conductive device 310 and/or by sending a message, such as a digital message, to a load control device to control the lighting load). For example, the dimmer control circuit 314 of the control device 300 may control the controllably conductive device 310 to turn off the lighting load at 422. In addition, the control circuit 1310 of the control device 1300 may transmit a message including control data for turning off the lighting load the lighting load via the wireless communication circuit 1316 at 422.

The control device may also comprise a touch sensitive device (e.g., the touch sensitive device 350, and in examples where the control device is a dual dimmer, the control device may include multiple touch sensitive devices) that is responsive to actuations of a touch sensitive surface of the actuator (e.g., actuations of the touch sensitive surface of the 210 along the light bar 220). After turning the lighting load on at 416 or off at 422, the control circuit may disable the touch sensitive device at 424. That is, after turning the lighting load on at 416 or off at 422, the control circuit may ignore inputs receives via the touch sensitive device at 424 (e.g., not respond to inputs received via the touch sensitive surface). After the end of a time period (e.g., 200 ms) at 426 where the control circuit ignores inputs received via the touch sensitive device, the control circuit may enable the touch sensitive device at 428 (e.g., respond to inputs received via the touch sensitive surface), and the control procedure 400 may exit. Thus, the touch sensitive device may be temporarily be disabled (i.e., the control circuit may ignore inputs receives via the touch sensitive device) after actuations of the actuator to turn the lighting load on and off in order to avoid turning the lighting load back on and/or otherwise adjusting the intensity level of the lighting load if the user's finger happens to sweep past the light bar 220 while moving away from the actuator. Further, the control circuit may adjust the length of the time period used at 426, for example, using the advanced programming mode by the user and/or based on a learning algorithm and historical use patterns.

Figure 19:
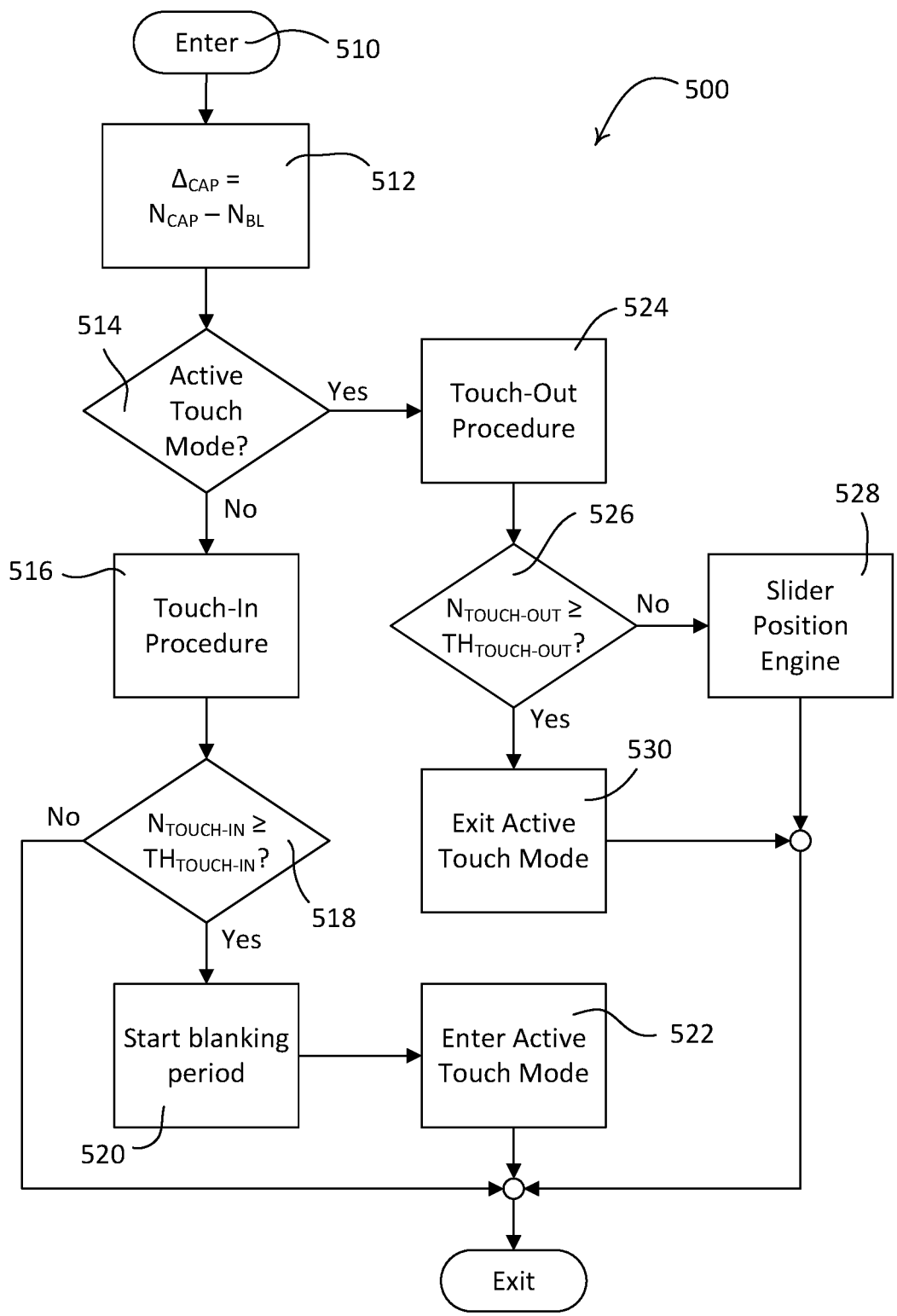

FIG. 19 is a flowchart of an example control procedure 500 that may be executed by a control circuit of a control device (e.g., a control circuit of the control device 200, a control circuit of the control device 280, a control circuit of the control device 1200, any combination of the dimmer control circuit 314 or the user interface control circuit 354 of the control device 300, and/or any combination of the control circuit 1310 or a control circuit of the touch sensitive device 1314 of the control device 1300) in response to a touch actuation along a touch sensitive surface of the control device. In examples where the control device includes multiple touch sensitive devices (e.g., a dual dimmer that includes two touch sensitive devices that each include a respective control circuit), the control procedure 500 may be performed by each of the touch sensitive devices of the control device. During the control procedure 500, the control circuit may operate in an active touch mode while the touch sensitive surface is being actuated. For example, the control circuit may execute the control procedure 500 periodically at 510. The control circuit may repeat the control procedure 500 for each of a plurality of regions of a capacitive touch circuit (e.g., the regions A-E of the capacitive touch circuit 352).

At 512, the control circuit may first determine a change $\Delta_{CAP}$ in the count for the present capacitive touch pad of the capacitive touch circuit by determining the difference between the present count $N_{CAP}$ and the baseline count $N_{BL}$ for the present capacitive touch pad. When the control circuit is not operating in the active touch mode at 514, the control circuit may execute a touch-in procedure at 516 to determine a number $N_{TOUCH-IN}$ of times that the change $\Delta_{CAP}$ in the count for the present capacitive touch pad has exceeded a capacitance-change threshold $TH_{CAP}$. When the number $N_{TOUCH-IN}$ determined at 516 does not exceed a touch-in threshold $TH_{TOUCH-IN}$ (e.g., such as two, three, four, five, six, seven, or eight) at 518, the control procedure 500 may simply exit. When the number $N_{TOUCH-IN}$ determined at 516 exceeds the touch-in threshold $TH_{TOUCH-IN}$ at 518, the control circuit may start a blanking period at 520 (e.g., a period of time where the control circuit ignores inputs received via the capacitive touch circuit, for example, as will be described in greater detail below with reference to FIG. 13). For example, the user interface control circuit 354 may drive the touch actuation signal $V_{ACT}$ high to indicate that the user interface control circuit 354 is operating in the active touch mode at 520. Further, it should be appreciated that the control circuit may detect a touch actuation when the number $N_{TOUCH-IN}$ determined at 516 exceeds the touch-in threshold $TH_{TOUCH-IN}$. The blanking period may be, for example, 200 ms. The control circuit may then enter the active touch mode at 522, and the control procedure 500 may exit. By ignoring inputs received via the capacitive touch circuit for the blanking period, the control circuit may, for example, avoid turning on the lighting load to an intensity level based on the position of a touch actuation on the actuation member (e.g., along the light bar 220) if the user's finger happens to sweep past the actuation member (e.g., the light bar 220) while actuating an upper portion of the actuation member or if the user's finger actuates the upper portion of the actuation member too close to the light bar.

When the control circuit is operating in the active touch mode at 514, the control circuit may execute a touch-out procedure at 524 to determine a number $N_{TOUCH-OUT}$ of times that the change $\Delta_{CAP}$ in the count for the present capacitive touch pad has not exceeded the capacitance-change threshold $TH_{CAP}$. When the number $N_{TOUCH-OUT}$ determined at 524 does not exceed a touch-out threshold $TH_{TOUCH-OUT}$ at 526, the control circuit may execute a slider position engine at 528, for example, to determine and update the position of the actuation along front surface of the actuation member (e.g., along the light bar 200), before the control procedure 500 exits. When the number $N_{TOUCH-OUT}$ determined at 524 exceeds the touch-out threshold $TH_{TOUCH-OUT}$ at 526, the control circuit may exit the active touch mode at 530, and the control procedure 500 may exit.

Figure 20:
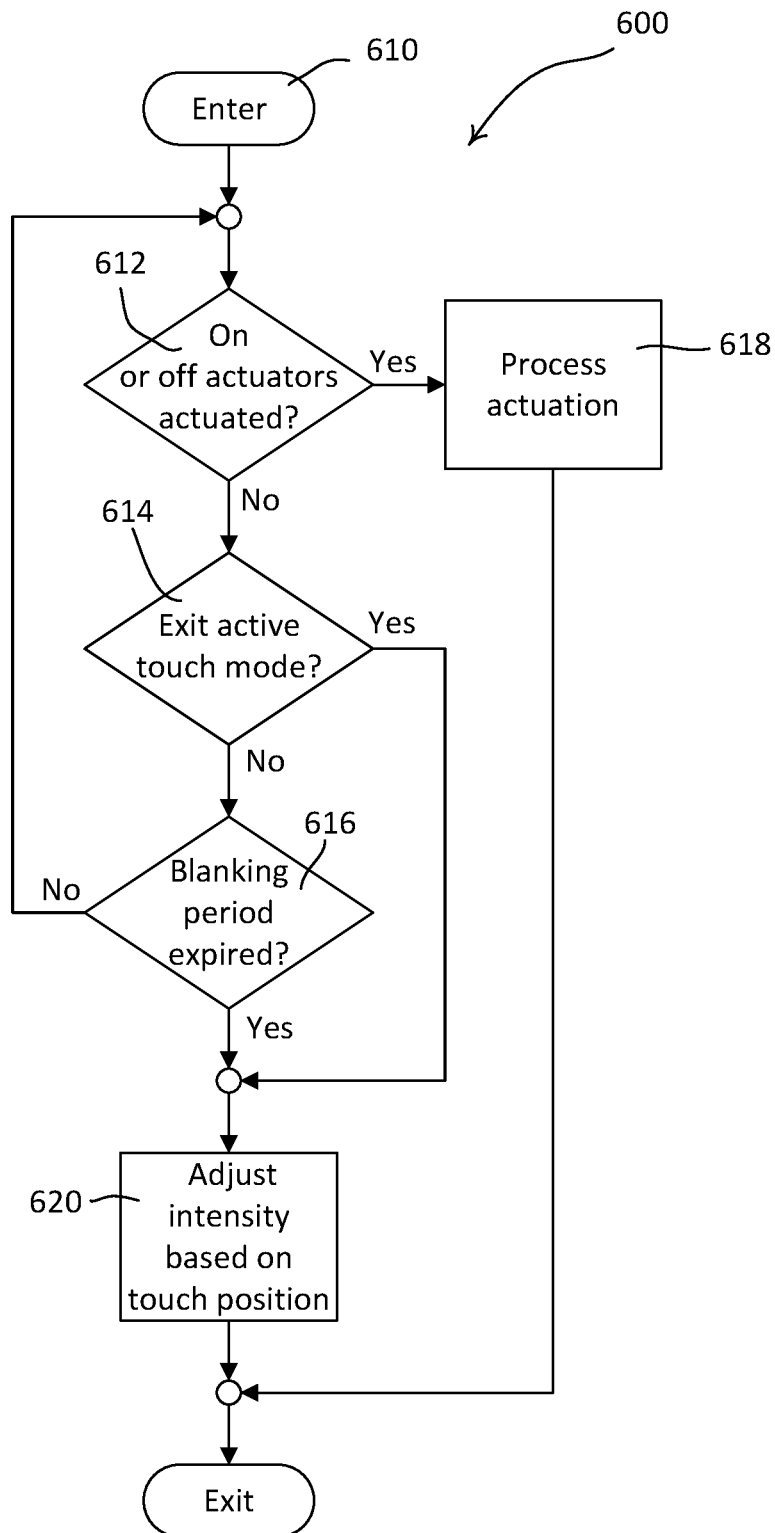

FIG. 20 is a flowchart of an example control procedure 600 that may be executed by a control circuit of a control device (e.g., a control circuit of the control device 200, a control circuit of the control device 280, a control circuit of the control device 1200, any combination of the dimmer control circuit 314 or the user interface control circuit 354 of the control device 300, and/or any combination of the control circuit 1310 or a control circuit of the touch sensitive device 1314 of the control device 1300) in response to a touch actuation of along the front surface of an actuation member of the control device (e.g., a touch actuation of the touch sensitive surface of the actuation member 210 along the light bar 220). In examples where the control device includes multiple touch sensitive devices (e.g., a dual dimmer that includes two touch sensitive devices that each include a respective control circuit), the control procedure 600 may be performed by each of the touch sensitive devices of the control device. For example, the control circuit may execute the control procedure 600 at 610 at the beginning of a blanking period (e.g., the blanking period started at 520 of the control procedure 500). For example, the dimmer control circuit 314 may be configured to determine the beginning of the blanking period and execute the control procedure 600 in response to detecting that the touch actuation signal $V_{ACT}$ has been driven high. In addition, the dimmer control circuit 314 may be configured to determine the beginning of the blanking period and execute the control procedure 600 in response to detecting a change in the output signal $V_{OUT}$. While in the blanking period, the control circuit may determine if an on actuator or an off actuator has been actuated at 612, determine if the active touch mode has been exited at 614, and/or determine if the blanking period has expired at 616. When the on actuator or the off actuator is actuated at 612 before the end of the blanking period, the control circuit may process the tactile actuation at 618 (e.g., by executing the control procedure 400 shown in FIG. 18).

When the active touch mode is exited at 614 before the end of the blanking period, the control circuit may adjust the intensity level of the lighting load based on the position of the touch actuation at 620 (e.g., the position of the touch actuation along the light bar 220). For example, the dimmer control circuit 314 of the control device 300 may control the controllably conductive device 310 to adjust the intensity level of the lighting load based on the position of the touch actuation at 620. In addition, the control circuit 1310 of the control device 1300 may transmit a message including control data for adjusting the intensity level of the lighting load based on the position of the touch actuation via the wireless communication circuit 1316 at 620. Accordingly, the control circuit may be configured to adjust the intensity level of the lighting load based on the position of a touch actuation during the blanking period if the touch actuation is so quick as to cause the control device to exit the active touch mode before the end of the blanking period. That is, the control circuit may be configured to respond to a touch actuation if the touch actuation is less than the blanking time.

If the blanking period expires at 616 without the on or off actuators being actuated at 612 or the active touch mode being exited at 614, the control circuit may adjust the intensity level of the lighting load based on the position of the touch actuation at 620, and the control procedure 600 may exit. If the control circuit remains in the active touch mode at the end of the control procedure 600, the control circuit may continue to adjust the intensity level of the lighting load based on the position of the touch actuation (e.g., as part of the slider position engine at 528 of the control procedure 500).

Figure 21:
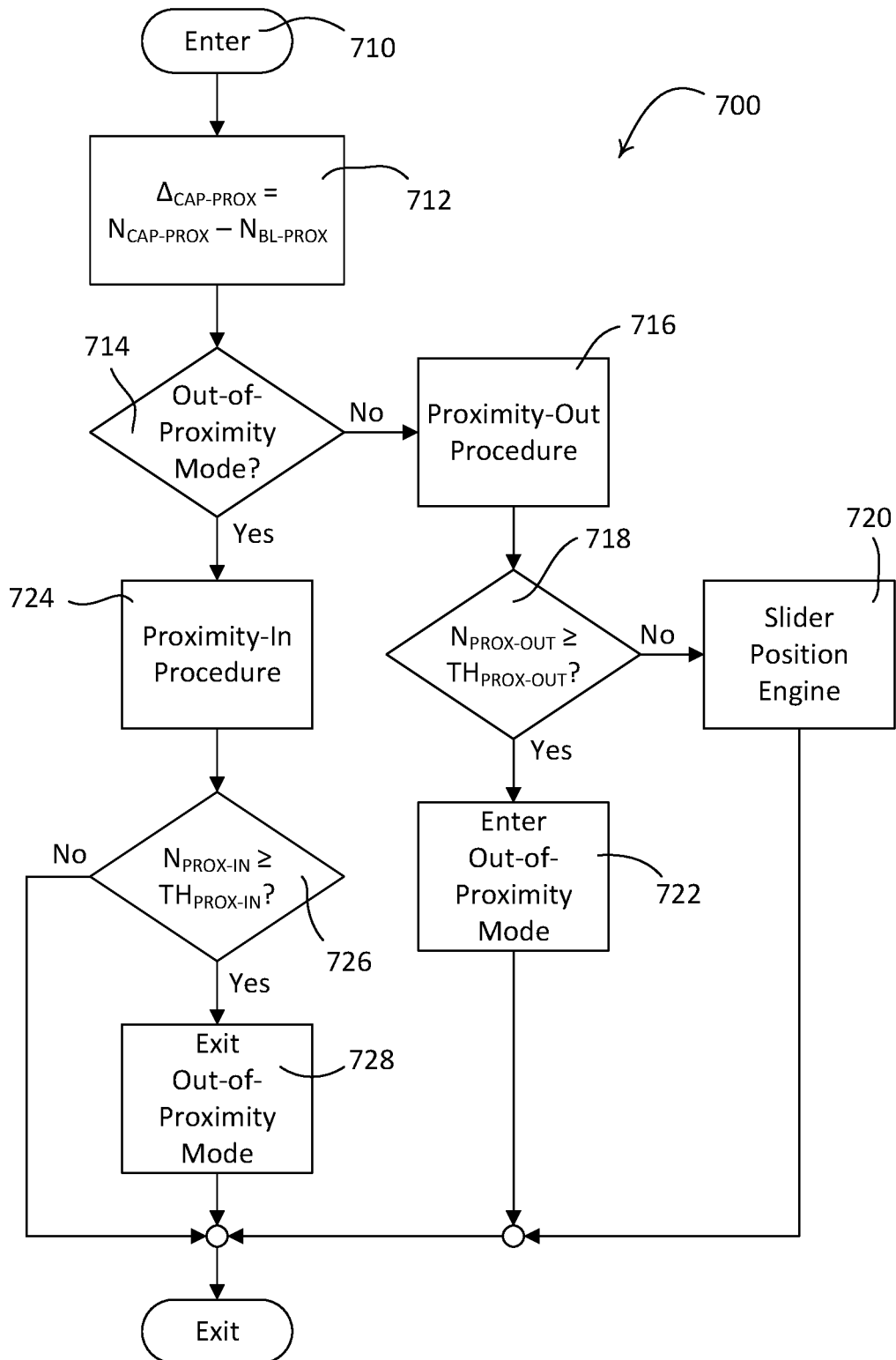

FIG. 21 is a flowchart of an example control procedure 700 that may be executed by a control circuit of a control device (e.g., a control circuit of the control device 200, a control circuit of the control device 280, a control circuit of the control device 1200, any combination of the dimmer control circuit 314 or the user interface control circuit 354 of the control device 300, and/or any combination of the control circuit 1310 or a control circuit of the touch sensitive device 1314 of the control device 1300) in response to a touch actuation along the front surface of an actuation member of the control device (e.g., a touch actuation of the touch sensitive surface of the actuation member 210 along the light bar 220). In examples where the control device includes multiple touch sensitive devices (e.g., a dual dimmer that includes two touch sensitive devices that each include a respective control circuit), the control procedure 700 may be performed by each of the touch sensitive devices of the control device. For example, the control circuit may execute the control procedure 700 periodically at 710 while the control circuit is operating in an active touch mode (e.g., while the touch sensitive surface is being actuated). In addition, the control procedure 700 may be executed at 528 of the control procedure 500 shown in FIG. 19. During the control procedure 700, the control circuit may operate in an out-of-proximity mode when the control circuit has detected change of the position of the actuation of the touch sensitive surface (e.g., is operating in the active touch mode in response to the receiving capacitive touch pads 244), but the position is determined to be too far away from the light bar (e.g., in response to the proximity capacitive touch pad 245).

At 712, the control circuit may first determine a change $\Delta_{CAP\text{-}PROX}$ in the count for the proximity capacitive touch pad of the capacitive touch circuit by determining the difference between the baseline count $N_{BL\text{-}PROX}$ for the proximity capacitive touch pad from the present count $N_{CAP\text{-}PROX}$ for the proximity capacitive touch pad. When the control circuit is not operating in an out-of-proximity mode at 714, the control circuit may execute a proximity-out procedure at 716 to determine a number $N_{PROX\text{-}OUT}$ of times that the change $\Delta_{CAP\text{-}PROX}$ in the count for the proximity capacitive touch pad has not exceeded a threshold. When the number $N_{PROX\text{-}OUT}$ determined at 716 does not exceed an out-of-proximity threshold $TH_{PROX\text{-}OUT}$ at 718, the control circuit may execute a slider position engine at 720, for example, to determine and update the position of the touch actuation along the actuation member (e.g., the light bar 200), before the control procedure 700 exits. When the number $N_{PROX\text{-}OUT}$ determined at 716 exceeds the out-of-proximity threshold $TH_{PROX\text{-}OUT}$ at 718, the control circuit may enter the out-of-proximity mode at 722 and the control procedure 700 may exit.

When the control circuit is operating in the out-of-proximity mode at 714, the control circuit may execute a proximity-in procedure at 724 to determine a number $N_{PROX\text{-}IN}$ of times that the change $\Delta_{CAP\text{-}PROX}$ in the count for the proximity capacitive touch pad has exceeded an in-proximity threshold $TH_{PROX\text{-}IN}$ (e.g., which may be the same threshold used in the proximity-out procedure at 716). When the number $N_{PROX\text{-}IN}$ determined at 724 does not exceed the in-proximity threshold $TH_{PROX\text{-}IN}$ at 726, the control procedure 700 may simply exit. When the number $N_{PROX\text{-}IN}$ determined at 724 exceeds the in-proximity threshold $TH_{PROX\text{-}IN}$ at 726, the control circuit may exit the out-of-proximity mode at 728, before the control procedure 700 exits.

Figure 22:
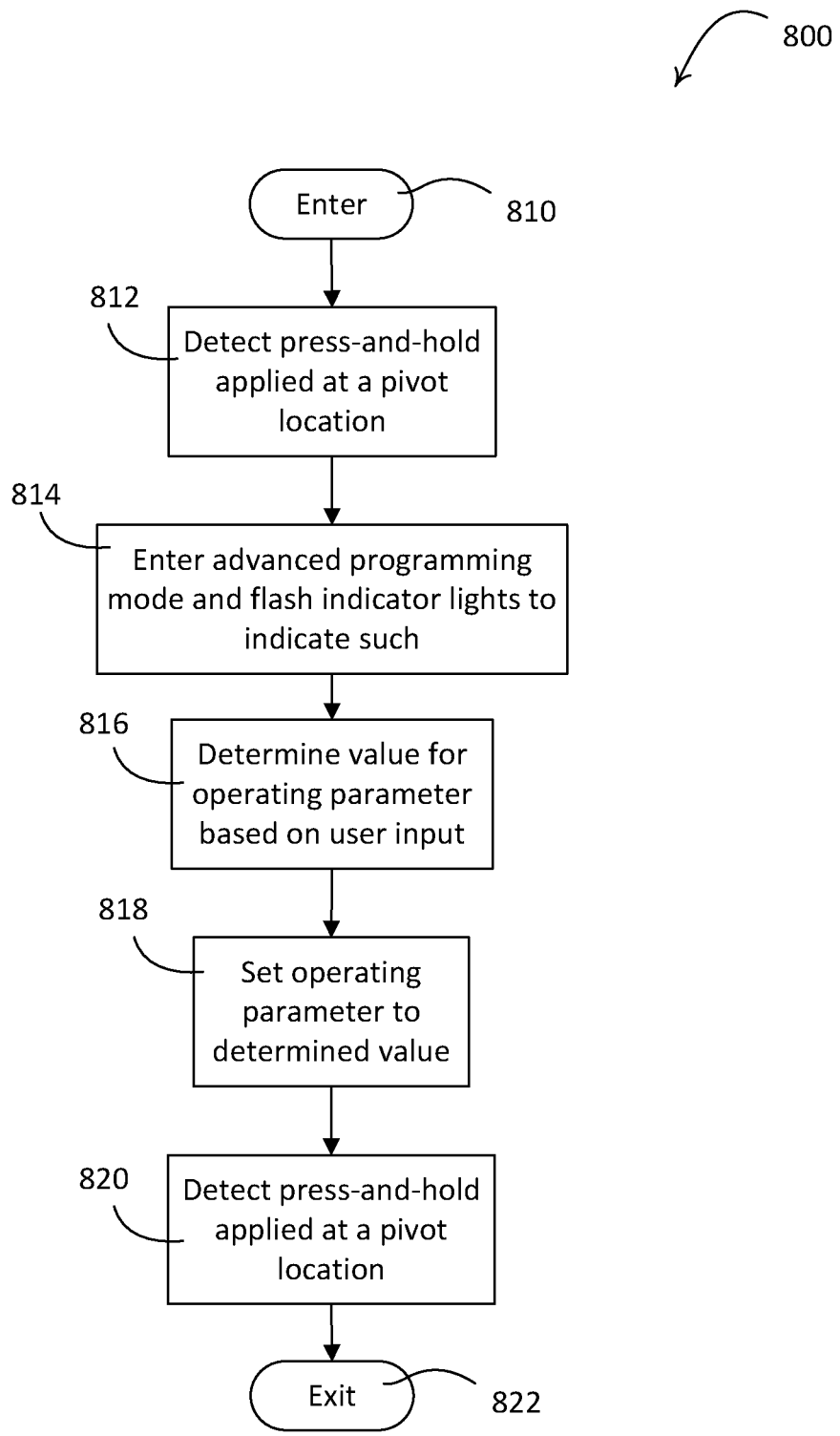

FIG. 22 is a flowchart of an example control procedure 800 that may be executed by a control circuit of a control device (e.g., a control circuit of the control device 200, a control circuit of the control device 280, a control circuit of the control device 1200, any combination of the dimmer control circuit 314 or the user interface control circuit 354 of the control device 300, and/or any combination of the control circuit 1310 or a control circuit of the touch sensitive device 1314 of the control device 1300) in response to a user input (e.g., a touch actuation, such as a press-and-hold actuation) applied to an area of an actuation member of the control device (e.g., the area 215 of the front surface 214 of the actuation member 210 shown in FIG. 2, or the central axis of the front surface 1235 of the actuation portion 1232) that does not cause the actuation member to move. For example, the control circuit may execute the control procedure 800 periodically at 810. During the control procedure 800, the control circuit may determine that a press-and-hold actuation (e.g., a user pressing and holding a finger against a front surface of the control device) has been applied to the area of the front surface of the actuation member of the control device. The press-and-hold actuation may be applied, for example, at a pivot location (e.g., over a pivot axis such as the pivot axis 222 shown in FIG. 2) of the control device or a location furthest away from a mechanical switch (e.g., the tactile switches 262, 264, or the tactile switches 1245a, 1245b) of the control device so that the press-and-hold does not accidentally trigger an unintended control function associated with the actuation switch. The control circuit may determine that a user input is a press-and-hold if the user input comprises a contact with the front surface that lasts more than a preconfigured time period (e.g., approximately 10 seconds).

In response to detecting the press-and-hold, the control circuit may enter an advanced programming mode at 814, upon which the control circuit may flash one or more visual indicators to indicate that the control device is now operating in the advanced programming mode. While in the advanced programming mode, the control circuit may further determine, at 816, a configuration or adjustment of an operating characteristic of the control device desired by the user. For instance, while in the advanced programming mode, the user may actuate the front surface of the control device along a light bar (e.g., the light bar 220) to indicate a desired value for a low-end trim of the control device and the control circuit may determine the desired value based on the position of the touch actuation.

At 818, the control circuit may adjust the operating characteristic (e.g., the low-end trim) based on the user input (e.g., by storing the desired value in memory). Subsequently, at 820, the control circuit may detect another press-and-hold applied at the pivot location indicating that the user wants to exit the advanced programming mode. In response, the control circuit may exit the procedure 800 at 822. Additionally or alternatively, the control circuit may exit the procedure 800 at 822 if no user input has been detected for a period of time (e.g., which may be configurable) during the advanced programming mode.

Figure 23:
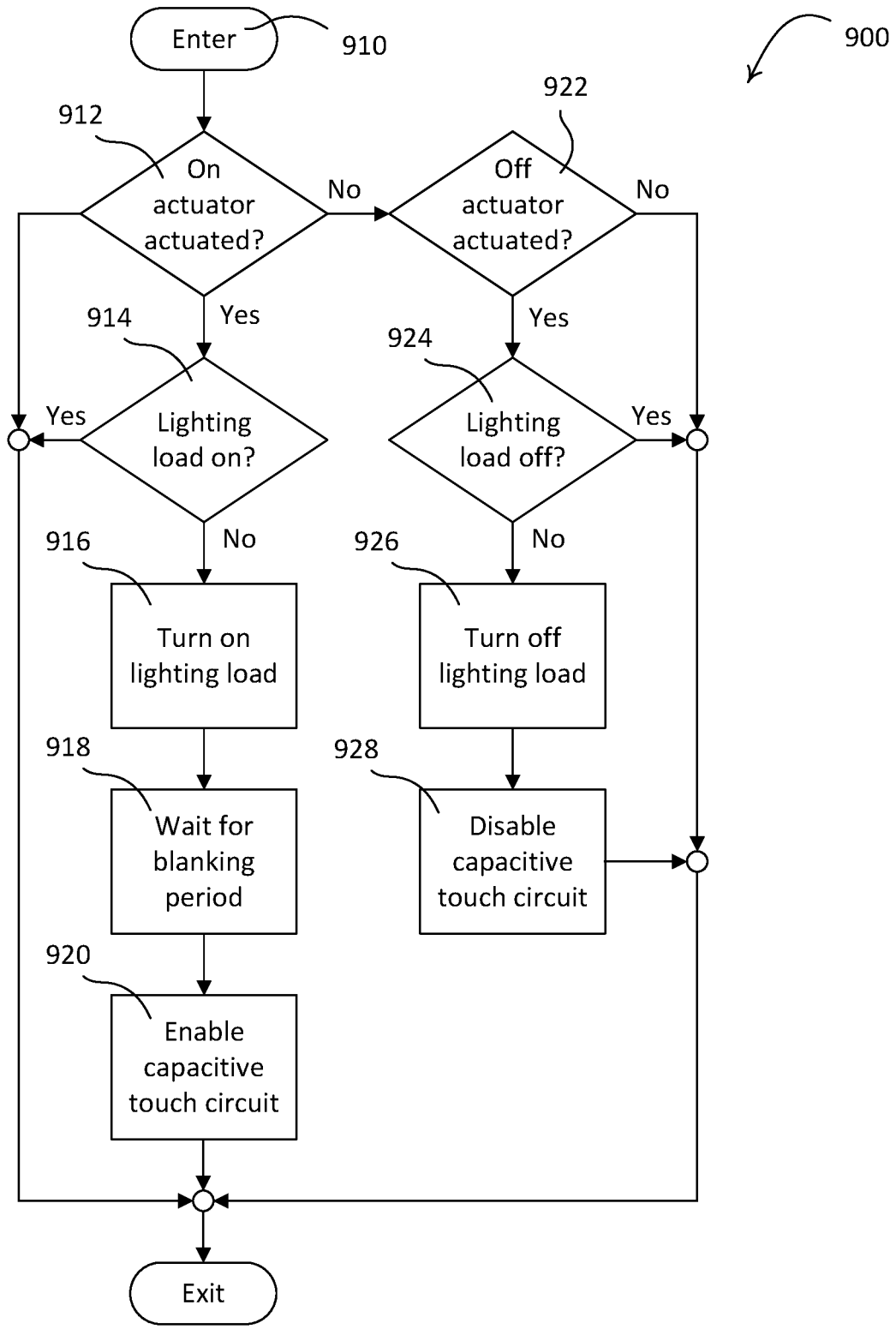

FIG. 23 is a flowchart of an example control procedure 900 that may be executed by a control circuit of a control device (e.g., a control circuit of the control device 200, a control circuit of the control device 280, a control circuit of the control device 1200, any combination of the dimmer control circuit 314 or the user interface control circuit 354 of the control device 300, and/or any combination of the control circuit 1310 or a control circuit of the touch sensitive device 1314 of the control device 1300) in response to a tactile actuation of an actuator to turn a lighting load (e.g., the lighting load 304) on and/or off. The control device may comprise a touch sensitive device (e.g., the touch sensitive device 350) that is responsive to touch actuations along a front surface of the actuation member (e.g., along a touch sensitive surface of the actuation member 210 along the light bar 220).

When executing the control procedure 900, the control device may ignore touch actuations received from the touch sensitive device(s) when the lighting load is off, and may respond to touch actuations received from the touch sensitive device(s) when the lighting load is on (e.g., only when the lighting load is on). For example, the control circuit may execute the control procedure 900 at 910 in response to a tactile actuation of the upper portion 216 or the lower portion 218 of the actuation member 210 that causes the actuation member 210 to pivot to actuate one of the tactile switches 262, 264. If an on actuator was actuated at 912 (e.g., the upper portion 216 of the actuation member 210 was pressed to actuate the first tactile switch 262), the control circuit may determine if the lighting load is presently on at 914. If so, the control procedure 900 may simply exit. If the lighting load is off at 914, the control circuit may turn on the lighting load at 916 (e.g., by controlling the controllably conductive device 310 and/or by sending a message, such as a digital message, to a load control device to control the lighting load). For example, the dimmer control circuit 314 of the control device 300 may control the controllably conductive device 310 to turn on the lighting load at 916. In addition, the control circuit 1310 of the control device 1300 may transmit a message including control data for turning on the lighting load the lighting load via the wireless communication circuit 1316 at 916.

After turning the lighting load on at 916, the control circuit may ignore inputs receives via the touch sensitive device at 918. In some examples, the control circuit may disable the touch sensitive device at 918. After the end of a blanking time period (e.g., approximately 200 ms) at 918 where the control circuit ignores inputs received via the touch sensitive device, the control circuit may enable the touch sensitive device at 920 (e.g., begin responding to inputs received via the touch sensitive surface), and the control procedure 900 may exit. Thus, the touch sensitive device may be disabled when the lighting load is off to avoid adjusting the intensity level of the lighting load if the user's finger happens to sweep past the touch sensitive surface of the actuation member (e.g., the light bar 220) while moving towards from the actuation member, and temporarily disabled (e.g., the control circuit may ignore inputs received via the touch sensitive device) after tactile actuations of the actuation member to turn the lighting load on in order to avoid adjusting the intensity level of the lighting load if the user's finger happens to sweep past the touch sensitive surface of the actuation member (e.g., the light bar 220) while moving away from the actuation member. Further, the length of the blanking time period used at 918 may be adjusted, for example, using the advanced programming mode by the user and/or based on a learning algorithm and historical use patterns.

If the on actuator was not actuated at 912, but an off actuator was actuated at 922 (e.g., the lower portion 218 of the actuation member 210 was pressed to actuate the second tactile switch 264), the control circuit may determine if the lighting load is presently off at 924. If so, the control procedure 900 may simply exit. If the lighting load is on at 924, the control circuit may turn off the lighting load at 926 (e.g., by controlling the controllably conductive device 310 and/or by sending a message, such as a digital message, to a load control device to control the lighting load). For example, the dimmer control circuit 314 of the control device 300 may control the controllably conductive device 310 to turn off the lighting load at 926. In addition, the control circuit 1310 of the control device 1300 may transmit a message including control data for turning off the lighting load the lighting load via the wireless communication circuit 1316 at 926. At 928, the control circuit may disable the capacitive touch circuit (e.g., begin to ignore inputs received via the touch sensitive device) before exiting the control procedure 900. As such, when the lighting load is off, the control circuit may not respond to inputs received via the touch sensitive device (i.e., the capacitive touch circuit is disabled). In such examples, the control circuit may not response to (e.g., ignore) inputs received via the touch sensitive device for as long as the lighting load is off. However, in some examples, the control device may turn on the lighting load in response to touch actuations, such as special touch actuations like a long press-and-hold actuation (e.g., touch actuations that exceed a predetermined period of time), a double-tap touch actuations, etc.

What is claimed is:

1. A control device configured to control an electrical load, the control device comprising:
   an actuation member having a front surface defining a touch sensitive surface configured to detect a touch actuation along at least a portion of the touch sensitive surface;
   a main printed circuit board comprising a first control circuit, a tactile switch, a controllably conductive device, and a drive circuit operatively coupled to a control input of the controllably conductive device for rendering the controllably conductive device conductive or non-conductive to control the amount of power delivered to the electrical load; and
   a capacitive touch printed circuit board affixed to the actuation member, the capacitive touch printed circuit board comprising one or more receiving capacitive touch pads located on the capacitive touch printed circuit board, behind the actuation member, and arranged in a linear array adjacent to the touch sensitive surface, wherein the capacitive touch printed circuit board further comprises a second control circuit configured to receive inputs from the capacitive touch pads and provide an output signal to the first control circuit in response to the inputs received from the capacitive touch pads;
   wherein the actuation member is configured to pivot about a pivot axis to move towards the main printed circuit board to actuate the tactile switch on the main printed circuit board in response to tactile actuations of the actuation member;
   wherein the capacitive touch printed circuit board is configured to move with the actuation member in response to tactile actuations of the actuation member; and
   wherein the first control circuit is configured to control an amount of power delivered to the electrical load in response to a position of a touch actuation along the length of the touch sensitive surface indicated by the output signal from the second control circuit.

2. The control device of claim 1, wherein the capacitive touch printed circuit board comprises a ground plane on the capacitive touch printed circuit board, the ground plane configured to shield the capacitive touch pads from noise caused by a yoke of the control device when the capacitive touch printed circuit board moves with the actuation member in response to actuations of the actuation member.

3. The control device of claim 2, wherein the ground plane comprises a first ground plane on a rear side of the capacitive touch printed circuit board.

4. The control device of claim 3, wherein the first ground plane is located on the opposite side of the capacitive touch printed circuit board from the receiving capacitive touch pads.

5. The control device of claim 3, wherein the capacitive touch printed circuit board comprises a second ground plane on a front side of the capacitive touch printed circuit board.

6. The control device of claim 1, wherein the capacitive touch printed circuit board further comprising a proximity capacitive touch pad extending parallel to the linear array of receiving capacitive touch pads and located farther away from the touch sensitive surface than the linear array of receiving capacitive touch pads.

7. The control device of claim 6, wherein the second control circuit is configured to ignore the inputs received from receiving capacitive touch pads in response to receiving an input from the proximity capacitive touch pad.

8. The control device of claim 1, wherein the second control circuit is configured to compare a measured voltage provided via a capacitive touch pad to a voltage threshold and generate an output signal that indicates when the measured voltage exceeds the voltage threshold; and
   wherein the second control circuit is configured to use different voltage thresholds for different capacitive touch pads.

9. The control device of claim 8, wherein the receiving capacitive touch pads are separated from the touch sensitive surface by varying distances, and the different voltage thresholds are used based on the distance between the capacitive touch pad and the touch sensitive surface.

10. The control device of claim 1, wherein the first control circuit is configured to not respond to the output signal received via the second control circuit during times when the controllably conductive device is rendered conductive or during times when transmitting or receiving wired or wireless communications via a communication circuit of the control device.

11. The control device of claim 1, wherein the second control circuit is configured to determine a position of the touch actuation along the length of the touch sensitive surface in response to the receiving capacitive touch pads, and wherein the output signal indicates the position of the touch actuation along the length of the touch sensitive surface.

12. The control device of claim 11, wherein the first control circuit is configured enter an advanced programming mode for changing one or more operating characteristics of the control device.

13. The control device of claim 12, wherein the first control circuit is configured operate in one of a plurality of touch actuation modes; and
   wherein, when the lighting load is off, the first control circuit is configured to operate in a first touch actuation mode and configured to turn the electrical load on in response to a touch actuation of the touch sensitive surface.

14. The control device of claim 13, wherein, when the lighting load is off, the first control circuit is configured to operate in a second touch actuation mode and the first configure circuit is not configured to turn the electrical load on in response to a touch actuation of the touch sensitive surface.

15. The control device of claim 13, wherein the first control circuit is configured to turn the electrical load on to a predetermined level in response to a tactile actuation of the actuation member, and while in the advanced programming mode, configured to receive an input from a user to configure the predetermined level to which the one or more electrical loads are turned on.

16. The control device of claim 15, wherein, when the lighting load is off in a second touch actuation mode, the first control circuit is configured to turn the lighting load on in response to a touch actuation of the touch sensitive surface when the position of the touch actuation is below a position along the touch sensitive surface associated with the predetermined level, and is not configured to turn the lighting load on in response to a touch actuation of the touch sensitive surface when the position of the touch actuation is below the position along the touch sensitive surface associated with the predetermined level.

17. The control device of claim 12, wherein the first control circuit is configured to detect a touch actuation applied to the area of the front surface of the actuation member that is characterized by limiting pivoting for a predetermined period of time, and enter the advanced programming mode in response to the detection of the user input applied the area of the front surface characterized by limiting pivoting.

18. The control device of claim 1, wherein the first control circuit is configured to ignore output signals received from the second control circuit when the electrical load is off.

19. The control device of claim 1, wherein, when the electrical load is off, the first control circuit is configured to:
   ignore inputs from the touch sensitive device in response to touch actuations that are above a position along the touch sensitive actuator that corresponds to the predetermined level; and
   respond to inputs from the touch sensitive device in response to touch actuations that are below the position along the touch sensitive actuator that corresponds to the predetermined level.

20. The control device of claim 1, wherein the first control circuit is configured to prioritize inputs received in response to tactile actuations of the actuation member over the output signals received from the second control circuit.

21. The control device of claim 20, wherein the first control circuit is configured to prioritize inputs received in response to tactile actuation of the actuation member over the output signals received from the second control circuit by ignoring the output signals when a tactile actuation of the tactile switch is received within a blanking period after an initial detection of the touch actuation along the touch sensitive surface.

22. The control device of claim 21, wherein the first control circuit is configured to determine that the position of the touch actuation on the touch sensitive surface is maintained for an amount of time that is shorter than the blanking period without detecting a tactile actuation of the actuation member; and
   wherein the electrical load is turned on to a power level associated with the position of the touch actuation along the length of the touch sensitive surface.

23. The control device of claim 1, wherein the first control circuit is configured to start a blanking period in response to a tactile actuation of the actuation member to turn on or off the electrical load, and ignore output signals received from the second control circuit during the blanking period.

* * * * *